United States Patent
Ooshima et al.

(10) Patent No.: US 10,099,468 B2
(45) Date of Patent: Oct. 16, 2018

(54) PLANOGRAPHIC PRINTING PLATE PRECURSOR, METHOD OF PRODUCING SAME, AND PRINTING METHOD USING SAME

(71) Applicant: FUJIFILM Corporation, Tokyo (JP)

(72) Inventors: Atsushi Ooshima, Shizuoka (JP); Koji Wariishi, Shizuoka (JP); Fumiya Shiraki, Shizuoka (JP); Shunsuke Hayashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/467,309

(22) Filed: Mar. 23, 2017

(65) Prior Publication Data

US 2017/0190167 A1   Jul. 6, 2017

Related U.S. Application Data

(63) Continuation of application No. PCT/JP2015/072973, filed on Aug. 14, 2015.

(30) Foreign Application Priority Data

Sep. 26, 2014 (JP) ................ 2014-197264

(51) Int. Cl.
*B41N 1/12* (2006.01)
*B41F 3/81* (2006.01)
(Continued)

(52) U.S. Cl.
CPC ............. *B41C 1/1008* (2013.01); *B41M 1/06* (2013.01); *B41N 1/14* (2013.01); *B41N 3/08* (2013.01);
(Continued)

(58) Field of Classification Search
None
See application file for complete search history.

(56) References Cited

U.S. PATENT DOCUMENTS 6,578,485 B2 * 6/2003 Friedman .............. B41C 1/1075
101/395

FOREIGN PATENT DOCUMENTS

CN    1367086 A    9/2002
EP    0770494 A2   5/1997
(Continued)

OTHER PUBLICATIONS

International Search Report dated Oct. 20, 2015, issued by the International Searching Authority in counterpart International Application No. PCT/JP2015/072973 (PCT/ISA/210).
(Continued)

*Primary Examiner* — Joshua D Zimmerman
(74) *Attorney, Agent, or Firm* — Sughrue Mion, PLLC

(57) ABSTRACT

Provided is a planographic printing plate precursor including: a support; and an image recording layer formed on the support, in which the content of fine particles per unit area in a region on a plate surface on the image recording layer side from an end portion of the planographic printing plate precursor to a portion inside the end portion by 5 mm is greater than the content of the fine particles per unit area in a region other than the region by an amount of 10 mg/m² or greater, edge stains are not generated therein, and transferring of the image recording layer is prevented even in a case where planographic printing plate precursors are stored in a stacked state. Further, provided are a method of producing the same and a printing method using the same.

27 Claims, 3 Drawing Sheets

(51) Int. Cl.
B41C 1/18 (2006.01)
B41C 1/10 (2006.01)
B41N 1/14 (2006.01)
B41N 3/08 (2006.01)
B41M 1/06 (2006.01)
G03F 7/11 (2006.01)

(52) U.S. Cl.
CPC ............ *G03F 7/11* (2013.01); *B41C 2210/04* (2013.01); *B41C 2210/08* (2013.01); *B41P 2200/20* (2013.01)

(56) References Cited

FOREIGN PATENT DOCUMENTS

| EP | 1975709 A1 | 10/2008 |
| EP | 2 735 444 A2 | 5/2014 |
| JP | 11-48629 A | 2/1999 |
| JP | H 11-65100 A | 3/1999 |
| JP | 2938397 B2 | 8/1999 |
| JP | 2008256742 A | 10/2008 |
| JP | 2009-233864 A | 10/2009 |
| JP | 2011177983 A | 9/2011 |

OTHER PUBLICATIONS

Written Opinion dated Oct. 20, 2015, issued by the International Searching Authority in counterpart International Application No. PCT/JP2015/072973 (PCT/ISA/237).

Written Opinion (PCT/ISA/237) dated Oct. 20, 2015 issued by the International Searching Authority in counterpart International Application No. PCT/JP2015/072973.

Communication dated Apr. 27, 2018 issued by the State Intellectual Property Office of P.R. China in counterpart Chinese Patent Application No. 201580052393.3.

* cited by examiner

PLANOGRAPHIC PRINTING PLATE PRECURSOR, METHOD OF PRODUCING SAME, AND PRINTING METHOD USING SAME

CROSS REFERENCE TO RELATED APPLICATION(S)

This is a continuation of International Application No. PCT/JP2015/072973 filed on Aug. 14, 2015, and claims priority from Japanese Patent Application No. 2014-197264 filed on Sep. 26, 2014, the entire disclosures of which are incorporated herein by reference.

BACKGROUND OF THE INVENTION

1. Field of the Invention

The present invention relates to a planographic printing plate precursor, a method of producing the same, and a printing method using the same.

2. Description of the Related Art

Currently, in preparation of a planographic printing plate, image exposure has been performed using a computer-to-plate (CTP) technology. That is, a planographic printing plate precursor is directly scanned and exposed using a laser or a laser diode without using a lith film. Along with this, objects of a planographic printing plate precursor have been changed to improvement of image-forming characteristics, printing characteristics, and physical properties corresponding to the CTP technology.

From the growing interest in the global environment, environmental problems related to a waste liquid associated with wet treatments such as a development treatment have been closed up as a problem of a planographic printing plate precursor. Along with this, it is desired to simplify a development treatment or not to perform a development treatment. As one of a simple development treatment, a method referred to as "on-press development" has been suggested. In other words, the on-press development is a method of exposing a planographic printing plate precursor, mounting the planographic printing plate precursor on a printing press without performing a development treatment of the related art, and then removing an unnecessary portion of an image recording layer, at an initial stage of a typical printing step.

It is known that a planographic printing plate precursor contains hydrophobic thermoplastic polymer particles in an image-forming layer (see JP2938397B). Further, it is known that a layer containing organic resin fine particles as main components is provided between a support and a photosensitive layer (see JP2008-256742A).

In a case where printing is performed using a planographic printing plate, since the end portions of the printing plate are in positions other than paper at the time of printing on paper having a size smaller than the size of the printing plate such as a typical sheet-fed press, the end portions do not affect the print quality. However, in a case where printing is continuously performed on roll-like paper using a rotary press during newspaper printing or the like, since the end portions of the printing plate are on the surface of rolled paper, the ink adhering to the end portions is transferred to the paper and forms linear stain (edge stain) and thus the commodity value of the printed matter is significantly impaired.

As a method of preventing edge stain on an on-press development type planographic printing plate precursor, a method of performing a treatment on a region within 1 cm from the end portions of the on-press development type planographic printing plate precursor for printing newspaper with a solution containing an organic solvent and a hydrophilic resin has been suggested (JP2011-177983A).

SUMMARY OF THE INVENTION

However, the edge stain is improved to some extent according to the technique described in JP2011-177983A, but it was found that, in a case where treated planographic printing plate precursors are stored in a stacked state, a treated region may be bonded to the rear surface of a support of another planographic printing plate precursor which is in contact with the region. As the result, when a planographic printing plate precursor is separated therefrom, an image recording layer is peeled off and then transferred to the rear surface of the support of another planographic printing plate precursor. Accordingly, problems of contamination of an exposure machine (setter), a punch bender, and a plate cylinder of a printing press due to the transferred material on the rear surface of the support occur.

An object of the present invention is to provide a planographic printing plate precursor in which edge stain does not occur and transferring of an image recording layer is prevented even in a case where planographic printing plate precursors are stored in a stacked state; a method of producing the same; and a printing method using the same.

(1) A planographic printing plate precursor comprising: a support; an image recording layer formed on the support; and fine particles positioned in a region of the planographic printing plate precursor on the image recording layer side, in which a content of the fine particles per unit area in a first region on the image recording layer side from an end portion of the planographic printing plate precursor to a portion inside the end portion by 5 mm is greater than a content of the fine particles per unit area in a second region other than the first region by an amount of 10 mg/m$^2$ or greater.

(2) The planographic printing plate precursor according to (1), in which the fine particles are organic resin fine particles.

(3) The planographic printing plate precursor according to (2), in which the organic resin fine particles are microgel particles.

(4) The planographic printing plate precursor according to (2), in which the organic resin fine particles are thermoplastic fine particles.

(5) The planographic printing plate precursor according to (1), in which the fine particles are inorganic fine particles.

(6) The planographic printing plate precursor according to (5), in which the inorganic fine particles are silica, alumina, magnesium oxide, titanium oxide, magnesium carbonate, or a mixture of these.

(7) The planographic printing plate precursor according to any one of (1) to (6), in which the end portion of the planographic printing plate precursor has a sagging shape in which a sagging amount X is in a range of 35 to 150 μm and a sagging width Y is in a range of 70 to 300 μm.

(8) The planographic printing plate precursor according to any one of (1) to (7), in which the first region further contains a hydrophilic compound.

(9) The planographic printing plate precursor according to (8), in which the hydrophilic compound is a compound which includes a support-adsorptive group.

(10) The planographic printing plate precursor according to (9), in which the compound which includes a support-adsorptive group is a phosphoric acid compound or a phosphonic acid compound.

(11) The planographic printing plate precursor according to (10), in which the phosphoric acid compound or the phosphonic acid compound is a polymer compound.

(12) The planographic printing plate precursor according to any one of (1) to (11), in which the image recording layer contains an infrared absorbent, a polymerization initiator, a polymerizable compound, and a binder polymer.

(13) The planographic printing plate precursor according to any one of (1) to (11), in which the image recording layer contains an infrared absorbent, a polymerization initiator, a polymerizable compound, and a particulate polymer compound.

(14) The planographic printing plate precursor according to any one of (1) to (11), in which the image recording layer contains an infrared absorbent and a thermoplastic fine particle polymer.

(15) A method of producing a planographic printing plate precursor which includes a support; an image recording layer formed on the support; and fine particles positioned in a region of the planographic printing plate precursor on the image recording layer side, in which a content of fine particles per unit area in a first region on the image recording layer side from an end portion of the planographic printing plate precursor to a portion inside the end portion by 5 mm is greater than a content of the fine particles per unit area in a second region other than the first region by an amount of 10 mg/m$^2$ or greater, the method comprising: (a) an image recording layer forming step of forming the image recording layer; (b) a coating step of coating a part of a region of the image recording layer which is formed by the step (a) with a coating solution containing the fine particles such that the coating solution and the region overlap each other; and (c) a cutting step of cutting the region coated with the coating solution such that the region is in a range from the end portion of the cut planographic printing plate precursor to a portion inside the end portion by 5 mm, in which the steps are performed in order of the step (a), the step (b), and the step (c) or in order of the step (b), the step (a), and the step (c), on the support.

(16) The method of producing a planographic printing plate precursor according to (15), in which (d) an undercoat layer forming step of forming an undercoat layer is performed on the support before the step (a).

(17) The method of producing a planographic printing plate precursor according to (15) or (16), in which (e) a protective layer forming step of forming a protective layer is performed on the image recording layer after the step (a) and before the step (c).

(18) A method of producing a planographic printing plate precursor which includes a support; an image recording layer formed on the support; and fine particles positioned in a region of the planographic printing plate precursor on the image recording layer side, in which a content of the fine particles per unit area in a first region on the image recording layer side from an end portion of the planographic printing plate precursor to a portion inside the end portion by 5 mm is greater than a content of the fine particles per unit area in a second region other than the first region by an amount of 10 mg/m$^2$ or greater, the method comprising: (a) an image recording layer forming step of forming the image recording layer; and (f) a coating step of coating a region, from the end portion of the planographic printing plate precursor to a portion inside the end portion by 5 mm, with a coating solution containing the fine particles, in which the steps are performed in order of the step (a) and the step (f) on the support.

(19) The method of producing a planographic printing plate precursor according to (18), in which (d) an undercoat layer forming step of forming an undercoat layer is performed on the support before the step (a).

(20) The method of producing a planographic printing plate precursor according to (18) or (19), in which (e) a protective layer forming step of forming a protective layer is performed on the image recording layer after the step (a) and before the step (f).

(21) The method of producing a planographic printing plate precursor according to any one of (15) to (20), in which the coating solution containing the fine particles further contains a hydrophilic compound.

(22) The method of producing a planographic printing plate precursor according to (21), in which the hydrophilic compound is a compound having a support-adsorptive group.

(23) The method of producing a planographic printing plate precursor according to (22), in which the hydrophilic compound is a phosphoric acid compound or a phosphonic acid compound.

(24) The method of producing a planographic printing plate precursor according to (23), in which the phosphoric acid compound or the phosphonic acid compound is a polymer compound.

(25) A planographic printing plate precursor which is obtained by the production method according to any one of (15) to (24).

(26) A printing method comprising: performing printing by imagewise-exposing the planographic printing plate precursor according to any one of (1) to (14) and (25), supplying printing ink and dampening water, and removing an unexposed portion of the image recording layer on a printing press.

(27) The printing method according to (26), in which the printing is performed using printing paper having a width wider than the width of the planographic printing plate precursor.

According to the present invention, it is possible to provide a planographic printing plate precursor in which edge stain does not occur and transferring of an image recording layer is prevented even in a case where planographic printing plate precursors are stored in a stacked state; a method of producing the same; and a printing method using the same.

DESCRIPTION OF THE PREFERRED EMBODIMENTS

Figure 1:
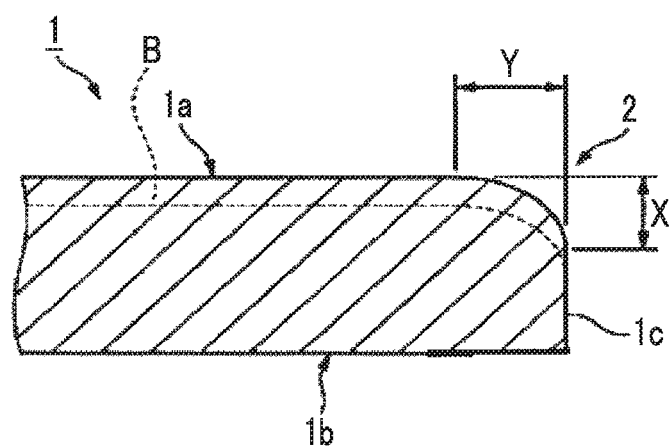
FIG. 1 is a schematic view illustrating a cross-sectional shape of an end portion of a cut planographic printing plate precursor.

Hereinafter, the present invention will be described in detail.

A planographic printing plate precursor of the present invention includes a support; an image recording layer formed on the support; and fine particles positioned in a region of the planographic printing plate precursor on the image recording layer side, in which a content of fine particles per unit area in a first region on a plate surface on the image recording layer side from an end portion of the planographic printing plate precursor to a portion inside the end portion by 5 mm is greater than a content of the fine particles per unit area in a second region other than the first region by an amount of 10 mg/m$^2$ or greater.

In a planographic printing plate precursor of the related art, it is known that constituent layers thereof such as an undercoat layer (also referred to as an interlayer), an image recording layer (also referred to as an image-forming layer), and a protective layer (also referred to as an overcoat layer) contain fine particles. In all cases of these layers, fine particles are substantially uniformly present in the plane of the planographic printing plate precursor. That is, there is substantially no difference in content of fine particles between the central portion and an end portion of the planographic printing plate precursor.

Meanwhile, in the planographic printing plate precursor of the present invention, the content of fine particles in end portion regions is intentionally set to be greater than the content of fine particles in regions other than the end portion regions by means of coating only the end portion regions of the planographic printing plate precursor with a coating solution containing the fine particles. Specifically, the content of fine particles per unit area in a region on the plate surface on the image recording layer side from the end portion of the planographic printing plate precursor to a portion inside the end portion by 5 mm is greater than the content of the fine particles per unit area in a region other than the region by an amount of 10 mg/m or greater. When a difference between the content of fine particles per unit area in a region on the plate surface on the image recording layer side from the end portion of the planographic printing plate precursor to a portion inside the end portion by 5 mm and the content of the fine particles per unit area in a region other than the region is specified as described above, a planographic printing plate precursor which has excellent edge stain preventing properties and in which transferring of an image recording layer is prevented is obtained.

The difference in contents of fine particles is preferably in a range of 10 to 5,000 mg/m$^2$, more preferably in a range of 30 to 1,000 mg/m$^2$, and particularly preferably in a range of 50 to 500 mg/m$^2$.

Here, the end portions of the planographic printing plate precursor indicate edge portions to be formed by a step of cutting in a sheet shape during the step of producing a planographic printing plate precursor. A sheet-like planographic printing plate precursor has four end portions vertically and horizontally. From the viewpoint of preventing edge stain, the number of end portions with a high content of fine particles according to the present invention is 1 to 4 in relation to the size of printing paper. For example, in a case of printing newspaper, two facing sides of the planographic printing plate precursor within the plane of printing paper typically correspond to the end portions.

The region on the plate surface on the image recording layer side from the end portion to a portion inside the end portion by 5 mm includes not only the image recording layer but also all layers provided on the image recording layer side of a support. Accordingly, the content of fine particles per unit area in the region on the plate surface on the image recording layer side from the end portion to a portion inside the end portion by 5 mm indicates the total content of fine particles present on the region from the end portion on the image recording layer side of the planographic printing plate precursor to a portion inside the end portion by 5 mm, per unit area. Similarly, the content of fine particles in a region other than the region per unit area indicates the total content of fine particles present in the region per unit area.

Hereinafter, in the planographic printing plate precursor of the present invention, the region from the end portion to a portion inside the end portion by 5 mm is also referred to as an end portion region. Further, the region other than the end portion region is also referred to as the other region.

The content of fine particles per unit area of the end portion region and the other region can be determined in the following manner.

The content of fine particles per unit area of the end portion region and the other region can be determined by preparing samples corresponding to the end portion region and the other region of the planographic printing plate precursor, removing the entire coating film on a support of each sample using water, an organic solvent, or a solvent of a mixture of these, performing centrifugation on the film-removing solution to separate the fine particles, measuring the mass of the fine particles, and converting the mass per unit area (m$^2$).

A typical fine particle separation method is used to separate fine particles from the film-removing solution. Examples of the method include a filtering method using a filter and a method of precipitating fine particles using a centrifuge to be concentrated. As a device for filter filtration, for example, a device used for pressure reduction or pressure filtration can be used. Preferred examples of the filter include filter paper, a nano-filter, and an ultrafilter. The centrifuge may be a device which is capable of precipitating fine particles and examples thereof include a device having a skimming function (a function of suctioning a supernatant layer during rotation and discharging the layer out of the system) and a continuous centrifuge which continuously discharges solid matter, in addition to general-purpose devices.

As a solvent used for centrifugation, a solvent that dissolves other coating components without dissolving fine particles is suitable. Particularly, a solvent used when an image recording layer is formed, such as water or a water-soluble organic solvent, is preferable. A solvent to be described in the section of formation of an image recording layer C may be exemplified.

In regard to the conditions of the centrifugation, the centrifugal force (value indicating the centrifugal acceleration corresponding to many times the gravitational acceleration) is preferably in a range of 50 to 50.000, more preferably in a range of 100 to 40,000, and particularly preferably in a range of 150 to 30,000. The temperature at the time of centrifugation depends on the type of solvent being used, but is preferably in a range of −10° C. to 80° C., more preferably in a range of −5° C. to 70° C., and particularly preferably in a range of 0° C. to 60° C.

Further, a step of removing a solvent is typically carried out using decantation, and a concentration method of subliming a solvent by freezing and drying in a vacuum, a concentration method of drying a solvent by heating or reducing the pressure, and a method of combining these can be also used for the step.

[Fine Particles]

Fine particles contained in the end portion region of the planographic printing plate precursor according to the present invention may be any of organic fine particles and inorganic fine particles as long as particulate fine particles are present in the planographic printing plate precursor. For example, various fine particles known to be contained in constituent layers of the planographic printing plate precursor, for example, an undercoat layer, an image recording layer, and a protective layer may be used. When fine particles are present, the permeability of dampening water is improved and on-press development is promoted in an on-press development type planographic printing plate precursor and thus the problem of edge stain is considered to be solved.

<Organic Fine Particles>

Among fine particles according to the present invention, organic resin fine particles such as microgel particles (cross-linked polymer fine particles) and thermoplastic fine particles are preferably used as organic fine particles.

<Microgel>

The microgel particles are reactive or non-reactive resin particles dispersed in an aqueous medium. The microgel particles may be non-reactive microgel particles by means of having a polymerizable group in the particle or on the surface of the particle and preferably on the surface of the particle.

As resins constituting the particles, polyurea, polyurethane, polyester, polycarbonate, polyamide, and a mixture of these are preferable, polyurea and polyurethane are more preferable, and polyurethane is particularly preferable.

The microgel particles can be prepared using a known method. For example, monohydric alcohol having an ethylenically unsaturated group is allowed to react with an adduct of polyhydric alcohol and diisocyanate to be dissolved in ethyl acetate together with a small amount of surfactant and then an oily component is prepared. An aqueous solution of polyvinyl alcohol is prepared as an aqueous component. The oily component and the aqueous component are mixed with each other, the mixture is stirred at a high speed using a mechanical stirrer, emulsified, and dispersed, and the concentration of solid contents is adjusted, thereby obtaining microgel particles.

<Thermoplastic Fine Particles>

Preferred examples of the thermoplastic fine particles include thermoplastic fine particles described in Research Disclosure No. 33303 on January, 1992, JP1997-123387A (JP-H09-123387A), JP1997-131850A (JP-H09-131850A), JP1997-171249A (JP-H09-171249A), JP1997-171250A (JP-H09-171250A), and EP931647B.

Specific examples of a polymer constituting thermoplastic fine particles include homopolymers or copolymers of monomers such as acrylate or methacrylate having structures of ethylene, styrene, vinyl chloride, methyl acrylate, ethyl acrylate, methyl methacrylate, ethyl methacrylate, vinylidene chloride, acrylonitrile, vinyl carbazole, and polyalkylene, and mixtures of these. Among these, polystyrene, a copolymer containing styrene and acrylonitrile, and polymethylmethacrylate are preferable.

<Inorganic Fine Particles>

Among fine particles of the present invention, examples of inorganic fine particles include metals and metal compounds such as an oxide, a composite oxide, a hydroxide, a carbonate, a sulfate, a silicate, a phosphate, an organic acid salt, a nitride, a carbide, a sulfide, and a composite compound of at least two or more kinds of these. Specific examples thereof include silica, alumina, magnesium oxide, titanium oxide, magnesium carbonate, calcium alginate, zirconium oxide, tin oxide, potassium titanate, strontium titanate, aluminum borate, magnesium borate, aluminum hydroxide, magnesium hydroxide, calcium hydroxide, titanium hydroxide, basic magnesium sulfate, calcium carbonate, calcium sulfate, magnesium sulfate, calcium silicate, magnesium silicate, calcium phosphate, silicon nitride, titanium nitride, aluminum nitride, silicon carbide, titanium carbide, zinc sulfide, and a composite compound of at least two or more kinds of these. Preferred examples thereof include silica, alumina, magnesium oxide, titanium oxide, magnesium carbonate, calcium alginate, and a mixture of these.

Examples of the shape of fine particles of the present invention include a spherical shape, a needle shape, a plate shape, a feather shape, a chain (bead) shape, and an amorphous shape. Among these, fine particles having a spherical shape are preferable.

The average particle diameter of fine particles is preferably 5 μm or less, more preferably in a range of 0.005 to 3 μm, and particularly preferably in a range of 0.01 to 2 μm.

The particle diameter can be measured using a known method. Specific examples thereof include a laser diffraction/light scattering method, a dynamic light scattering method, a static light scattering method, a dynamic image method, a static image method, an image analysis method, and an electron microscope method. For example, a fine particle-containing liquid is diluted with distilled water such that the particle concentration is adjusted to be in a range of 0.1% to 1% by weight and then the particle diameter can be easily measured using a commercially available average particle size measuring device (for example, LA-910 (manufactured by HORIBA Ltd.)). Further, from the viewpoint that a small particle diameter can be measured, a dynamic light scattering method using a laser doppler effect is preferable. In the planographic printing plate precursor, from the viewpoint of easily measuring the particle size, a method of observing a section of the planographic printing plate precursor using an electron microscope or the like or a method of performing image analysis is preferable.

The particle diameter of fine particles is a numerical value measured using a laser diffraction/light scattering method (measuring device: LA-910, manufactured by HORIBA Ltd.).

Any position from the top of a support and the top of an outermost layer constituting the planographic printing plate precursor may contain the fine particles according to the present invention. For example, in a case where the planographic printing plate precursor has an undercoat layer, an image recording layer, and a protective layer in this order on the support, fine particles may be present in any position of between the support and the undercoat layer, in the undercoat layer, between the undercoat layer and the image recording layer, in the image recording layer, between the image recording layer and the protective layer, in the protective layer, and on the protective layer. Further, fine particles may be present in plural positions. In the case of the planographic printing plate precursor having the above-described configuration, the fine particles may be present between the support and the undercoat layer and in the undercoat layer, between the support and the undercoat layer and in the undercoat layer and between the undercoat layer and the image recording layer, and in the protective layer and on the protective layer. In order to prevent the image recording layer from remaining on the support which is assumed to cause edge stain, it is preferable that the fine particles of the present invention are present between the support and the image recording layer. Specifically, it is preferable that the fine particles are present between the support and the undercoat layer, in the undercoat layer, between the undercoat layer and the image recording layer, between the support and the undercoat layer and in the undercoat layer, between the support and the undercoat layer and in the undercoat layer, and between the undercoat layer and the image recording layer. The fine particles may be allowed to be present in a specific position of the planographic printing plate precursor by applying a coating solution containing the fine particles to the specific position of the planographic printing plate precursor. A specific method thereof will be described below as the method of producing a planographic printing plate precursor.

It is preferable that the first region further contains a hydrophilic compound. A hydrophilic compound has an effect of preventing stain from being generated due to printing ink being accumulated in cracks which may be generated at the time when a sagging shape described below is formed, by means of hydrophilizing the cracks.

A water-soluble compound is preferable as the hydrophilic compound. The water-soluble compound is not particularly limited as long as 0.5 g or greater of the compound is dissolved in 100 g of water at 20° C. When 2 g or greater of a compound is dissolved in 100 g of water at 20° C., this compound is more preferable.

It is preferable that the hydrophilic compound includes a support-adsorptive group. The support-adsorptive group is an adsorptive group which can be adsorbed to the surface of the support of the planographic printing plate precursor. Preferred examples thereof include a phenolic hydroxyl group, a carboxyl group, a —$PO_3H_2$ group, a —$OPO_3H_2$ group, a —$CONHSO_2$— group, a —$SO_2NHSO_2$— group, and a —$COCH_2COCH_3$ group. Among these, a —$PO_3H_2$ group and a —$OPO_3H_2$ group are preferable. Hereinafter, a phosphoric acid compound and a phosphonic acid compound which include a —$PO_3H_2$ group and a —$OPO_3H_2$ group will be described in detail.

(Phosphoric Acid Compound)

A phosphoric acid compound includes phosphoric acid, a salt thereof, and an ester thereof. Examples of the phosphoric acid compound include phosphoric acid, metaphosphoric acid, monoammonium phosphate, ammonium secondary phosphate, sodium dihydrogen phosphate, sodium monohydrogen phosphate, potassium primary phosphate, potassium secondary phosphate, sodium tripolyphosphate, potassium pyrophosphate, and sodium hexametaphosphate. Among these, sodium dihydrogen phosphate, sodium monohydrogen phosphate, or sodium hexametaphosphate are preferably used.

As the phosphoric acid compound, a polymer compound is preferable and a polymer compound having a phosphoric acid monoester group is more preferable. A fine particle-containing coating solution having excellent coating properties is obtained.

Examples of the polymer compound having a phosphoric acid ester group include a polymer formed of one or more kinds of monomers having a phosphoric acid ester group in a molecule, a copolymer of one or more kinds of monomers having a phosphoric acid ester group and one or more kinds of monomers that do not have a phosphoric acid ester group, and a polymer obtained by introducing a phosphoric acid ester group into a polymer that does not have a phosphoric acid ester group through a polymer reaction.

Examples of the monomer having a phosphoric acid ester group include mono(2-methacryloyloxyethyl) acid phosphate, mono(2-methacryloyloxypolyoxyethyleneglycol) acid phosphate, mono(2-acryloyloxyethyl) acid phosphate, 3-chloro-2-acid phosphooxypropyl methacrylate, acid phosphooxy polyoxyethylene glycol monomethacrylate, acid phosphooxy polyoxypropylene glycol methacrylate, (meth)acryloyloxy ethyl acid phosphate, (meth)acryloyloxy propyl acid phosphate, (meth)acryloyloxy-2-hydroxy propyl acid phosphate, (meth)acryloyloxy-3-hydroxy propyl acid phosphate, (meth)acryloyloxy-3-chloro-2-hydroxy propyl acid phosphate, and allyl alcohol acid phosphate. Among these examples of monomers, from the viewpoint of preventing edge stain, mono(2-acryloyloxyethyl) acid phosphate is preferably used. Typical examples of commercially available products include LIGHT ESTER P-1M (manufactured by Kyoei Kagaku Kogyo Co., Ltd.) and PHOSMER PE (manufactured by Uni-Chemical Co., Ltd.).

As a monomer which does not have a phosphoric acid ester group in the copolymer, a monomer having a hydrophilic group is preferable. Examples of the hydrophilic group include a hydroxyl group, an alkylene oxide structure, an amino group, an ammonium group, and an amido group. Among these, a hydroxyl group, an alkylene oxide structure, or an amido group is preferable, an alkylene oxide structure which has 1 to 20 alkylene oxide units having 2 or 3 carbon atoms is more preferable, and a polyethylene oxide structure having 2 to 10 ethylene oxide units is still more preferable. Examples thereof include 2-hydroxy ethyl acrylate, ethoxy diethylene glycol acrylate, methoxy triethylene glycol acrylate, poly(oxyethylene) methacrylate. N-isopropylacrylamide, and acrylamide.

The proportion of the repeating unit having a phosphoric acid ester group in the polymer compound having a phosphoric acid ester group is preferably in a range of 1% to 100% by mole, more preferably in a range of 5% to 100% by mole, and still more preferably in a range of 10% to 100% by mole.

The weight-average molecular weight of the polymer compound having a phosphoric acid ester group is preferably in a range of 5,000 to 1,000,000, more preferably in a range of 7.000 to 700,000, and particularly preferably in a range of 10.000 to 500,000.

(Phosphonic Acid Compound)

A phosphonic acid compound includes phosphonic acid, a salt thereof, and an ester thereof. Examples of the phosphonic acid compound include ethyl phosphonic acid, propyl phosphonic acid, isopropyl phosphonic acid, butyl phosphonic acid, hexyl phosphonic acid, octyl phosphonic acid, dodecyl phosphonic acid, octadecyl phosphonic acid, 2-hydroxyethyl phosphonic acid and sodium salts or potassium salts of these, alkyl phosphonic acid monoalkyl ester such as methyl phosphonic acid methyl ester, ethyl phosphonic acid methyl ester, or 2-hydroxyethyl phosphonic acid methyl ester and sodium salts or potassium salts of these, alkylene diphosphonic acid such as methylene diphosphonic acid or ethylene diphosphonic acid and sodium salts or potassium salts of these, and polyvinyl phosphonic acid.

As the phosphonic acid compound, a polymer compound is preferable. A fine particle-containing coating solution having excellent coating properties is obtained.

Preferred examples of the polymer compound as a phosphonic acid compound include polyvinyl phosphonic acid, a polymer formed of one or more monomers having a phosphonic acid group or a phosphonic acid monoester group in a molecule, and a copolymer of one or more kinds of monomers having a phosphonic acid group or a phosphonic acid monoester group and one or more kinds of monomers which do not have a phosphonic acid group and a phosphonic acid monoester group.

Examples of the monomer having a phosphonic acid group include vinylphosphonic acid, ethyl phosphonic acid monovinyl ester, acryloyl aminomethyl phosphonic acid, and 3-methacryloyloxy propyl phosphonic acid.

As the polymer compound, both of a homopolymer and a copolymer of monomers having a phosphonic acid ester group are also used. As the copolymer, for example, a copolymer of a monomer having a phosphonic acid ester group and a monomer having a hydrophilic group or a copolymer of a monomer having a phosphonic acid ester group and a monomer which does not have both of a phosphonic acid ester group and a hydrophilic group can be used.

In the monomers having a hydrophilic group in the copolymers, examples of the hydrophilic group include a hydroxyl group, an alkylene oxide structure, an amino group, an ammonium group, and an amido group. Among these, a hydroxyl group, an alkylene oxide structure, or an amido group is preferable, an alkylene oxide structure which has 1 to 20 alkylene oxide units having 2 or 3 carbon atoms is more preferable, and a polyethylene oxide structure having 2 to 10 ethylene oxide units is still more preferable. Examples thereof include 2-hydroxy ethyl acrylate, ethoxy diethylene glycol acrylate, methoxy triethylene glycol acrylate, poly(oxyethylene) methacrylate. N-isopropylacrylamide, and acrylamide.

The proportion of the repeating unit having a phosphonic acid ester group in the polymer compound having a phosphonic acid ester group is preferably in a range of 1% to 100% by mole, more preferably in a range of 3% to 100% by mole, and still more preferably in a range of 5% to 100% by mole.

The weight-average molecular weight of the polymer compound having a phosphonic acid ester group is preferably in a range of 5.000 to 1,000.000, more preferably in a range of 7,000 to 700,000, and particularly preferably in a range of 10,000 to 500,000.

From the viewpoint of workability, it is preferable that the above-described hydrophilic compound is allowed to be contained in the region on the plate surface on the image recording layer side from the end portion of the planographic printing plate precursor to a portion inside the end portion by 5 mm at the time when the fine particles are applied to the planographic printing plate precursor. Specifically, both of the steps can be easily performed by adding a hydrophilic compound to a coating solution that contains fine particles and coating the planographic printing plate precursor with the coating solution.

[Planographic Printing Plate Precursor]

The planographic printing plate precursor of the present invention has an image recording layer on the support. The planographic printing plate precursor may have an undercoat layer between the support and the image recording layer and a protective layer on the image recording layer as necessary.

[Image Recording Layer]

The image recording layer of the planographic printing plate precursor is an image recording layer in which the non-image portion is removed by at least one of acidic to alkaline dampening water or printing ink on a printing press.

According to one aspect of the present invention, the image recording layer is an image recording layer (hereinafter, also referred to as an image recording layer A) that contains an infrared absorbent, a polymerization initiator, a polymerizable compound, and a binder polymer.

According to another aspect of the present invention, the image recording layer is an image recording layer (hereinafter, also referred to as an image recording layer B) that contains an infrared absorbent, a polymerization initiator, a polymerizable compound, and a particulate polymer compound.

According to still another aspect of the present invention, the image recording layer is an image recording layer (hereinafter, also referred to as an image recording layer C) that contains an infrared absorbent and a thermoplastic fine particle polymer.

(Image Recording Layer A)

The image recording layer A contains an infrared absorbent, a polymerization initiator, a polymerizable compound, and a binder polymer. Hereinafter, the constituent components of the image recording layer A will be described.

<Infrared Absorbent>

An infrared absorbent has a function of converting absorbed infrared rays into heat, a function of electron transfer to a polymerization initiator described below through excitation by infrared rays, and/or a function of energy transfer. As the infrared absorbent used in the present invention, a dye or a pigment having maximum absorption at a wavelength of 760 to 1,200 nm is preferable and a dye having maximum absorption at a wavelength of 760 to 1,200 nm is more preferable.

As the dye, commercially available dyes and known dyes described in the literatures such as "Dye Handbook" (edited by The Society of Synthetic Organic Chemistry, Japan, published in 1970) can be used. Specific examples thereof include an azo dye, a metal complex salt azo dye, a pyrazolone azo dye, a naphthoquinone dye, an anthraquinone dye, a phthalocyanine dye, a carbonium dye, a quinone imine dye, a methine dye, a cyanine dye, a squarylium dye, a pyrylium salt, and a metal thiolate complex.

Among the above-described dyes, a cyanine dye, a squarylium dye, a pyrylium salt, a nickel thiolate complex, and an indolenine cyanine dye are particularly preferable. Further, a cyanine dye or an indolenine cyanine dye is preferable and a cyanine dye represented by the following Formula (a) is exemplified as a particularly preferred example.

Formula (a)

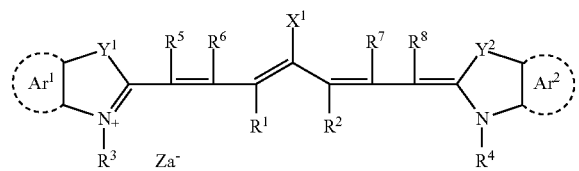

In Formula (a), $X^1$ represents a hydrogen atom, a halogen atom, —N($R^9$)($R^{10}$), $X^2$-$L^1$, or a group shown below. Here, $R^9$ and $R^{10}$ may be the same as or different from each other and represent an aryl group which may have a substituent and has 6 to 10 carbon atoms, an alkyl group having 1 to 8 carbon atoms, or a hydrogen atom. Further. $R^9$ and $R^{10}$ may be bonded to each other to form a ring. Among these, a phenyl group (—$NPh_2$) is preferable. $X^2$ represents an oxygen atom or a sulfur atom. $L^1$ represents a hydrocarbon group having 1 to 12 carbon atoms, a heteroaryl group, or a hydrocarbon group which has heteroatoms and 1 to 12 carbon atoms. Moreover, the heteroatoms here represent N, S, O, a halogen atom, and Se. In groups shown below, $Xa^-$ has the same definition as that for $Za^-$ described below and $R^a$ represents a substituent selected from a hydrogen atom, an alkyl group, an aryl group, a substituted or unsubstituted amino group, and a halogen atom.

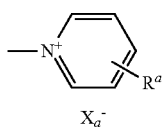

$R^1$ and $R^2$ each independently represent a hydrocarbon group having 1 to 12 carbon atoms. From the viewpoint of storage stability of an image recording layer coating solution, it is preferable that $R^1$ and $R^2$ represent a hydrocarbon group having two or more carbon atoms. $R^1$ and $R^2$ may be bonded to each other to form a ring. Further, when a ring is formed, it is particularly preferable that a 5- or 6-membered ring is formed.

$Ar^1$ and $Ar^2$ may be the same as or different from each other and each represent an aryl group which may have a substituent. Preferred examples of the aryl group include a benzene ring and a naphthalene ring. In addition, preferred examples of a substituent include a hydrocarbon group having 12 or less carbon atoms, a halogen atom, and an alkoxy group having 12 or less carbon atoms. $Y^1$ and $Y^2$ may be the same as or different from each other and each represent a sulfur atom or a dialkylmethylene group having 12 or less carbon atoms. $R^1$ and $R^4$ may be the same as or different from each other and each represent a hydrocarbon group having 20 or less carbon atoms which may have a substituent. Preferred examples of a substituent include an alkoxy group having 12 or less carbon atoms, a carboxyl group, and a sulfo group. $R^5$, $R^6$, $R^7$, and $R^8$ may be the same as or different from each other and each represent a hydrogen atom or a hydrocarbon group having 12 or less carbon atoms. From the viewpoint of availability of a raw material, it is preferable that $R^5$, $R^6$, $R^7$, and $R^8$ represent a hydrogen atom. In addition, $Za^-$ represents a counter anion. Here, the cyanine dye represented by Formula (a) has an anionic substituent in the structure thereof, and $Za^-$ is not necessary in a case where neutralization of the charge is not necessary. From the viewpoint of storage stability of an image recording layer coating solution, it is preferable that $Za^-$ represents a halide ion, a perchlorate ion, a tetrafluoroborate ion, a hexafluorophosphate ion, or a sulfonate ion and particularly preferable that $Za^-$ represents a perchlorate ion, a hexafluorophosphate ion, or an arylsulfonate ion.

Specific examples of the cyanine dye which can be preferably used and is represented by Formula (a) include compounds described in paragraphs [0017] to [0019] of JP2001-133969A and compounds described in paragraphs [0016] to [0021] of JP2002-023360A and paragraphs [0012] to [0037] of JP2002-040638A. Preferred examples thereof include compounds described in paragraphs [0034] to 100411 of JP2002-278057A and paragraphs [0080] to 100861 of JP2008-195018A and most preferred examples thereof include compounds described in paragraphs [0035] to [0043] of JP2007-90850A.

Further, compounds described in paragraphs [0008] and [0009] of JP1993-5005A (JP-H05-5005A) and compounds described in paragraphs [0022] to [0025] of JP2001-222101A can be preferably used.

As the pigments, commercially available pigments and pigments described in Color Index (C. I.) Handbook, "Latest Pigment Handbook" (edited by Japan Pigment Technology Association, 1977), "Latest Pigment Application Technology" (CMC Publishing Co., Ltd., 1986), and "Printing Ink Technology" (CMC Publishing Co., Ltd., 1984) can be used.

The particle diameter of the pigment is preferably in a range of 0.01 to 1 μm and more preferably in a range of 0.01 to 0.5 μm. A known dispersion technique used to produce inks or toners can be used for dispersion of the pigment. The details are described in "Latest Pigment Application Technology" (CMC Publishing Co., Ltd., 1986) and the like.

The infrared absorbent may be used alone or in combination of two or more kinds thereof.

The content of the infrared absorbent is preferably in a range of 0.05 to 30 parts by mass, more preferably in a range of 0.1 to 20, and particularly preferably in a range of 0.2 to 10 parts by mass with respect to 100 parts by mass of the total solid content of the image recording layer.

<Polymerization Initiator>

The polymerization initiator indicates a compound that initiates and promotes polymerization of a polymerizable compound. As the polymerization initiator, a known thermal polymerization initiator, a compound having a bond with small bond dissociation energy, or a photopolymerization initiator can be used.

Specific examples of the polymerization initiator include (a) an organic halide, (b) a carbonyl compound, (c) an azo compound, (d) an organic peroxide, (e) a metallocene compound, (f) an azido compound, (g) a hexaaryl biimidazole compound, (h) an organic borate compound, (i) a disulfone compound, (j) an oxime ester compound, and (k) an onium salt compound.

As the (a) organic halide, compounds described in paragraphs [0022] and [0023] of JP2008-195018A are preferable.

As the (b) carbonyl compound, compounds described in paragraph [0024] of JP2008-195018A are preferable.

As the (c) azo compound, an azo compound and the like described in JP1996-108621A (JP-H08-108621A) can be used.

As the (d) organic peroxide, compounds described in paragraph [0025] of JP2008-195018A are preferable.

As the (e) metallocene compound, compounds described in paragraph [0026] of JP2008-195018A are preferable.

As the (f) azide compound, compounds such as 2,6-bis (4-azidobenzylidene)-4-methylcyclohexanone may be exemplified.

As the (g) hexaarylbiimidazole compound, compounds described in paragraph [0027] of JP2008-195018A are preferable.

As the (h) organic borate compound, compounds described in paragraph [0028] of JP2008-195018A are preferable.

As the (i) disulfone compound, compounds described in JP1986-166544A (JP-S61-166544A) may be exemplified.

As the (j) oxime ester compound, compounds described in paragraphs [0028] to [0030] of JP2008-195018A are preferable.

Examples of the (k) onium salt compound include onium salts such as diazonium salts described in S. I. Schlesinger, Photogr. Sci. Eng., 18, 387 (1974), T. S. Bal et al, Polymer, 21, 423 (1980) and JP1993-158230A (JP-H05-158230A), ammonium salts described in U.S. Pat. No. 4,069,055A and JP1992-365049A (JP-H04-365049A), phosphonium salts described in U.S. Pat. No. 4,069,055A and U.S. Pat. No. 4,069,056A, iodonium salts described in EP104143B, US2008/0311520A, JP1990-150848A (JP-H02-150848A), JP2008-195018A, and J. V. Crivello et al, Macromolecules, 10(6), 1307 (1977), sulfonium salts described in EP370693B, EP233567B, EP297443B, EP297442B, U.S. Pat. No. 4,933,377A, U.S. Pat. No. 4,760,013A, U.S. Pat. No. 4,734,444A, U.S. Pat. No. 2,833,827A, GE Patent No. 2904626, GE Patent No. 3604580, and GE Patent No. 3604581, selenonium salts described in J. V. Crivello et al, J. Polymer Sci., Polymer Chem. Ed., 17, 1047 (1979), arsonium salts described in C. S. Wen et al, The, Proc. Conf. Rad. Curing ASIA, p 478 Tokyo, October (1988), and azinium salts described in JP2008-195018A.

Preferred examples of compounds in the polymerization initiators include onium salts such as iodonium salts and sulfonium salts.

As the iodonium salts, diphenyliodonium salts are preferable, electron-donating groups such as diphenyl iodonium salts substituted with an alkyl group or an alkoxyl group are particularly preferable, and asymmetric diphenyl iodonium salts are still more preferable. Specific examples thereof include diphenyliodonium=hexafluorophosphate, 4-methoxyphenyl-4-(2-methylpropyl)phenyliodonium=hexa- fluorophosphate, 4-(2-methylpropyl)phenyl-p-tolyliodonium=hexafluorophosphate, 4-hexyloxyphenyl-2,4,6-trimethoxyphenyliodonium=hexafluorophosphate, 4-hexyloxyphenyl-2,4-diethoxyphenyliodonium=tetrafluoroborate, 4-octyloxyphenyl-2,4,6-trimethoxyphenyliodonium=1-perfluorobutanesulfonate, 4-octyloxyphenyl-2,4,6-trimethoxyphenyliodonium=hexafluorophosphate, and bis(4-t-butylphenyl)iodonium-tetraphenylborate.

Examples of the sulfonium salts include triphenylsulfonium=hexafluorophosphate, triphenylsulfonium=benzoylformate, bis(4-chlorophenyl)phenvlsulfonium=benzoylformate, bis(4-chlorophenyl)-4-methylphenylsulfonium-1-tetrafluoroborate tris(4-chlorophenyl)sulfonium=3,5-bis(methoxycarbonyl)benzenesulfonate, and tris(4-chlorophenyl)sulfonium=hexafluorophosphate.

Further, an organic borate compound is preferably used. Specific examples of the organic borate compound include tetraphenyl borate salts, tetratolyl borate salts, tetrakis(4-methoxyphenyl) borate salts, tetrakis(pentafluorophenyl) borate salts, tetrakis (3,5-bis(trifluoromethyl)phenyl) borate salts, tetrakis(4-chlorophenyl) borate salts, tetrakis(4-fluorophenyl) borate salts, tetrakis(2-thienyl) borate salts, tetrakis(4-phenylphenyl) borate salts, tetrakis(4-t-butylphenyl) borate salts, ethyl triphenyl borate salts, and butyl triphenyl borate salts. From the viewpoints of compatibility of printing durability, tone reproducibility, and temporal stability, tetraphenyl borate salts are preferable. Examples of a counter cation of a borate compound include known cations such as an alkali metal cation, an alkaline earth metal cation, an ammonium cation, a phosphonium cation, a sulfonium cation, an iodonium cation, a diazonium cation, and an azinium cation.

The content of the polymerization initiator is preferably in a range of 0.1% to 50% by mass, more preferably in a range of 0.5% to 30% by mass, and particularly preferably in a range of 0.8% to 20% by mass with respect to the total solid content of the image recording layer. When the content thereof is in the above-described range, improved sensitivity and improved stain resistance of a non-image portion at the time of printing are obtained.

<Polymerizable Compound>

A polymerizable compound is an addition polymerizable compound having at least one ethylenically unsaturated double bond and is selected from compounds having at least one and preferably two or more terminal ethylenically unsaturated bonds. These have chemical forms such as a monomer, a pre-polymer, that is, a dimer, a trimer, an oligomer, and a mixture of these.

Examples of the monomer include unsaturated carboxylic acid (such as acrylic acid, methacrylic acid, itaconic acid, crotonic acid, isocrotonic acid, or maleic acid), esters, and amides thereof. Among these, esters of unsaturated carboxylic acid and a polyhydric alcohol compound and amides of unsaturated carboxylic acid and a polyhydric amine compound are preferably used. Further, addition reaction products with unsaturated carboxylic acid ester having a nucleophilic substituent such as a hydroxyl group, an amino group, or a mercapto group or amides and monofunctional or polyfunctional isocyanates or epoxies; and dehydration condensation reaction products with monofunctional or polyfunctional carboxylic acid are suitably used. Moreover, addition reaction products with unsaturated carboxylic acid ester having an electrophilic substituent such as an isocyanate group or an epoxy group or amides and monofunctional or polyfunctional alcohols, amines, or thiols; and substitution reaction products with unsaturated carboxylic acid ester having a leaving substituent such as a halogen group or a tosyloxy group or amides and monofunctional or polyfunctional alcohols, amines, or thiols are also suitably used.

Further, as another example, compound groups replaced by unsaturated phosphonic acid, styrene, vinyl ether, and the like can be used in place of the above-described unsaturated carboxylic acid. These are described in references of JP2006-508380A, JP2002-287344A, JP2008-256850A. JP2001-342222A. JP1997-179296A (JP-H09-79296A), JP1997-179297A (JP-H09-179297A), JP1997-179298A (JP-H09-179298A), JP2004-294935A, JP2006-243493A, JP2002-275129A, JP2003-64130A, JP2003-280187A, and JP1998-333321A (JP-H10-333321A).

Specific examples of monomers of esters of a polyhydric alcohol compound and unsaturated carboxylic acid include acrylic acid ester such as ethylene glycol diacrylate, 1,3-butanediol diacrylate, tetramethylene glycol diacrylate, propylene glycol diacrylate, trimethylol propane triacrylate, hexanediol diacrylate, tetraethylene glycol diacrylate, pentaerythritol tetraacrylate, sorbitol triacrylate, isocyanuric acid ethylene oxide (EO)-modified triacrylate, or a polyester acrylate oligomer. Examples of the methacrylic acid ester include tetramethylene glycol dimethacrylate, neopentyl glycol dimethacrylate, trimethylol propane trimethacrylate, ethylene glycol dimethacrylate, pentaerythritol trimethacrylate, bis[p-(3-methacryloxy-2-hydroxypropoxy)phenyl]dimethyl methane, and bis-[p-(methacryloxyethoxy)phenyl]dimethylmethane. Specific examples of monomers of amides of a polyvalent amine compound and unsaturated carboxylic acid include methylene bis-acrylamide, methylene bis-methacrylamide, 1,6-hexamethylene bis-acrylamide, 1,6-hexamethylene bis-methacrylamide, diethylene triamine trisacrylamide, xylylene bisacrylamide, and xylylene bismethacrylamide.

Moreover, a urethane-based addition polymerizable compound produced using an addition reaction of isocyanate and a hydroxyl group is preferable, and specific examples thereof include a vinyl urethane compound which is formed by adding a vinyl monomer containing a hydroxyl group represented by the following Formula (b) to a polyisocyanate compound that has two or more isocyanate groups in one molecule described in JP1973-41708B (JP-S48-41708B) and contains two or more polymerizable vinyl groups in one molecule.

$CH_2=C(R^4)COOCH_2CH(R^5)OH$ (b)

(In this case, $R^4$ and $R^5$ represent H or $CH_3$.)

In addition, urethane acrylates described in JP1976-37193A (JP-S51-37193A), JP1990-32293B (JP-H02-32293B), JP1990-16765B (JP-H02-16765B), JP2003-344997A, and JP2006-65210A; urethane compounds having an ethylene oxide-based skeleton described in JP1983-49860B (JP-S58-49860B), JP1981-17654B (JP-S56-17654B), JP1987-39417B (JP-S62-39417B), JP1987-39418B (JP-S62-39418B), JP2000-250211A, and JP2007-94138A; and urethane compounds having a hydrophilic group described in U.S. Pat. No. 7,153,632B, JP1996-505958A (JP-H08-505958A), JP2007-293221A, and JP2007-293223A are also preferable.

Among the examples described above, from the viewpoint that the balance between hydrophilicity associated with on-press developability and polymerization ability associated with printing durability is excellent, isocyanuric acid ethylene oxide-modified acrylates such as tris(acryloyloxyethyl) isocyanurate and bis(acryloyloxyethyl)hydroxyethyl isocyanurate are particularly preferable.

The details of the structures of these polymerizable compounds, whether to be used alone or in combination, and the usage method such as the addition amount can be arbitrarily set according to the final performance design of a planographic printing plate precursor. The content of the above-described polymerizable compound to be used is preferably in a range of 5% to 75% by mass, more preferably in a range of 10% to 70% by mass, and particularly preferably in a range of 15% to 60% by mass with respect to the total solid content of the image recording layer.

<Binder Polymer>

A binder polymer can be mainly used to improve the film strength of the image recording layer. As the binder polymer, known polymers of the related art can be used and polymers having coated-film properties are preferable. Among examples thereof, an acrylic resin, a polyvinyl acetal resin, and a polyurethane resin are preferable.

Preferred examples of the binder polymers include polymers having a cross-linkable functional group in the main or side chain, preferably in the side chain, for improving coated-film strength of an image portion as described in JP2008-195018A. Cross-linking occurs between polymer molecules by a cross-linkable group so that curing is promoted.

Preferred examples of the cross-linkable functional group include an ethylenically unsaturated group such as a (meth) acryl group, a vinyl group, an allyl group, or a styryl group and an epoxy group, and the cross-linkable functional groups can be introduced into a polymer by a polymer reaction or copolymerization. For example, a reaction between an acrylic polymer having a carboxyl group in the side chain thereof or polyurethane and glycidyl methacrylate or a reaction between a polymer having an epoxy group and ethylenically unsaturated group-containing carboxylic acid such as methacrylic acid can be used.

The content of the cross-linkable group in the binder polymer is preferably in a range of 0.1 to 10.0 mmol, more preferably in a range of 0.25 to 7.0 mmol, and particularly preferably in a range of 0.5 to 5.5 mmol with respect to 1 g of the binder polymer.

Moreover, it is preferable that the binder polymer includes a hydrophilic group. The hydrophilic group contributes to providing on-press developability for the image recording layer. Particularly, in the coexistence of a cross-linkable group and a hydrophilic group, both of printing durability and on-press developability can be achieved.

Examples of the hydrophilic group include a hydroxyl group, a carboxyl group, an alkylene oxide structure, an amino group, an ammonium group, an amido group, a sulfo group, and a phosphoric acid group. Among these, an alkylene oxide structure having 1 to 9 alkylene oxide units having 2 or 3 carbon atoms is preferable. A monomer having a hydrophilic group may be copolymerized in order to provide a hydrophilic group for a binder polymer.

In addition, in order to control the impressing property, a lipophilic group such as an alkyl group, an aryl group, an aralkyl group, or an alkenyl group can be introduced into the binder polymer. For example, a lipophilic group-containing monomer such as methacrylic acid alkyl ester may be copolymerized.

The mass average molar mass (Mw) of the binder polymer is preferably 2,000 or greater, more preferably 5,000 or greater, and still more preferably in a range of 10,000 to 300,000.

The content of the binder polymer is practically in a range of 3% to 90% by mass, preferably in a range of 5% to 80% by mass, and more preferably in a range of 10% to 70% by mass with respect to the total solid content of the image recording layer.

As a preferred example of the binder polymer, a polymer compound having a polyoxyalkylene chain in the side chain is exemplified. When the image recording layer contains a polymer compound having a polyoxyalkylene chain in the side chain (hereinafter, also referred to as a specific polymer compound), permeability of dampening water is promoted and on-press developability is improved.

Examples of the resin constituting the main chain of the specific polymer compound include an acrylic resin, a polyvinyl acetal resin, a polyurethane resin, a polyurea resin, a polyimide resin, a polyamide resin, an epoxy resin, a methacrylic resin, a polystyrene resin, a novolac type phenolic resin, a polyester resin, synthetic rubber, and natural rubber. Among these, an acrylic resin is particularly preferable.

The specific polymer compound does not substantially contain a perfluoroalkyl group. The expression "does not substantially contain a perfluoroalkyl group" means that the mass ratio of a fluorine atom present as a perfluoroalkyl group in a polymer compound is less than 0.5% by mass, and it is preferable that the polymer compound does not contain a fluorine atom. The mass ratio of the fluorine atom is measured by an elemental analysis method.

In addition, the "perfluoroalkyl group" is a group in which all hydrogen atoms of the alkyl group are substituted with fluorine atoms.

As alkylene oxide (oxyalkylene) in a polyoxyalkylene chain, alkylene oxide having 2 to 6 carbon atoms is preferable, ethylene oxide (oxyethylene) or propyleneoxide (oxypropylene) is more preferable, and ethylene oxide is still more preferable.

The repetition number of the alkylene oxide in a polyoxyalkylene chain, that is, a poly(alkyleneoxide) moiety is preferably in a range of 2 to 50 and more preferably in a range of 4 to 25.

When the repetition number of the alkylene oxide is 2 or greater, the permeability of dampening water is sufficiently improved. Further, from the viewpoint that printing durability is not degraded due to abrasion, it is preferable that the repetition number thereof is 50 or less.

It is preferable that the poly(alkyleneoxide) moiety has a structure represented by the following Formula (1) as the side chain of a polymer compound. It is more preferable that the poly(alkyleneoxide) moiety has a structure represented by the following Formula (1) as the side chain of an acrylic resin.

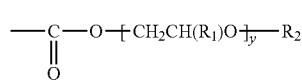

Formula (1)

In Formula (1), y is preferably in a range of 2 to 50 and more preferably in a range of 4 to 25. $R_1$ represents a hydrogen atom or an alkyl group and $R_2$ represents a hydrogen atom or an organic group. As the organic group, an alkyl group having 1 to 6 carbon atoms is preferable and examples thereof include a methyl group, an ethyl group, an n-propyl group, an isopropyl group, an n-butyl group, a sec-butyl group, an isobutyl group, a t-butyl group, an n-pentyl group, an isopentyl group, a neopentyl group, an n-hexyl group, an isohexyl group, a 1,1-dimethylbutyl group, a 2,2-dimethylbutyl group, a cyclopentyl group, and a cyclohexyl group.

In Formula (1), $R_1$ represents preferably a hydrogen atom or a methyl group and particularly preferably a hydrogen atom. $R_2$ represents particularly preferably a hydrogen atom or a methyl group.

The specific polymer compound may have cross-linking properties in order to improve coated-film strength of an image portion. In order to allow the polymer compound to have cross-linking properties, a cross-linkable functional group such as an ethylenically unsaturated bond may be introduced to the main chain or the side chain of a polymer. The cross-linkable functional group may be introduced by copolymerization.

Examples of the polymer compound having an ethylenically unsaturated bond in the main chain of a molecule include poly-1,4-butadiene and poly-1,4-isoprene.

As an example of the polymer compound having an ethylenically unsaturated bond in the side chain of a molecule, a polymer compound of an ester or an amide of acrylic acid or methacrylic acid, in which a residue (R of —COOR or CONHR) of the ester or the amide has an ethylenically unsaturated bond may be exemplified.

Examples of the residue (the above-described R) having an ethylenically unsaturated bond include —$(CH_2)_n$CR$^1$=CR$^2$R$^3$, —$(CH_2O)_n$CH$_2$CR$^1$=CR$^2$R$^3$, —$(CH_2CH_2O)_n$CH$_2$CR$^1$=CR$^2$R$^3$, —$(CH_2)_n$NH—CO—O—CH$_2$CR$^1$=CR$^2$R$^3$, —$(CH_2)_n$—O—CO—CR$^1$=CR$^2$R$^3$, and $(CH_2CH_2O)_2$—X (in the formula, $R^1$ to $R^3$ each independently represent a hydrogen atom, a halogen atom, or an alkyl group, an aryl group, an alkoxy group, or an aryloxy group having 1 to 20 carbon atoms, $R^1$ and $R^2$ or $R^3$ may be bonded to each other to form a ring, n represents an integer of 1 to 10, and X represents a dicyclopentadienyl residue).

Specific examples of the ester residue include —$CH_2CH=CH_2$ (described in JP1995-21633B (JP-H07-21633B)), —$CH_2CH_2O$—$CH_2CH=CH_2$, —$CH_2C(CH_3)=CH_2$, —$CH_2CH=CH$—$C_6H_5$, —$CH_2CH_2OCOCH=CH$—$C_6H_5$, —$CH_2CH_2$—NHCOO—$CH_2CH=CH_2$, and $CH_2CH_2O$—X (in the formula, X represents a dicyclopentadienyl residue).

Specific examples of the amide residue —$CH_2CH=CH_2$, —$CH_2CH_2$—Y (in the formula, Y represents a cyclohexene residue), and —$CH_2CH_2$—OCO—CH=$CH_2$.

In the specific polymer compound having cross-linking properties, for example, a free radical (growth radical in the step of polymerization of a polymerization initiating radical or a polymerizable compound) is added to the cross-linkable functional group thereof so that addition polymerization is carried out directly between polymer compounds or through a polymerization chain of a polymerizable compound, and cross-linking occurs between polymer compound molecules so that curing is promoted. Alternatively, atoms (hydrogen atom on carbon atoms adjacent to the cross-linkable functional group) in the polymer compound are pulled out by free radicals so that polymer compound radicals are generated, and cross-linking occurs between molecules of the polymer compound so that curing is promoted when the polymer compound radicals are bonded to each other.

The content (content of radically polymerizable unsaturated double bond by iodine titration) of the cross-linkable group in the specific polymer compound is preferably in a range of 0.1 to 10.0 mmol, more preferably in a range of 1.0 to 7.0 mmol, and particularly preferably in a range of 2.0 to 5.5 mmol per 1 g of the polymer compound. When the content thereof is in the above-described range, excellent sensitivity and excellent storage stability are obtained.

For the purpose of improving various properties such as image strength, the specific polymer compound may further contain a copolymerization component within the range in which the effects of the specific polymer compound are not impaired. As a preferable copolymerization component, a component represented by the following Formula (2) may be exemplified.

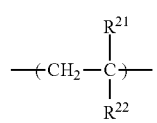

Formula (2)

In Formula (2), $R^{21}$ represents a hydrogen atom or a methyl group. $R^{22}$ represents a substituent.

It is preferable that $R^{22}$ represents an ester group, an amido group, a cyano group, a hydroxyl group, or an aryl group. Among these, an ester group, an amido group, or a phenyl group which may have a substituent is preferable. Examples of the substituent of the phenyl group include an alkyl group, an aralkyl group, an alkoxy group, and an acetoxymethyl group. Examples of the copolymerization component represented by Formula (2) include acrylic acid esters, methacrylic acid esters, acrylamides, methacrylamides, N-substituted acrylamides, N-substituted methacrylamides, N,N-di-substituted acrylamides, N,N-di-substituted methacrylamides, styrenes, acrylonitriles, and methacrylonitriles. Among these, acrylic acid esters, methacrylic acid esters, acrylamides, methacrylamides, N-substituted acrylamides, N-substituted methacrylamides, N,N-di-substituted acrylamides, N,N-di-substituted methacrylamides, or styrenes are preferable. From the viewpoint of printing durability, acrylonitriles are preferable.

The proportion of repeating units having a poly(alkyleneoxide) moiety in the total repeating units constituting the specific polymer compound is not particularly limited, but is preferably in a range of 0.5% to 80% by mole and more preferably in a range of 0.5% to 50% by mole.

Specific examples A-1 to A-19 of the specific polymer compound are shown below, but the present invention is not limited thereto. Further, the ratio of repeating units indicates a molar ratio. In the following specific examples, Me represents a methyl group.

A-1
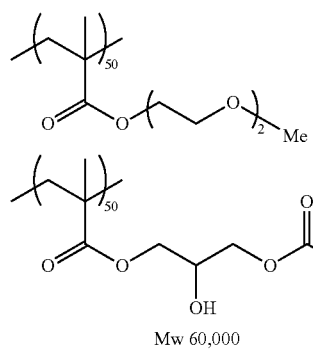

A-2
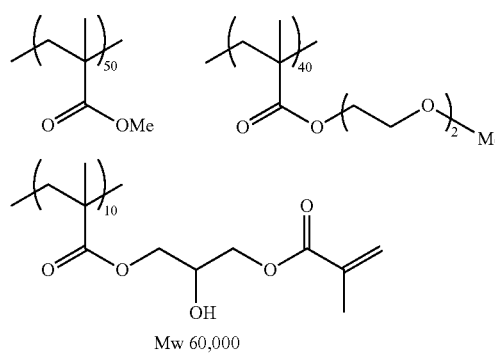
Mw 60,000

A-3
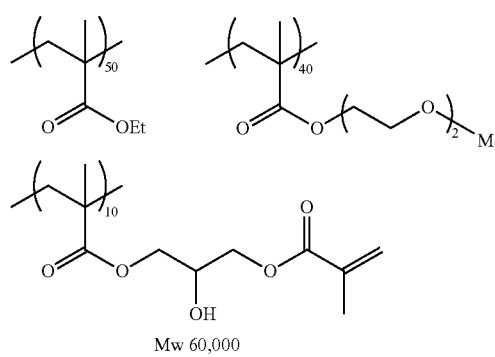
Mw 60,000

A-4
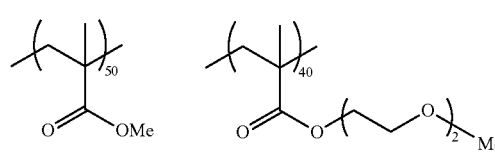

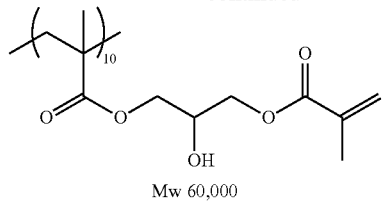
Mw 60,000

A-5
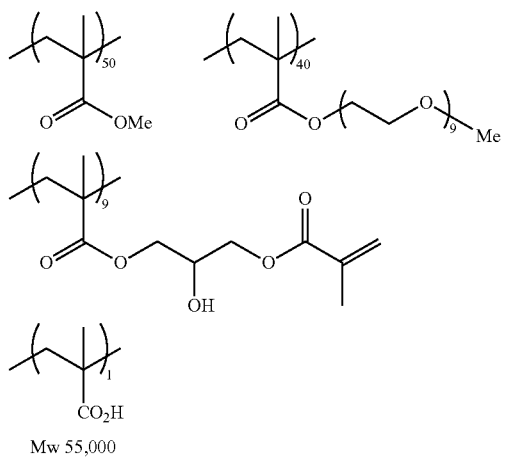
Mw 55,000

A-6
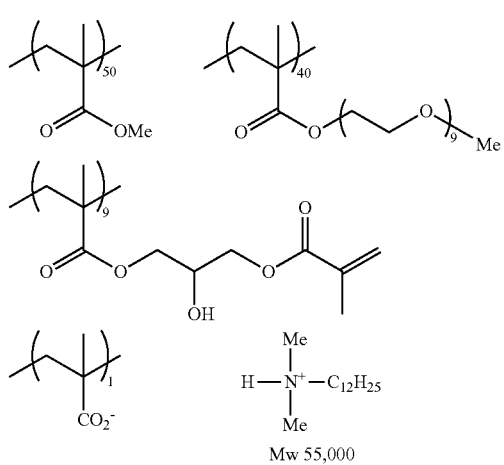
Mw 55,000

A-7
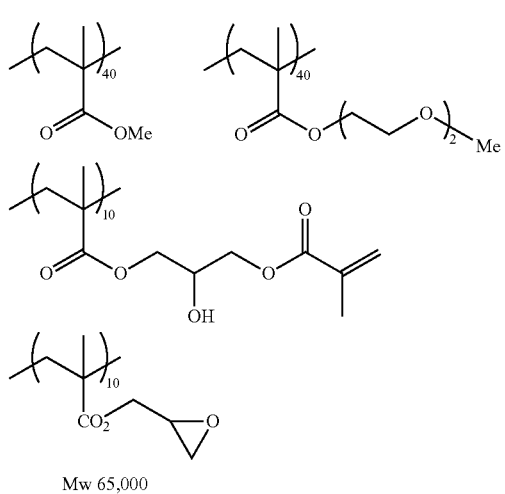
Mw 65,000

-continued

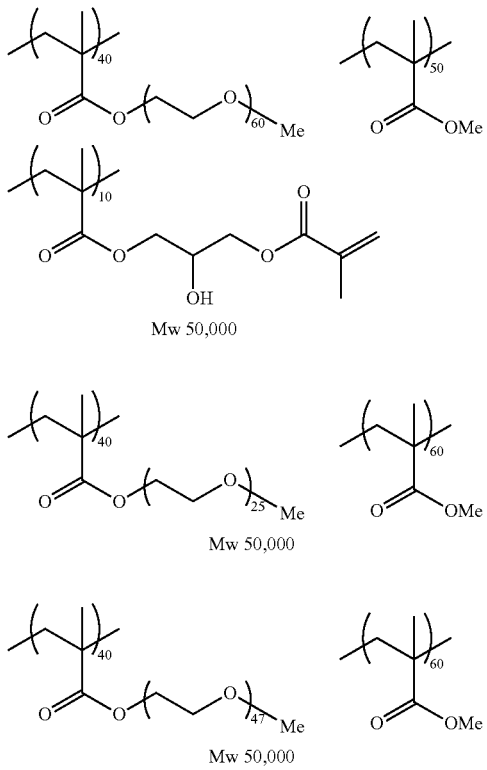

As the specific polymer compound, hydrophilic polymer compounds such as polyacrylic acid and polyvinyl alcohol described in JP2008-195018A can be used in combination as necessary. Further, a lipophilic polymer compound and a hydrophilic polymer compound can be used in combination.

In addition to the presence of the specific polymer compound in the image recording layer as a binder that plays a role of connecting image recording layer components with each other, the specific polymer compound may be present in the form of fine particles. In a case where the specific polymer compound is present in the form of fine particles, the average particle dimeter is in a range of 10 to 1000) nm, preferably in a range of 20 to 300 nm, and particularly preferably in a range of 30 to 120 nm.

The content of the specific polymer compound is preferably in a range of 3% to 90% by mass and more preferably in a range of 5% to 80% by mass with respect to the total solid content of the image recording layer. When the content thereof is in the range of 3% to 90% by mass, both of permeability of dampening water and image formability can be reliably achieved.

Other preferred examples of the binder polymer include a polymer compound (hereinafter, also referred to as a "star type polymer compound") which has a polymer chain bonded to a nucleus through a sulfide bond by means of using a polyfunctional, in a range of hexa- to deca-functional, thiol as the nucleus and in which the polymer chain has a polymerizable group. As the star type polymer compound, for example, compounds described in JP2012-148555A can be preferably used.

Examples of the star type polymer compound include compounds having a polymerizable group such as an ethylenically unsaturated bond in the main or side chain, preferably in the side chain, for improving coated-film strength of an image portion as described in JP2008-195018A. Cross-linking occurs between polymer molecules by a polymerizable group so that curing is promoted.

Preferred examples of the polymerizable group include an ethylenically unsaturated group such as a (meth)acryl group, a vinyl group, an allyl group, or a styryl group and an epoxy group. Among these, from the viewpoint of polymerization reactivity, a (meth)acryl group, a vinyl group, or a styryl group is more preferable and a (meth)acryl group is particularly preferable. These groups can be introduced into a polymer by a polymer reaction or copolymerization. For example, a reaction between a polymer having a carboxyl group in the side chain thereof and glycidyl methacrylate or a reaction between a polymer having an epoxy group and ethylenically unsaturated group-containing carboxylic acid such as methacrylic acid can be used. These groups may be used in combination.

The content of the cross-linkable group in the star type polymer compound is preferably in a range of 0.1 to 10.0 mmol, more preferably in a range of 0.25 to 7.0 mmol, and most preferably in a range of 0.5 to 5.5 mmol with respect to 1 g of the star type polymer compound.

Moreover, it is preferable that the star type polymer compound further includes a hydrophilic group. The hydrophilic group contributes to providing on-press developability for the image recording layer. Particularly, in the coexistence of a polymerizable group and a hydrophilic group, both of printing durability and developability can be achieved.

Examples of the hydrophilic group include $-SO_3M^1$, $-OH$, $-CONR^1R^2$ ($M_1$ represents hydrogen, a metal ion, an ammonium ion, or a phosphonium ion, $R^1$ and $R^2$ each independently represent a hydrogen atom, an alkyl group, an alkenyl group, or an aryl group, and $R^1$ and $R^2$ may be bonded to each other to form a ring), $-N^+R^3R^4R^5X^-$ ($R^3$ to $R^5$ each independently represent an alkyl group having 1 to 8 carbon atoms and $X^-$ represents a counter anion), a group represented by the following Formula (1), and a group represented by the following Formula (2).

$$-(CH_2CH_2O)_nR \qquad \text{Formula (1)}$$

$$-(C_3H_6O)_mR \qquad \text{Formula (2)}$$

In the above-described formulae, n and m each independently represent an integer of 1 to 100 and R's each independently represent a hydrogen atom or an alkyl group having 1 to 18 carbon atoms.

Here, in a case where the star type polymer compound is a star type polymer compound having a polyoxyalkylene chain (for example, a group represented by the above-described Formula (1) or (2)) in the side chain, such a star type polymer compound is a polymer compound having the above-described polyoxyalkylene chain in the side chain.

Among these hydrophilic groups, $-CONR^1R^2$, groups represented by Formula (1), and groups represented by Formula (2) are preferable, $-CONR^1R^2$ and groups represented by Formula (1) are more preferable, and groups represented by Formula (1) are particularly preferable. Among the groups represented by Formula (1), n represents an integer of preferably 1 to 10 and particularly preferably 1 to 4. Further, R represents more preferably a hydrogen atom or an alkyl group having 1 to 4 carbon atoms and particularly preferably a hydrogen atom or a methyl group. These hydrophilic groups may be used in combination of two or more kinds thereof.

Further, it is preferable that the star type polymer compound does not substantially include a carboxylic acid group, a phosphoric acid group, or a phosphonic acid group. Specifically, the amount of these acid groups is preferably less than 0.1 mmol/g, more preferably less than 0.05 mmol/g, and particularly preferably 0.03 mmol/g or less. When the amount of these acid groups is less than 0.1 mmol/g, developability is further improved.

In order to control impressing properties, a lipophilic group such as an alkyl group, an aryl group, an aralkyl group, or an alkenyl group can be introduced to the star type polymer compound. Specifically, a lipophilic group-containing monomer such as methacrylic acid alkyl ester may be copolymerized.

Specific examples of the star type polymer compound include compounds described in paragraphs [0153] to [0157] of JP2014-104631A.

The star type polymer compound can be synthesized, using a known method, by performing radical polymerization on the above-described monomers constituting a polymer chain in the presence of the above-described polyfunctional thiol compound.

The mass average molar mass (Mw) of the star type polymer compound is preferably in a range of 5,000 to 500,000, more preferably in a range of 10,000 to 250,000, and particularly preferably in a range of 20,000 to 150,000. When the mass average molar mass thereof is in the above-described range, the on-press developability and the printing durability are more improved.

The star type polymer compound may be used alone or in combination of two or more kinds thereof. Further, the star type polymer compound may be used in combination with a typical linear binder polymer.

The content of the star type polymer compound is preferably in a range of 5% to 95% by mass, more preferably in a range of 10% to 90% by mass, and particularly preferably in a range of 15% to 85% by mass with respect to the total solid content of the image recording layer.

From the viewpoint of promoting the permeability of dampening water and improving the on-press developability, star type polymer compounds described in JP2012-148555A are particularly preferable.

<Other Components>

The image recording layer A can contain other components described below.

(1) Low-Molecular Weight Hydrophilic Compound

In order to improve the on-press developability without degrading the printing durability, the image recording layer may contain a low-molecular weight hydrophilic compound.

As the low-molecular weight hydrophilic compound, examples of a water-soluble organic compound include glycols such as ethylene glycol, diethylene glycol, triethylene glycol, propylene glycol, dipropylene glycol, and tripropylene glycol and ether or ester derivatives thereof, polyols such as glycerin, pentaerythritol, and tris(2-hydroxyethyl) isocyanurate; organic amines such as triethanolamine, diethanolamine, and monoethanolamine and salts thereof; organic sulfonic acids such as alkylsulfonic acid, toluenesulfonic acid, and benzenesulfonic acid and salts thereof; organic sulfamic acids such as alkyl sulfamic acid and salts thereof; organic sulfuric acids such as alkyl sulfuric acid and alkyl ether sulfuric acid and salts thereof; organic phosphonic acids such as phenyl phosphonic acid and salts thereof; organic carboxylic acids such as tartaric acid, oxalic acid, citric acid, malic acid, lactic acid, gluconic acid, and amino acids and salts thereof; and betaines.

Among these, it is preferable that the image recording layer contains at least one selected from the group consisting of polyols, organic sulfates, organic sulfonates, and betaines.

Specific examples of the compounds of the organic sulfonates include compounds described in paragraphs [0026] to [0031] of JP2007-276454A and paragraphs [0020] to [0047] of JP2009-154525A. The salt may be potassium salt or lithium salt.

Examples of the organic sulfate include compounds described in paragraphs [0034] to [0038] of JP2007-276454A.

As betaines, compounds having 1 to 5 carbon atoms of hydrocarbon substituents to nitrogen atoms are preferable. Specific examples thereof include trimethyl ammonium acetate, dimethyl propyl ammonium acetate, 3-hydroxy-4-trimethyl ammonio butyrate, 4-(1-pyridinio)butyrate, 1-hydroxyethyl-1-imidazolioacetate, trimethyl ammonium methane sulfonate, dimethyl propyl ammonium methane sulfonate, 3-trimethylammonio-1-propane sulfonate, and 3-(1-pyridinio)-1-propane sulfonate.

Since the low-molecular weight hydrophilic compound has a small structure of a hydrophobic portion and almost does not have a surface active action, hydrophobicity or coated-film strength of an image portion is not degraded by dampening water permeating into an image recording layer exposed portion (image portion) and ink receptivity or printing durability of the image recording layer can be maintained satisfactorily.

The amount of the low-molecular weight hydrophilic compounds to be added to the image recording layer is preferably in a range of 0.5% to 20% by mass with respect to the total amount of the solid content in the image recording layer. The amount thereof is more preferably in a range of 1% to 15% by mass and still more preferably in a range of 2% to 10% by mass. When the amount thereof is in the above-described range, excellent on-press developability and printing durability can be obtained.

These compounds may be used alone or in combination of two or more kinds thereof.

(2) Oil Sensitizing Agent

In order to improve the impressing property, an oil sensitizing agent such as a phosphonium compound, a nitrogen-containing low-molecular weight compound, or an ammonium group-containing polymer can be used for the image recording layer. Particularly, in a case where a protective layer contains an inorganic layered compound, the above-described compounds function as a surface coating agent of the inorganic layered compound and prevent a degradation in impressing property due to the inorganic layered compound during the printing.

Preferred examples of the phosphonium compound include phosphonium compounds described in JP2006-297907A and JP2007-50660A. Specific examples thereof include tetrabutyl phosphonium iodide, butyl triphenyl phosphonium bromide, tetraphenyl phosphonium bromide, 1,4-bis(triphenylphosphonio)butane=di(hexafluorophosphate), 1,7-bis(triphenylphosphonio)heptane=sulfate, and 1,9-bis(triphenylphosphonio)nonane=naphthalene-2,7-disulfonate.

Examples of the nitrogen-containing low-molecular weight compound include compounds described in paragraphs [0021] to [0037] of JP2008-284858A and paragraphs [0030] to [0057] of JP2009-90645A.

The ammonium group-containing polymer is not particularly limited as long as the polymer includes an ammonium group in the structure thereof, but a polymer that contains, as a copolymerization component, 5% to 80% by mole of (meth)acrylate having an ammonium group in the side chain is preferable. Specific examples thereof include polymers described in paragraphs 100891 to 101051 of JP2009-208458A.

The reduced specific viscosity (unit: mL/g) of the ammonium group-containing polymer which is acquired by the following measurement method is preferably in a range of 5 to 120, more preferably in a range of 10 to 110, and particularly preferably in a range of 15 to 100. When the reduced specific viscosity is converted into the mass average molar mass (Mw), the value thereof is preferably in a range of 10,000 to 150,000, more preferably in a range of 17,000 to 140.000, and particularly preferably in a range of 20,000 to 130,000.

<Method of Measuring Reduced Specific Viscosity>

3.33 g (1 g as a solid content) of a 30 mass % polymer solution is weighed using a 20 ml of measuring flask and is diluted with N-methylpyrrolidone. This solution is allowed to stand in a constant-temperature tank at 30° C. for 30 minutes and put into an Ubbelohde reduced viscosity tube (viscometer constant: 0.010 cSt/s), and then the time for the solution to fall down at 30° C. is measured. Further, the measurement is performed two times using the same sample and the average value thereof is calculated. Similarly, also in a case of the blank (only N-methylpyrrolidone), the measurement is performed and the reduced specific viscosity (ml/g) is calculated from the following equation.

$$\text{Reduced specific viscosity (ml/g)} = \frac{\frac{\text{Time for sample solution to fall down (sec)} - \text{time for blank to fall down (sec)}}{\text{Time for blank to fall down (sec)}}}{3.33 \text{ (g)} \times \frac{30}{100}} \quad (1)$$

$$\overline{20 \text{ (ml)}}$$

Hereinafter, specific examples of the ammonium group-containing polymer will be described:
2-(trimethylammonio)ethylmethacylate=p-toluenesulfonate/3,6-dioxaheptylmethacrylate copolymer (molar ratio of 10/90, Mw of 45,000), (2) a 2-(trimethylammonio) ethylmethacrylate=hexafluorophosphate/3,6-dioxaheptylmethacrylate copolymer (molar ratio of 20/80, Mw of 60,000), (3) a 2-(ethyldimethylammonio) ethylmethacrylate=p-toluenesulfonate/hexylmethacrylate copolymer (molar ratio of 30/70, Mw of 45,000), (4) a 2-(trimethylammonio)ethyl methacrylate=hexafluorophosphate/2-ethylhexylmethacrylalte copolymer (molar ratio of 20/80, Mw of 60,000), (5) a 2-(trimethylammonio)ethylmethacrylate=methylsulfate/hexylmethacrylate copolymer (molar ratio of 40/60, Mw of 70,000), (6) a 2-(butyldimethylammonio) ethylmethacrylate=hexafluorophosphate/3,6-dioxaheptylmethacrylate copolymer (molar ratio of 25/75, Mw of 65,000), (7) a 2-(butyldimethylammonio) ethylacrylate=hexafluorophosphate/3,6-dioxaheptylmethacrylate copolymer (molar ratio of 20/80, Mw of 65.000), (8) a 2-(butyldimethylammonio)ethylmethacrylate=13-ethyl-5,8,11-trioxa-1-heptadecanesulfonate/3,6-dioxaheptylmethacrylate copolymer (molar ratio of 20/80, Mw of 75,000), and (9) a 2-(butyldimethylammonio) ethylmethacrylate=hexafluorophosphate/3,6-dioxaheptylmethacrylate/2-hydroxy-3-methacryloxypropylmethacrylate copolymer (molar ratio of 15/80/5, Mw of 65,000).

The content of the oil sensitizing agent is preferably in a range of 0.01% to 30.0% by mass, more preferably in a range of 0.1% to 15.0% by mass, and still more preferably in a range of 1% to 10% by mass with respect to the total solid content of the image recording layer.

(3) Other Components

The image recording layer may further contain other components such as a surfactant, a colorant, a printing-out agent, a polymerization inhibitor, a higher fatty acid derivative, a plasticizer, inorganic fine particles, an inorganic layered compound, a co-sensitizer, and a chain transfer agent. Specifically, the compounds and the addition amounts described in paragraphs [0114] to [0159] of JP2008-284817A, paragraphs [0023] to [0027] of JP2006-091479A, and paragraph [0060] of US2008/0311520A can be preferably used.

<Formation of Image Recording Layer A>

The image recording layer A is formed by dispersing or dissolving each of the above-described required components in a known solvent to prepare a coating solution, coating a support with the coating solution directly or through an undercoat layer using a known method such as a bar coater coating method, and drying the resultant, as described in paragraphs [0142] and [0143] of JP2008-195018A. The coating amount of the image recording layer (solid content) on the support to be obtained after the coating and the drying varies depending on the applications thereof, but is preferably in a range of 0.3 to 3.0 g/m². When the coating amount thereof is in the above-described range, excellent sensitivity and excellent film-coating characteristics of the image recording layer are obtained.

(Image Recording Layer B)

The image recording layer B contains an infrared absorbent, a polymerization initiator, a polymerizable compound, and a particulate polymer compound. Hereinafter, the constituent components of the image recording layer B will be described.

Similarly, the infrared absorbent, the polymerization initiator, and the polymerizable compound described in the image recording layer A can be used as an infrared absorbent, a polymerization initiator, and a polymerizable compound in the image recording layer B.

<Polymer Compound Having Particulate Shape>

It is preferable that the particulate polymer compound is selected from hydrophobic thermoplastic polymer fine particles, thermally reactive polymer fine particles, polymer fine particles having a polymerizable group, a microcapsule encapsulating a hydrophobic compound, and a microgel (cross-linked polymer fine particle). Among these, polymer fine particles having a polymerizable group and a microgel are preferable. According to a particularly preferred embodiment, the particulate polymer compound includes at least one ethylenically unsaturated polymerizable group. Because of the presence of the particulate polymer compound, effects of improving the printing durability of an exposed portion and the on-press developability of a unexposed portion are obtained.

Preferred examples of the hydrophobic thermoplastic polymer fine particles include hydrophobic thermoplastic polymer fine particles described in Research Disclosure No. 33303 on January, 1992, JP1997-123387A (JP-H09-123387A), JP1997-131850A (JP-H09-131850A), JP1997-171249A (JP-H09-171249A), JP1997-171250A (JP-H09-171250A), and EP931647B.

Specific examples of a polymer constituting hydrophobic thermoplastic polymer fine particles include homopolymers or copolymers of monomers such as acrylate or methacrylate having structures of ethylene, styrene, vinyl chloride, methyl acrylate, ethyl acrylate, methyl methacrylate, ethyl methacrylate, vinylidene chloride, acrylonitrile, vinyl carbazole, and polyalkylene, and mixtures of these. Among these, polystyrene, styrene, a copolymer containing acrylonitrile, and polymethylmethacrylate are more preferable. The average particle diameter of the hydrophobic thermoplastic polymer fine particles is preferably in a range of 0.01 to 3.0 μm.

Examples of the thermally reactive polymer fine particles include polymer fine particles having a thermally reactive group. The thermally reactive polymer fine particles are cross-linked by a thermal reaction and have hydrophobic regions formed by a change in functional groups during the crosslinking.

As the thermally reactive group in polymer fine particles having a thermally reactive group, a functional group that performs any reaction may be used as long as a chemical bond is formed, but a polymerizable group is preferable. Preferred examples of the polymerizable group include an ethylenically unsaturated group that performs a radical polymerization reaction (such as an acryloyl group, a methacryloyl group, a vinyl group, or an allyl group); a cationic polymerizable group (such as a vinyl group, a vinyloxy group, an epoxy group, or an oxetanyl group); an isocyanate group that performs an addition reaction or a block body thereof, an epoxy group, a vinyloxy group, and a functional group having active hydrogen atoms as the reaction partners of these (such as an amino group, a hydroxyl group, or a carboxyl group); a carboxyl group that performs a condensation reaction and a hydroxyl group or an amino group as a reaction partner thereof; and an acid anhydride that performs a ring opening addition reaction and an amino group or a hydroxyl group as a reaction partner thereof.

The microcapsule is a microcapsule in which at least a part of constituent components of the image recording layer are encapsulated as described in JP2001-277740A and JP2001-277742A. Further, the constituent components of the image recording layer may be contained in a portion other than the microcapsule. Moreover, a preferred embodiment of the image recording layer containing the microcapsule is an embodiment in which hydrophobic constituent components are encapsulated by a microcapsule and hydrophilic constituent components are contained by a portion other than the microcapsule.

The microgel (cross-linked polymer fine particles) may contain a part of the constituent components of the image recording layer in at least one of the surface or the inside thereof. From the viewpoints of image forming sensitivity and printing durability, a reactive microgel having a radical polymerizable group on the surface thereof is particularly preferable.

The constituent components of the image recording layer can be made into microcapsules or microgel particles using a known method.

The average particle diameter of the particulate polymer compound is preferably in a range of 0.01 to 3.0 μm, more preferably in a range of 0.03 to 2.0 μm, and still more preferably in a range of 0.10 to 1.0 μm. When the average particle diameter thereof is in the above-described range, excellent resolution and temporal stability are obtained.

The content of the particulate polymer compound is preferably in a range of 5% to 90% by mass with respect to the total solid content of the image recording layer.

<Other Components>

The image recording layer B can contain other components described in the above-described image recording layer A as necessary.

<Formation of Image Recording Layer B>

The image recording layer B can be formed in the same manner as the image recording layer A described above.

(Image Recording Layer C)

The image recording layer C contains an infrared absorbent and a thermoplastic fine particle polymer. Hereinafter, the constituent components of the image recording layer C will be described.

<Infrared Absorbent>

The infrared absorbent contained in the image recording layer C is a dye or a pigment having maximum absorption at a wavelength of 760 to 1,200 nm. A dye is more preferable. As the dye, commercially available dyes and known dyes described in the literatures (for example, "Dye Handbook" edited by The Society of Synthetic Organic Chemistry. Japan, published in 1970, "Infrared Absorbind Dyes" of "Chemical Industry", p. 45 to 51, published on May, 1986, and "Development and Market Trend of Functional Dyes in 1990's" Section 2.3 of Chapter 2 (CMC Publishing Co., Ltd., 1990)) and the patents can be used. Specific preferred examples thereof include infrared absorbing dyes such as an azo dye, a metal complex salt azo dye, a pyrazolone azo dye, an anthraquinone dye, a phthalocyanine dye, a carbonium dye, a quinone imine dye, a polymethine dye, and a cyanine dye.

Among these, infrared absorbing dyes having a water-soluble group are particularly preferable from the viewpoint of addition to the image recording layer.

Specific examples of the infrared absorbing dyes are described below, but the present invention is not limited thereto.

(IR-1)

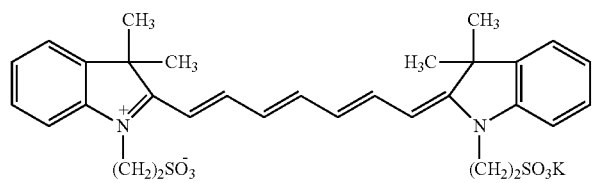

-continued
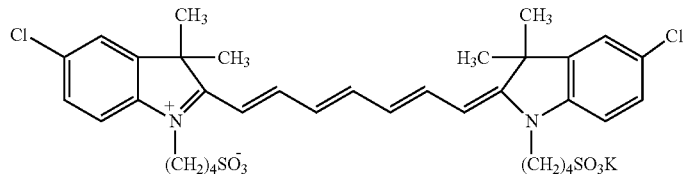
(IR-2)
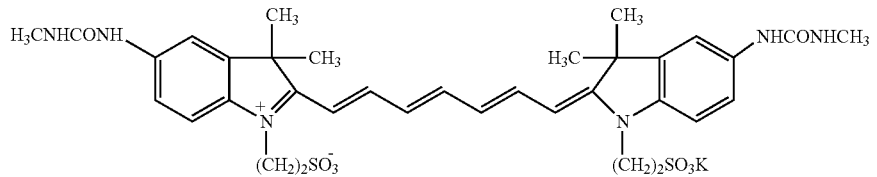
(IR-3)
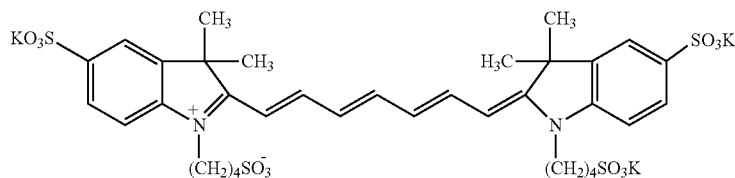
(IR-4)
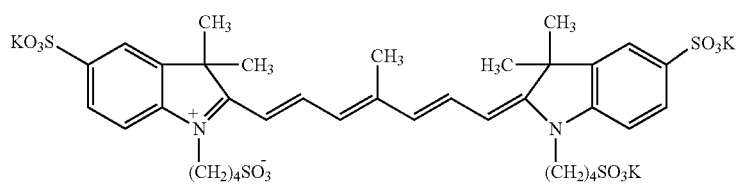
(IR-5)
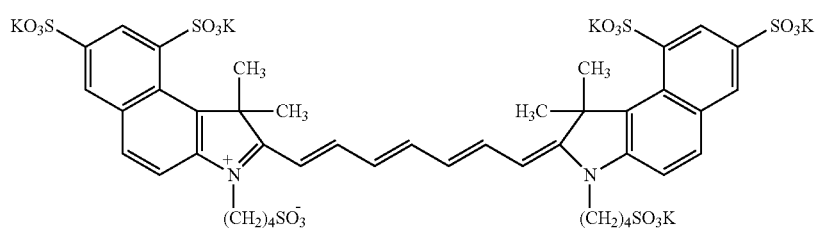
(IR-6)
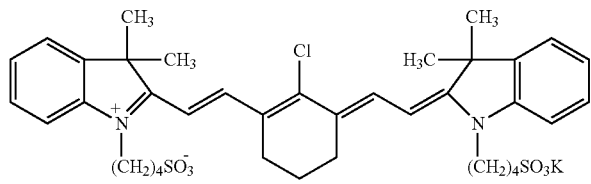
(IR-7)
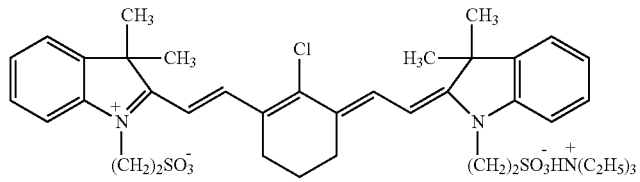
(IR-8)
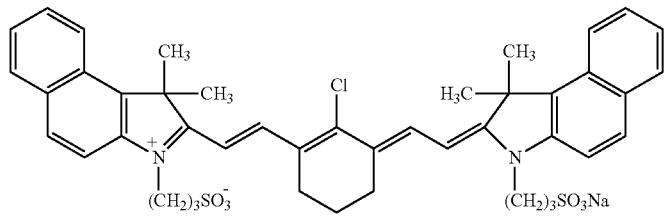
(IR-9)

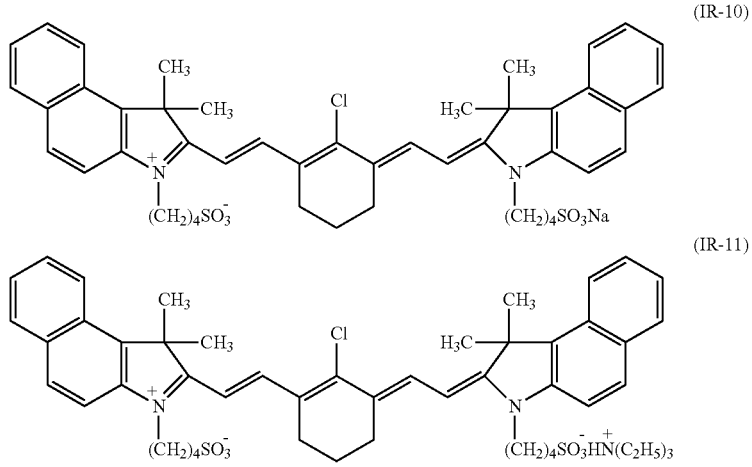

As the pigments, commercially available pigments and pigments described in Color Index (C. I.) Handbook, "Latest Pigment Handbook" (edited by Japan Pigment Technology Association, 1977), "Latest Pigment Application Technology" (CMC Publishing Co., Ltd., 1986), and "Printing Ink Technology" (CMC Publishing Co., Ltd., 1984) can be used.

The particle diameter of the pigment is preferably in a range of 0.01 to 1 μm and more preferably in a range of 0.01 to 0.5 μm. A known dispersion technique used to produce inks or toners can be used as a method of dispersing the pigment. The details are described in "Latest Pigment Application Technology" (CMC Publishing Co., Ltd., 1986).

The content of the infrared absorbent is preferably in a range of 0.1% to 30% by mass, more preferably in a range of 0.25% to 25% by mass, and particularly preferably in a range of 0.5% to 20% by mass with respect to the solid content of the image recording layer. When the content thereof is in the above-described range, excellent sensitivity is obtained without damaging the film strength of the image recording layer.

<Thermoplastic Fine Particle Polymer>

The glass transition temperature (Tg) of the thermoplastic fine particle polymer is preferably in a range of 60° C. to 250° C. Tg of the thermoplastic fine particle polymer is more preferably in a range of 70° C. to 140° C. and still more preferably in a range of 80° C. to 120° C. Preferred examples of the thermoplastic fine particle polymer having a Tg of 60° C. or higher include thermoplastic fine particle polymers described in Research Disclosure No. 33303 on January, 1992, JP1997-123387A (JP-H09-123387A), JP1997-131850A (JP-H09-131850A), JP1997-171249A (JP-H09-171249A), JP1997-171250A (JP-H09-171250A), and EP931647B.

Specific examples thereof include homopolymers or copolymers formed of monomers such as ethylene, styrene, vinyl chloride, methyl acrylate, ethyl acrylate, methyl methacrylate, ethyl methacrylate, vinylidene chloride, acrylonitrile, and vinyl carbazole, and mixtures of these. Among these, polystyrene and polymethylmethacrylate are preferable.

The average particle diameter of the thermoplastic fine particle polymer is preferably in a range of 0.005 to 2.0 μm. When the average particle diameter is extremely large, the resolution may be degraded. Further, when the average particle diameter is extremely small, temporal stability may be degraded. This value is used as the average particle diameter in a case where two or more kinds of thermoplastic fine particle polymers are mixed with each other. The average particle diameter thereof is more preferably in a range of 0.01 to 1.5 μm and particularly preferably in a range of 0.05 μm to 1.0 μm. The polydispersity in a case where two or more kinds of thermoplastic fine particle polymers are mixed with each other is preferably 0.2 or greater. The average particle diameter and the polydispersity are calculated by laser light scattering.

The thermoplastic fine particle polymer may be used in combination of two or more kinds thereof. Specifically, at least two kinds of thermoplastic fine particle polymers with different particle sizes or at least two kinds of thermoplastic fine particle polymers with different glass transition temperatures may be exemplified. When two or more kinds of thermoplastic fine particle polymers are used in combination, coated-film curing properties of an image portion are further improved and printing durability in a case where a planographic printing plate is obtained is further improved.

For example, in a case where thermoplastic fine particle polymers having the same particle size are used, voids are present between the thermoplastic fine particle polymers to some extent, the curing properties of the coated-film are not desirable in some cases even when the thermoplastic fine particle polymers are melted and solidified by image exposure. Meanwhile, in a case where thermoplastic fine particle polymers having different particle sizes are used, the porosity of the voids between the thermoplastic fine particle polymers can be decreased and thus the coated-film curing properties of the image portion after image exposure can be improved.

Further, in a case where thermoplastic fine particle polymers having the same Tg are used, the thermoplastic fine particle polymers are not sufficiently melted and solidified and, accordingly, the coated-film curing properties are not desirable in some cases when an increase in temperature of the image recording layer resulting from image exposure is insufficient. Meanwhile, in a case where thermoplastic fine particle polymers having different glass transition temperatures are used, the coated-film curing properties of the image portion can be improved when an increase in temperature of the image recording layer resulting from image exposure is insufficient.

In a case where two or more kinds of thermoplastic fine particle polymers having different glass transition temperatures are used in combination, the Tg of at least one thermoplastic fine particle polymer is preferably 60° C. or higher. At this time, a difference in Tg is preferably 10° C. or higher and more preferably 20° C. or higher. In addition, the content of the thermoplastic fine particle polymer having a Tg of 60° C. or higher is 70% by mass or greater with respect to the total amount of all thermoplastic fine particle polymers.

The thermoplastic fine particle polymer may include a cross-linkable group. When a thermoplastic fine particle polymer having a cross-linkable group is used, the cross-linkable group is thermally reacted due to heat generated by an image-exposed portion, cross-linking occurs between polymers, coated-film strength of an image portion is improved, and printing durability becomes more excellent. As the cross-linkable group, a functional group, in which any reaction may occur, is not limited as long as a chemical bond is formed, and examples thereof include an ethylenically unsaturated group that performs a polymerization reaction (such as an acryloyl group, a methacryloyl group, a vinyl group, or an allyl group); an isocyanate group that performs an addition reaction or a block body thereof, and a group having active hydrogen atoms as the reaction partners of these (such as an amino group, a hydroxyl group, or a carboxyl group); an epoxy group that performs an addition reaction and an amino group, a carboxyl group or a hydroxyl group as reaction partners thereof, a carboxyl group that performs a condensation reaction and a hydroxyl group or an amino group; and an acid anhydride that performs a ring opening addition reaction and an amino group or a hydroxyl group.

Specific examples of the thermoplastic fine particle polymer having a cross-linkable group include thermoplastic fine particle polymers having cross-linkable groups such as an acryloyl group, a methacryloyl group, a vinyl group, an allyl group, an epoxy group, an amino group, a hydroxyl group, a carboxyl group, an isocyanate group, an acid anhydride, and a group protecting these. These cross-linkable groups may be introduced to polymers at the time of polymerization of fine particle polymers or may be introduced using a polymer reaction after polymerization of fine particle polymers.

In a case where a cross-linkable group is introduced to a polymer at the time of polymerization of a fine particle polymer, it is preferable that a monomer having a cross-linkable group may be subjected to an emulsion polymerization or suspension polymerization. Specific examples of the monomer having a cross-linkable group include allyl methacrylate, allyl acrylate, vinyl methacrylate, vinyl acrylate, glycidyl methacrylate, glycidyl acrylate, 2-isocyanate ethyl methacrylate or block isocyanate resulting from alcohol thereof, 2-isocyanate ethyl acrylate or block isocyanate resulting from alcohol thereof, 2-aminoethyl methacrylate, 2-aminoethyl acrylate, 2-hydroxyethyl methacrylate, 2-hydroxyethyl acrylate, acrylic acid, methacrylic acid, maleic anhydride, bifunctional acrylate, and bifunctional methacrylate.

Examples of the polymer reaction used in a case where a cross-linkable group is introduced after polymerization of fine particle polymer include polymer reactions described in WO96/34316A.

Fine particle polymers may react with each other through a cross-linkable group or the thermoplastic fine particle polymer may react with a polymer compound or a low-molecular weight compound added to the image recording layer.

The content of the thermoplastic fine particle polymer is preferably in a range of 50% to 95% by mass, more preferably in a range of 60% to 90% by mass, and particularly preferably in a range of 70% to 85% by mass with respect to the solid content of the image recording layer.

<Other Components>

The image recording layer C may contain other components as necessary.

<Surfactant Having Polyoxyalkylene Group or Hydroxyl Group>

As a surfactant having a polyoxyalkylene group (hereinafter, also referred to as a POA group) or a hydroxyl group, a surfactant having a POA group or a hydroxyl group may be suitably used, but an anionic surfactant or a non-ionic surfactant is preferable. Among anionic surfactants or non-ionic surfactants having a POA group or a hydroxyl group, anionic surfactants or non-ionic surfactants having a POA group are preferable.

As the POA group, a polyoxyethylene group, a polyoxypropylene group, or a polyoxybutylene group is preferable and a polyoxyethylene group is particularly preferable.

The average degree of polymerization of an oxyalkylene group is practically in a range of 2 to 50 and preferably in a range of 2 to 20.

The number of hydroxyl groups is practically 1 to 10 and preferably in a range of 2 to 8. Here, the number of terminal hydroxyl groups in the oxyalkylene group is not included in the number of hydroxyl groups.

(Anionic Surfactant Having POA Group or Hydroxyl Group)

The anionic surfactant having a POA group is not particularly limited, and examples thereof include polyoxyalkylene alkyl ether carboxylates, polyoxyalkylene alkyl sulfosuccinates, polyoxyalkylene alkyl ether sulfuric acid ester salts, alkyl phenoxy polyoxyalkylene propyl sulfonates, polyoxyalkylene alkyl sulfophenyl ethers, polyoxyalkylene aryl ether sulfuric acid ester salts, polyoxyalkylene polycyclic phenylether sulfuric acid ester salts, polyoxyalkylene styryl phenyl ether sulfuric acid ester salts, polyoxyalkylene alkyl ether phosphoric acid ester salts, polyoxyalkylene alkyl phenyl ether phosphoric acid ester salts, and polyoxyalkylene perfluoroalkyl ether phosphoric acid ester salts.

The anionic surfactant having a hydroxyl group is not particularly limited, and examples thereof include hydroxy carboxylates, hydroxy alkyl ether carboxylates, hydroxy alkane sulfonates, fatty acid monoglyceride sulfuric acid ester salts, and fatty acid monoglyceride acid ester salts.

The content of the surfactant having a POA group or a hydroxyl group is preferably in a range of 0.05% to 15% by mass and more preferably in a range of 0.1% to 10% by mass with respect to the solid content of the image recording layer.

Hereinafter, specific examples of the surfactant having a POA group or a hydroxyl group will be described, but the present invention is not limited thereto. A surfactant A-12 described below is a trade name of Zonyl FSP and available from Dupont. Further, a surfactant N-11 described below is a trade name of Zonyl FSO 100 and available from Dupont.

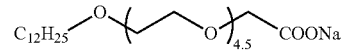

A-1

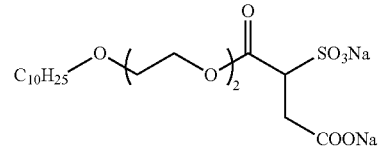

A-2

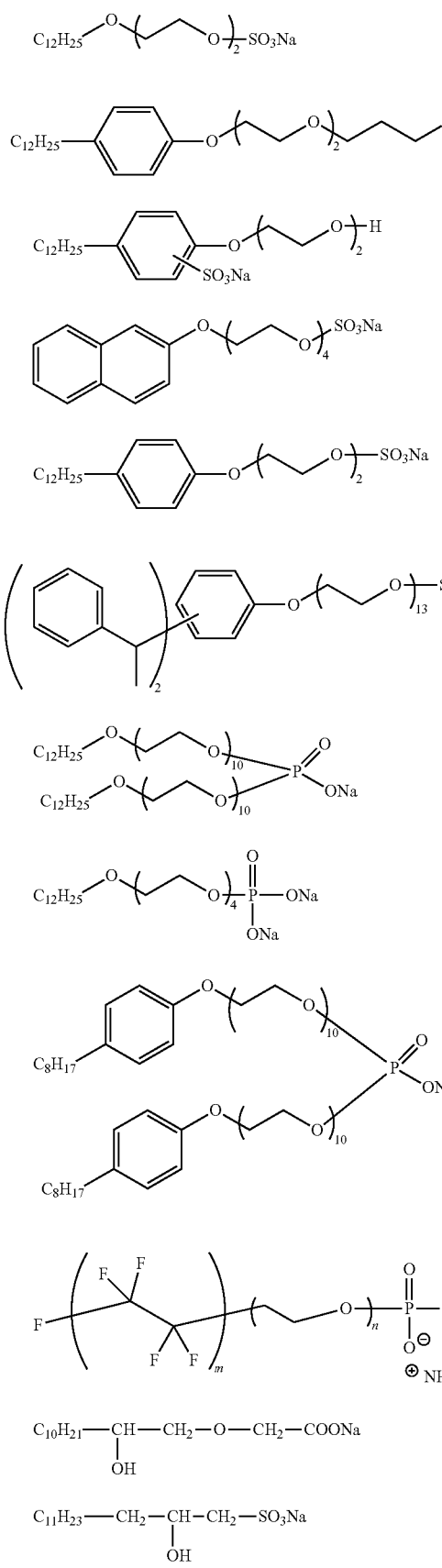
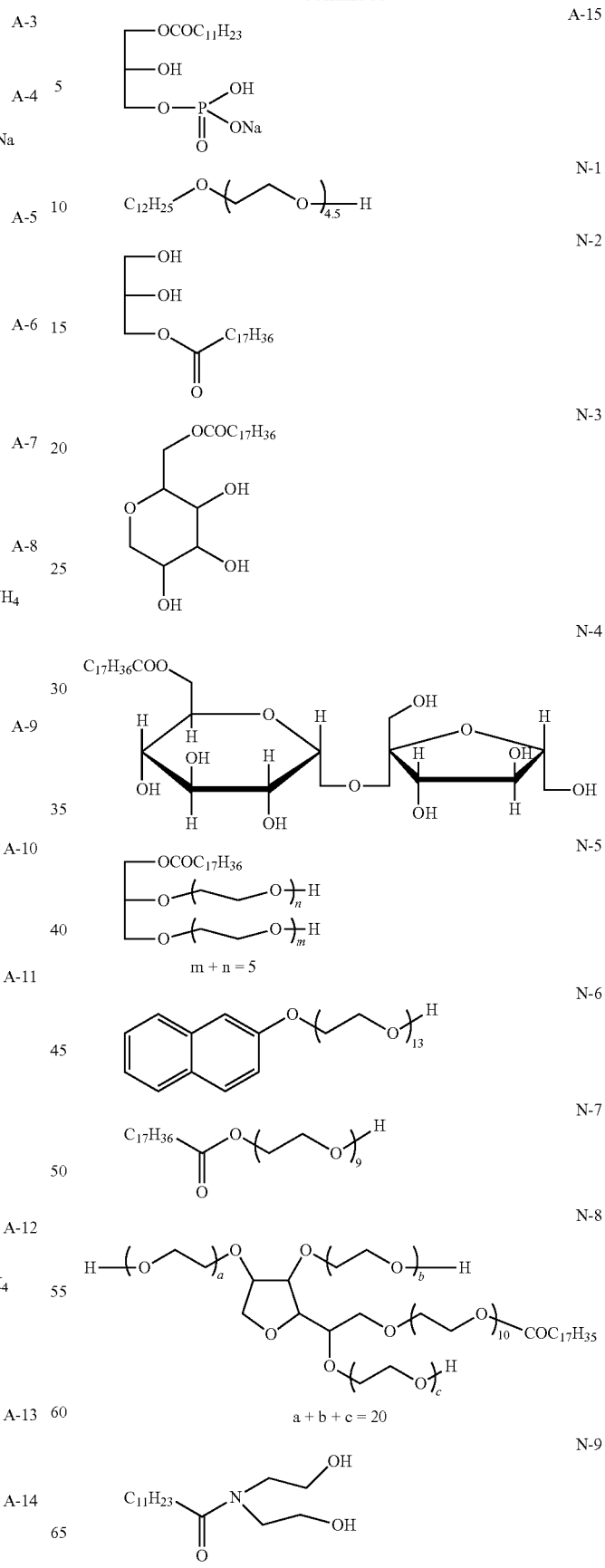

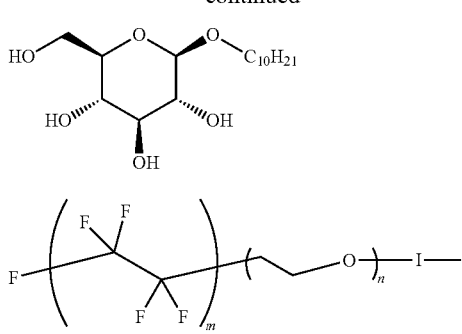

N-10

N-11

For the purpose of ensuring coating uniformity of die image recording layer, the image recording layer may contain an anionic surfactant that does not have a polyoxyalkylene group or a hydroxyl group.

The anion surfactant is not particularly limited as long as the above-described purpose is achieved. Among the examples of the anionic surfactants, alkyl benzene sulfonic acid or a salt thereof, alkyl naphthalene sulfonic acid or a salt thereof, (di)alkyl diphenyl ether (di)sulfonic acid or a salt thereof, or alkyl sulfuric acid ester salt is preferable.

The addition amount of the anionic surfactant that does not have a polyoxyalkylene group or a hydroxyl group is preferably in a range of 1% to 50% by mass and more preferably in a range of 1% to 30% by mass with respect to the surfactant which has a polyoxyalkylene group or a hydroxyl group.

Hereinafter, specific examples of the anionic surfactant that does not have a polyoxyalkylene group or a hydroxyl group will be described, but the present invention is not limited thereto.

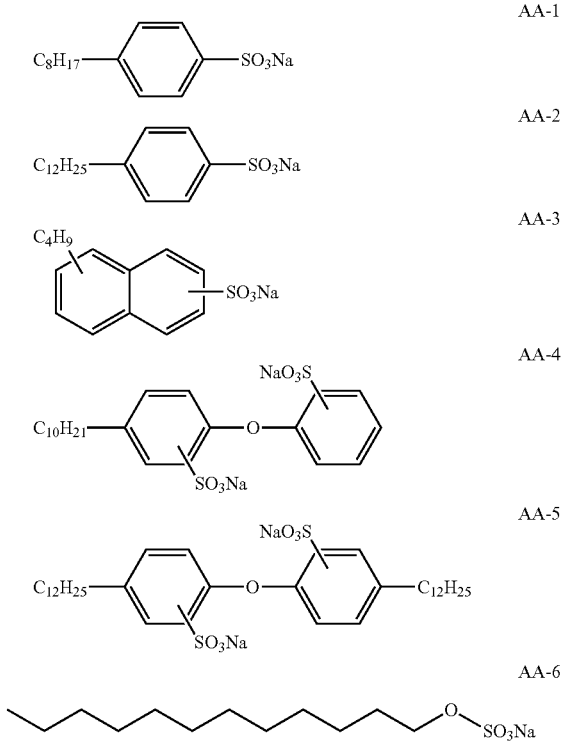

Further, for the purpose of coating uniformity of the image recording layer, a non-ionic surfactant that does not have a polyoxyalkylene group or a hydroxyl group or a fluorine surfactant may be used. For example, fluorine surfactants described in JP1987-170950A (JP-S62-170950A) are preferably used.

The image recording layer may contain a hydrophilic resin. Preferred examples of the hydrophilic resin include resins having hydrophilic groups such as a hydroxyl group, a hydroxyethyl group, a hydroxypropyl group, an amino group, an aminoethyl group, an aminopropyl group, a carboxyl group, a carboxylate group, a sulfo group, a sulfonate group, and a phosphoric acid group.

Specific examples of the hydrophilic resin include gum Arabic, casein, gelatin, a starch derivative, carboxy methyl cellulose and sodium salt thereof, cellulose acetate, sodium alginate, vinyl acetate-maleic acid copolymers, styrene-maleic acid copolymers, polyacrylic acids and salts of these, polymethacrylic acids and salts of these, a homopolymer and a copolymer of hydroxy ethyl methacrylate, a homopolymer and a copolymer of hydroxy ethyl acrylate, a homopolymer and a copolymer of hydroxy propyl methacrylate, a homopolymer and a copolymer of hydroxy propyl acrylate, a homopolymer and a copolymer of hydroxy butyl methacrylate, a homopolymer and a copolymer of hydroxy butyl acrylate, polyethylene glycols, hydroxy propylene polymers, polyvinyl alcohols, hydrolyzed polyvinyl acetate having a degree of hydrolysis of at least 60% and preferably at least 80%, polyvinyl formal, polyvinyl butyral, polyvinyl pyrrolidone, a homopolymer and a copolymer of acrylamide, a homopolymer and a copolymer of methacrylamide, and a homopolymer and a copolymer of N-methylol acrylamide.

The molecular weight of the hydrophilic resin is preferably 2,000 or greater. When the molecular weight thereof is less than 2,000, film-coated strength or printing durability is not sufficiently obtained, which is not preferable.

The content of the hydrophilic resin is preferably in a range of 0.5% to 50% by mass and more preferably in a range of 1% to 30% by mass with respect to the solid content of the image recording layer.

The image recording layer may contain inorganic fine particles. Preferred examples of the inorganic fine particles include silica, alumina, magnesium oxide, titanium oxide, magnesium carbonate, calcium alginate, and a mixture of these. The inorganic fine particles can be used for the purpose of improving coated-film strength.

The average particle diameter of the inorganic fine particles is preferably in a range of 5 nm to 10 μm and more preferably in a range of 10 nm to 1 μm. When the average particle diameter thereof is in the above described range, the thermoplastic fine particle polymer is stably dispersed, the film strength of the image recording layer is sufficiently held, and a non-image portion with excellent hydrophilicity in which printing stain is unlikely to occur can be formed.

The inorganic fine particle are available as commercial products such as a colloidal silica dispersoid and the like.

The content of the inorganic fine particles is preferably in a range of 1.0% to 70% by mass and more preferably in a range of 5.0% to 50% by mass with respect to the solid content of the image recording layer.

The image recording layer may contain a plasticizer in order to provide flexibility for a coated film. Examples of the plasticizer include polyethylene glycol, tributyl citrate, diethyl phthalate, dibutyl phthalate, dihexyl phthalate, dioctyl phthalate, tricresyl phosphate, tributyl phosphate, trioctyl phosphate, and tetrahydrofurfuryl oleate.

The content of the plasticizer is preferably in a range of 0.1% to 50% by mass and more preferably in a range of 1% to 30% by mass with respect to the solid content of the image recording layer.

In a case where a fine particle polymer having a thermally reactive functional group (cross-linkable group) is used for the image recording layer, a compound that starts or promotes a reaction of the thermally reactive functional group (cross-linkable group) can be added to the image recording layer as necessary. As the compound that starts or promotes a reaction of the thermally reactive functional group, a compound that generates a radical or a cation by heating may be exemplified. Examples of the compound include a lophine dimer, a trihalomethyl compound, a peroxide, an azo compound, onium salts including diazonium salts and diphenyl iodonium salts, acyl phosphine, and imide sulfonate. The amount of the compound to be added to the image recording layer is preferably in a range of 1% to 20% by mass and more preferably in a range of 1% to 10% by mass with respect to the solid content of the image recording layer. When the amount thereof is in the above-described range, on-press developability is not degraded and excellent effects for starting or promoting a reaction are obtained.

<Formation of Image Recording Layer C>

The image recording layer C is formed by dissolving or dispersing each of the above-described required components in a suitable solvent to prepare a coating solution, coating a support with the coating solution directly or through an undercoat layer. As the solvent, water or a mixed solvent of water and an organic solvent is used, and a mixed solvent of water and an organic solvent is preferable from the viewpoint of the excellent surface state after coating. Since the amount of the organic solvent varies depending on the type of organic solvent, the amount thereof cannot be specified unconditionally, but the amount of the organic solvent in the mixed solvent is preferably in a range of 5% to 50% by volume. Here, it is necessary that the amount of the organic solvent to be used is set such that the thermoplastic fine particle polymers are not aggregated. The concentration of solid contents of the image recording layer coating solution is preferably in a range of 1% to 50% by mass. As the organic solvent used as a solvent of the coating solution, a water-soluble organic solvent is preferable. Specific examples thereof include an alcohol solvent such as methanol, ethanol, propanol, isopropanol, or 1-methoxy-2-propanol, a ketone solvent such as acetone or methyl ethyl ketone, a glycol ether solvent such as ethylene glycol dimethyl ether, γ-butyrolactone, N,N-dimethylformamide, N,N-dimethylacetamide, tetrahydrofuran, and dimethylsulfoxide. Particularly, an organic solvent having a boiling point of 120° C. or lower and a solubility (amount of a solvent to be dissolved in 100 g of water) of 10 g or greater in water is preferable and an organic solvent having a solubility of 20 g or greater is more preferable.

As a coating method of the image recording layer coating solution, various methods can be used. Examples of the methods include a bar coater coating method, a rotary coating method, a spray coating method, a curtain coating method, a dip coating method, an air knife coating method, a blade coating method, and a roll coating method. The coating amount (solid content) of the image recording layer on the support obtained after the coating and the drying varies depending on the purpose thereof, but is preferably in a range of 0.5 to 5.0 g/m² and more preferably in a range of 0.5 to 2.0 g/m.

Hereinafter, other constituent elements of the planographic printing plate precursor will be described.

[Undercoat Layer]

The planographic printing plate precursor may be provided with an undercoat layer between the image recording layer and the support as necessary. Since bonding of the support to the image recording layer becomes stronger in an exposed portion and the support is easily separated from the image recording layer in an unexposed portion, the undercoat layer contributes to improvement of the on-press developability without degrading the printing durability. Further, in a case of infrared layer exposure, the undercoat layer functions as a heat insulating layer so that a degradation in sensitivity due to heat, generated by exposure, being diffused in the support is prevented.

Examples of eth compound used for the undercoat layer include a silane coupling agent having an ethylenic double bond reaction group, which can be added and polymerized, described in JP1998-282679A (JP-H10-282679A); and a phosphorous compound having an ethylenic double bond reaction group described in JP1990-304441A (JP-H02-304441A). Preferred examples thereof include polymer compounds having an adsorptive group which can be adsorbed to the surface of the support, a hydrophilic group, and a cross-linkable group, as described in JP2005-125749A and JP2006-188038A. As such a polymer compound, a copolymer of a monomer having an adsorptive group, a monomer having a hydrophilic group, and a monomer having a cross-linkable group is preferable. Specific examples thereof include a copolymer of a monomer having an adsorptive group such as a phenolic hydroxyl group, a carboxyl group, $-PO_3H_2$, $-OPO_3H_2$, $-CONHSO_2-$, $-SO_2NHSO_2-$, or $-COCH_2COCH_3$, a monomer having a hydrophilic group such as a sulfo group, and a monomer having a polymerizable cross-linkable group such as a methacryl group or an allyl group. The polymer compound may include a cross-linkable group introduced by forming salts between a polar substituent of the polymer compound and a compound that includes a substituent having the opposite charge and an ethylenic unsaturated bond. Further, monomers other than the monomers described above, preferably hydrophilic monomers may be further copolymerized.

The content of the unsaturated double bond in the polymer compound for an undercoat layer is preferably in a range of 0.1 to 10.0 mmol and more preferably in a range of 2.0 to 5.5 mmol with respect to 1 g of the polymer compound.

The mass average molar mass of the polymer compound for an undercoat layer is preferably 5,000 or greater and more preferably in a range of 10.000 to 300,000.

For the purpose of preventing stain over time, the undercoat layer may contain a chelating agent, a secondary or tertiary amine, a polymerization inhibitor, an amino group, a compound that includes an amino group or a functional group having polymerization inhibiting ability and a group interacting with the surface of an aluminum support, and the like (for example, 1,4-diazabicyclo[2,2,2]octane (DABCO), 2,3,5,6-tetrahydroxy-p-quinone, chloranil, sulfophthalic acid, hydroxyethyl ethylene diamine triacetic acid, dihydroxyethyl ethylene diamine diacetic acid, or hydroxyethyl imino diacetic acid) in addition to the compounds for an undercoat layer described above.

The undercoat layer is applied according to a known method. The coating amount (solid content) of the undercoat layer is preferably in a range of 0.1 to 100 mg/m² and more preferably in a range of 1 to 30 mg/m².

[Support]

A known support is used as the support of the planographic printing plate precursor. Among examples of the known support, an aluminum plate subjected to a roughening treatment and an anodizing treatment using a known method is preferable.

The aluminum plate can be subjected to a treatment appropriately selected from an expansion treatment or a sealing treatment of micropores of an anodized film described in JP2001-253181A or JP2001-322365A or a surface hydrophilization treatment using alkali metal silicate described in U.S. Pat. No. 2,714,066A, U.S. Pat. No. 3,181,461A, U.S. Pat. No. 3,280,734A, and U.S. Pat. No. 3,902,734A or polyvinyl phosphonic acid described in U.S. Pat. No. 3,276,868A, U.S. Pat. No. 4,153,461A, and U.S. Pat. No. 4,689,272A as necessary.

The center line average roughness of the support is preferably in a range of 0.10 to 1.2 μm.

The rear surface of the support may be provided with an organic polymer compound described in JP1993-45885A (JP-H05-45885A) and a back coat layer containing an alkoxy compound of silicon described in JP1994-35174A (JP-H06-35174A) as necessary.

[Protective Layer]

A protective layer may be provided on the image recording layer of the planographic printing plate as necessary. The protective layer has a function of suppressing a reaction of inhibiting image formation through oxygen blocking, a function of preventing generation of damage to the image recording layer, and a function of preventing ablation at the time of high illuminance laser exposure.

Such a protective layer having the above-described functions is described in U.S. Pat. No. 3,458,311A and JP1980-49729B (JP-S55-49729B). As a polymer with low oxygen permeability which is used for a protective layer, any of a water-soluble polymer and a water-insoluble polymer is suitably selected and then used and two or more kinds thereof can be used in combination as necessary. Specific examples thereof include polyvinyl alcohol, modified polyvinyl alcohol, polyvinyl pyrrolidone, a water-soluble cellulose derivative, and poly(meth)acrylonitrile.

As the modified polyvinyl alcohol, acid-modified polyvinyl alcohol having a carboxyl group or a sulfo group is preferably used. Specifically, modified polyvinyl alcohol described in JP2005-250216A and JP2006-259137A is preferable.

Since the protective layer improves oxygen-blocking properties, it is preferable that the protective layer contains an inorganic layered compound such as natural mica or synthetic mica described in JP2005-119273A.

It is preferable that the protective layer contains polysaccharides. Examples of the polysaccharides include starch derivatives (such as dextrin, enzymatically decomposed dextrin, hydroxypropylated starch, carboxymethylated starch, phosphoric acid esterified starch, polyoxyalkylene grafted starch, and cyclodextrin); celluloses (such as carboxymethyl cellulose, carboxyethyl cellulose, methyl cellulose, hydroxypropyl cellulose, and methylpropyl cellulose); carrageenan, alginic acid, guar gum, locust bean gum, xanthan gum, gum Arabic, and soybean polysaccharides.

Among these, starch derivatives such as dextrin and polyoxyalkylene grafted starch, gum arabic, carboxymethyl cellulose, and soybean polysaccharides are preferably used.

The content of polysaccharides is preferably in a range of 1% to 20% by mass with respect to the solid content of the protective layer.

Further, the protective layer may contain known additives such as a plasticizer for providing flexibility, a surfactant for improving coating properties, and inorganic fine particles for controlling slipperiness of the surface. Further, the protective layer may contain the oil sensitizing agent described in the section of the image recording layer.

The protective layer is applied according to a known method. The coating amount of the protective layer after the drying is preferably in a range of 0.01 to 10 $g/m^2$, more preferably in a range of 0.02 to 3 $g/m^2$, and particularly preferably in a range of 0.02 to 1 $g/m^2$.

[Method of Producing Planographic Printing Plate Precursor]

As described above, the end portion regions of the planographic printing plate precursor of the present invention contain fine particles with a higher content than those of other regions. The method of producing a planographic printing plate precursor is not particularly limited as long as a planographic printing plate precursor having such a configuration is obtained. Hereinafter, the method of producing a planographic printing plate precursor according to the present invention will be described.

Fine particle can be introduced to the end portion regions of the planographic printing plate precursor by applying a coating solution containing the fine particles to the end portion regions of the planographic printing plate precursor during the step of producing the planographic printing plate precursor. The coating solution containing fine particles may be applied to the end portion regions of the planographic printing plate precursor at any timing of the step of producing the planographic printing plate precursor, and it is preferable that the coating solution is applied thereto before and after the step of forming each configuration layer, that is, before the coating of the lowermost layer (for example, the undercoat layer) to after the drying of the uppermost layer (for example, the protective layer). The planographic printing plate precursor may be cut before or after the coating solution containing fine particles is applied to the end portion regions of the planographic printing plate precursor.

In other words, in the step of forming each configuration layer of the planographic printing plate, the planographic printing plate precursor may be cut such that the end portion regions of the planographic printing plate precursor are formed after the coating solution containing fine particles is applied to positions corresponding to the end portion regions of the planographic printing plate precursor. Alternatively, the coating solution containing fine particles may be applied to the end portion regions of the planographic printing plate precursor after the planographic printing plate precursor produced by performing the step of forming each configuration layer of the planographic printing plate precursor is cut. Here, the positions corresponding to the end portion regions indicate positions in which regions on the plate surface on the image recording layer side from the end portion to a portion inside the end portion by 5 mm of the cut planographic printing plate precursor can be formed. Accordingly, the positions corresponding to the end portion regions may be positions in the vicinity of the ends of the planographic printing plate precursor or positions in the vicinity of the center of the planographic printing plate precursor in the step of producing the planographic printing plate precursor. In a case where the positions are positions in the vicinity of the center of the planographic printing plate precursor, two sheets of planographic printing plate precursors having end portion regions are obtained by cutting the planographic printing plate precursor such that the end portion regions are formed along the region coated with fine particles.

As an embodiment in which the planographic printing plate precursor is cut such that the end portion regions thereof are formed after the coating solution containing fine particles is applied to the positions corresponding to the end portion regions of the planographic printing plate precursor in the step of forming each configuration layer of the planographic printing plate precursor, for example, the following method may be preferably exemplified.

In a planographic printing plate precursor including a support and an image recording layer formed on the support, a method of producing a planographic printing plate precursor of performing (a) an image recording layer forming step of forming the image recording layer; (b) a coating step of coating a part of a region of the image recording layer which is formed by the step a with a coating solution containing the fine particles such that the coating solution and the region overlap each other; and (c) a cutting step of cutting the region coated with the coating solution to be in a range on the plate surface on the image recording layer side from the end portion of the cut planographic printing plate precursor to a portion inside the end portion by 5 mm, in order of the step a, the step b, and then the step c or in order of the step b, the step a, and then the step c, on the support, is exemplified.

Further, (e) a protective layer forming step of forming a protective layer may be performed on the image recording layer after the step a and before the step c.

In a planographic printing plate precursor including a support, an undercoat layer, and an image recording layer formed on the support in this order, a method of producing a planographic printing plate precursor of performing (a) an image recording layer forming step of forming the image recording layer; (b) a coating step of coating a part of a region of the image recording layer which is formed by the step a with a coating solution containing the fine particles such that the coating solution and the region overlap each other; (c) a cutting step of cutting the region coated with the coating solution to be in a range on the plate surface on the image recording layer side from the end portion of the cut planographic printing plate precursor to a portion inside the end portion by 5 mm; and (d) an undercoat layer forming step of forming the undercoat layer, in order of the step b, the step d, the step a, and then the step c, in order of the step d, the step b, the step a, and then the step c, or in order of the step d, the step a, the step b, and then the step c, on the support, is exemplified.

In a planographic printing plate precursor including a support, an undercoat layer, an image recording layer, and a protective layer formed on the support in this order, a method of producing a planographic printing plate precursor of performing (a) an image recording layer forming step of forming the image recording layer; (b) a coating step of coating a part of a region of the image recording layer which is formed by the step a with a coating solution containing the fine particles such that the coating solution and the region overlap each other; (c) a cutting step of cutting the region coated with the coating solution to be in a range on the plate surface on the image recording layer side from the end portion of the cut planographic printing plate precursor to a portion inside the end portion by 5 mm; (d) an undercoat layer forming step of forming the undercoat layer; and (e) a protective layer forming step of forming a protective layer, in order of the step b, the step d, the step a, the step e, and then the step c, in order of the step d, the step b, the step a, the step e, and then the step c, in order of the step d, the step a, the step b, the step e, and then the step c, or in order of the step d, the step a, the step e, the step b, and then the step c, on the support, is exemplified.

As an embodiment in which the coating solution containing fine particles is applied to the end portion regions of the planographic printing plate precursor after the planographic printing plate precursor produced by performing a step of forming each configuration layer of the planographic printing plate precursor is cut, for example, the following method may be preferably exemplified.

In a planographic printing plate precursor including a support and an image recording layer formed on the support, a method of producing a planographic printing plate precursor of performing (a) an image recording layer forming step of forming the image recording layer; and (f) a coating step of coating a region, from the end portion of the planographic printing plate precursor to a portion inside the end portion by 5 mm, with a coating solution containing the fine particles, in order of the step a and the step f on the support, is exemplified.

Further, (e) a protective layer forming step of forming a protective layer may be performed on the image recording layer after the step a and before the step f.

In a planographic printing plate precursor including a support, an undercoat layer, and an image recording layer formed on the support in this order, a method of producing a planographic printing plate precursor of performing (a) an image recording layer forming step of forming the image recording layer; (f) a coating step of coating a region, from the end portion of the planographic printing plate precursor to a portion inside the end portion by 5 mm, with a coating solution containing the fine particles; and (d) an undercoat layer forming step of forming the undercoat layer, in order of the step d, the step a, and the step f on the support is exemplified.

In a planographic printing plate precursor including a support, an undercoat layer, an image recording layer, and a protective layer formed on the support in this order, a method of producing a planographic printing plate precursor of performing (a) an image recording layer forming step of forming the image recording layer; (f) a coating step of coating a region, from the end portion of the planographic printing plate precursor to a portion inside the end portion by 5 mm, with a coating solution containing the fine particles; (d) an undercoat layer forming step of forming the undercoat layer; and (e) a protective layer forming step of forming a protective layer, in order of the step d, the step a, the step e, and the step f on the support is exemplified.

The step of forming the configuration layer includes at least a step of coating the configuration layer. A step of drying the coated layer after coating the configuration layer is not necessarily required for the step of forming the configuration layer. For example, the support is coated with an undercoat layer and then coated with a coating solution containing fine particles without drying the coated layer. In this case, it is considered that the fine particles are present not only on the undercoat layer and but also in the undercoat layer.

[Fine Particle-Containing Coating Solution]

The fine particle-containing coating solution contains the fine particles described above. The fine particle-containing coating solution is in the form of an aqueous dispersion liquid in which fine particles are dispersed in a medium mainly formed of water.

It is preferable that the fine particle-containing coating solution contains the above-described hydrophilic compound.

The content of the hydrophilic compound in the fine particle-containing coating solution is preferably in a range of 0.03/to 20.0% by mass and more preferably in a range of 0.05% to 10% by mass with respect to the total mass of the fine particle-containing coating solution.

It is preferable that the fine particle-containing coating solution further contains a water-soluble resin. Similar to the above-described hydrophilic compound, the water-soluble resin has an effect of hydrophilizing cracks which can be generated at the time when a sagging shape described below is formed and preventing stain generated due to accumulation of printing ink in the cracks. Examples of the water-soluble resin include water-soluble resins classified as polysaccharides, polyvinyl alcohol, polyvinyl pyrrolidone, polyacrylamide, and a copolymer of these, a vinyl methyl ether-maleic anhydride copolymer, a vinyl acetic acid-maleic anhydride copolymer, and a styrene-maleic anhydride copolymer.

Examples of the polysaccharides include starch derivatives (such as dextrin, enzymatically decomposed dextrin, hydroxypropylated starch, carboxymethylated starch, phosphoric acid esterified starch, polyoxyalkylene grafted starch, and cyclodextrin); celluloses (such as carboxymethyl cellulose, carboxyethyl cellulose, methyl cellulose, hydroxypropyl cellulose, and methylpropyl cellulose); carrageenan, alginic acid, guar gum, locust bean gum, xanthan gum, gum Arabic, and soybean polysaccharides.

Among the water-soluble resins, starch derivatives such as dextrin and polyoxyalkylene grafted starch, gum Arabic, carboxymethyl cellulose, and soybean polysaccharides are preferably used.

The water-soluble resin may be used in combination of two or more kinds thereof. The content of the water-soluble resin is preferably in a range of 0.5% to 30% by mass and more preferably in a range of 1% to 10% by mass with respect to the total mass of the fine particle-containing coating solution. When the content thereof is in the above-described range, the effects of the water-soluble resin are achieved satisfactorily.

The fine particle-containing coating solution may further contain a surfactant, an organic solvent, a plasticizer, and other additives.

(Surfactant)

Examples of the surfactant used for the fine particle-containing coating solution include anionic surfactants, non-ionic surfactants, cationic surfactants, and amphoteric surfactants. Among these, anionic surfactants and non-ionic surfactants are preferable. the surfactant has effects of improving dispersion stability of fine particles and preventing aggregation and precipitation of fine particles.

Examples of the anionic surfactants include fatty acid salts, abietates, hydroxy alkane sulfonates, alkane sulfonates, dialkyl sulfosuccinates, benzene sulfonates, linear alkyl benzene sulfonates, branched alkyl benzene sulfonates, naphthalene sulfonates, alkyl naphthalene sulfonates, alkyl phenoxy polyoxyethylene propyl sulfonates, polyoxyethylene aryl ether sulfuric acid ester salts, polyoxyethylene alkyl sulfophenyl ether salts, N-methyl-N-oleyl sodium taurines, N-alkyl sulfosuccinic acid monoamide disodium salts, petroleum sulfonic acid salts, sulfated castor oil, sulfated beef tallow oil, sulfuric acid ester salts of fatty acid alkyl ester, alkyl sulfuric acid ester salts, polyoxyethylene alkyl ether sulfuric acid ester salts, fatty acid monoglyceride sulfuric acid ester salts, polyoxyethylene alkyl phenyl ether sulfuric acid ester salts, polyoxyethylene styryl phenyl ether sulfuric acid ester salts, alkyl phosphoric acid ester salts, polyoxyethylene alkyl ether phosphoric acid ester salts, polyoxyethylene alkyl phenyl ether phosphoric acid ester salts, partially saponified products of a styrene-maleic anhydride copolymer, partially saponified products of an olefin-maleic anhydride copolymer, and naphthalene sulfonate formalin condensates.

Among the above-described anionic surfactants, dialkyl sulfosuccinates, alkyl sulfonic acid ester salts, polyoxyethylene aryl ether sulfonic acid ester salts, and alkyl naphthalene sulfonates are preferable.

Specifically, anionic surfactants represented by the following Formula (I-A) or (I-B) may be exemplified.

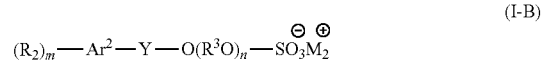

In Formula (I-A), $R^1$ represents a linear or branched alkyl group having 1 to 20 carbon atoms; p represents 0, 1, or 2; $Ar^1$ represents an aryl group having 6 to 10 carbon atoms; q represents 1, 2, or 3; and $M_1^+$ represents $Na^+$, $K^+$, $Li^+$, or $NH_4^+$. When p represents 2, a plurality of $R^1$'s may be the same as or different from each other.

In Formula (I-B), $R^2$ represents a linear or branched alkyl group having 1 to 20 carbon atoms; m represents 0, 1, or 2; $Ar^2$ represents an aryl group having 6 to 10 carbon atoms; Y represents a single bond or an alkylene group having 1 to 10 carbon atoms; $R^3$ represents a linear or branched alkylene group having 1 to 5 carbon atoms; n represents an integer of 1 to 100; and $M_2^+$ represents $Na^+$, $K^+$, $Li^+$, or $NH_4^+$. When m represents 2, a plurality of $R^2$'s may be the same as or different from each other. When n represents 2 or greater, a plurality of $R^3$'s may be the same as or different from each other.

In Formulae (I-A) and (I-B), preferred examples of $R^1$ and $R^2$ include $CH_3$, $C_2H_5$, $C_3H_7$, and $C_4H_9$. Further, preferred examples of $R^3$ include $-CH_2-$, $-CH_2CH_2-$, $-CH_2CH_2CH_2-$, and $-CH_2CH(CH_3)-$. Among these, $-CH_2CH_2-$ is more preferable. Moreover, it is preferable that p and m represent 0 or 1 and particularly preferable that p represents 0. It is preferable that Y represents a single bond. Further, it is preferable that n represents an integer of 1 to 20. Specific examples of the anionic surfactants represented by Formula (I-A) or (I-B) include the following compounds.

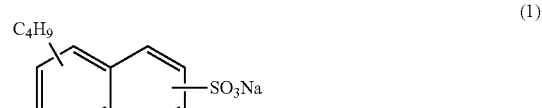

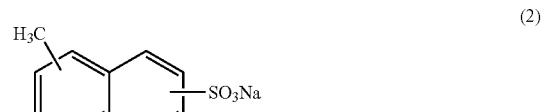

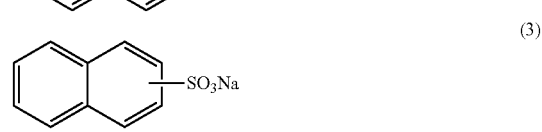

-continued (4) 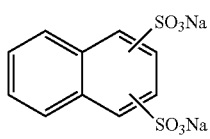

(5) 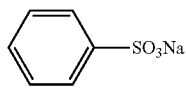

(6) 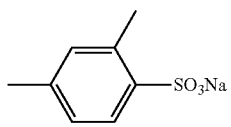

(7) 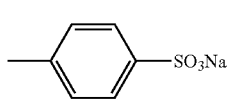

(8) 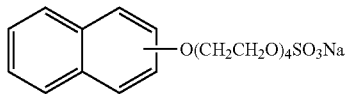

(9) 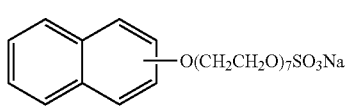

(10) 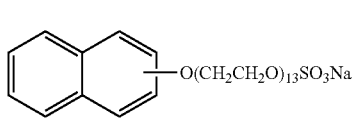

(11) 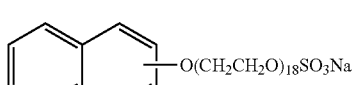

(12) 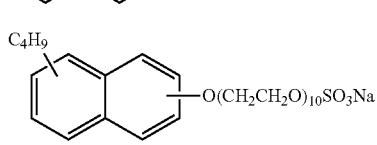

(13) 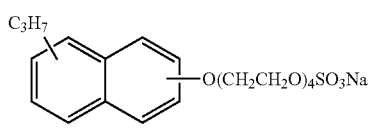

(14) 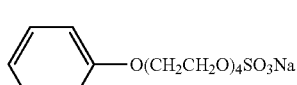

(15) 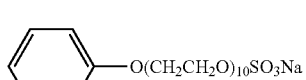

(16) 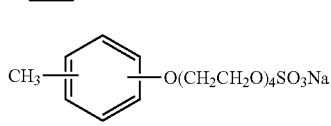

(17) 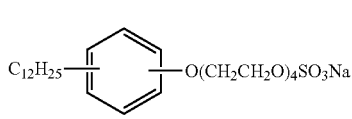

Examples of the non-ionic surfactants include polyoxyethylene alkyl ethers, polyoxyethylene aryl ethers, polyoxyethylene alkyl esters, glycerin fatty acid partial esters, sorbitan fatty acid partial esters, pentaerythritol fatty acid partial esters, propylene glycol mono-fatty acid ester, sucrose fatty acid partial ester, polyoxyethylene sorbitan fatty acid partial esters, polyoxyethylene sorbitol fatty acid partial esters, polyethylene glycol fatty acid esters, polyglycerin fatty acid partial esters, polyoxyethylene glycerin fatty acid partial esters, fatty acid diethanol amides, N,N-bis-2-hydroxyalkylamines, polyoxyethylene alkylamine, triethanolamine fatty acid esters, trialkyl amine oxides, and polyoxyethylene-polyoxypropylene block copolymers.

Among the above-described non-ionic surfactants, polyoxyethylene aryl ethers and polyoxyethylene-polyoxypropylene block copolymers are preferable.

Specific preferred examples include non-ionic surfactants represented by the following Formula (II-A).

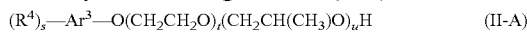    (II-A)

In Formula (II-A), $R^4$ represents a hydrogen atom or an alkyl group having 1 to 20 carbon atoms, s represents 0, 1, or 2, $Ar^3$ represents an aryl group having 6 to 10 carbon atoms, and t and u each independently represent an integer of 0 to 100 and either of t and u does not represent 0. In a case where s represents 2, a plurality of $R^4$'s may be the same as or different from each other.

Examples of the compound represented by Formula (II-A) include polyoxyethylene phenyl ether, polyoxyethylene methyl phenyl ether, polyoxyethylene octyl phenyl ether, polyoxyethylene nonyl phenyl ether, polyoxyethylene naphthyl ether, polyoxyethylene methyl naphthyl ether, polyoxyethylene octyl naphthyl ether, and polyoxyethylene nonyl naphthyl ether.

In the compounds represented by Formula (II-A), the number (t) of repeating units of the polyoxyethylene chain is preferably in a range of 2 to 50 and more preferably in a range of 4 to 30. The number (u) of repeating units of the polyoxypropylene chain is preferably in a range of 0 to 10 and more preferably in a range of 0 to 5. The polyoxyethylene portion and the polyoxypropylene portion may be present randomly or in the form of a block.

Specific examples of the non-ionic surfactant represented by Formula (II-A) are described below. An oxyethylene repeating unit and an oxypropylene repeating unit in the compound "Y-5" exemplified below may be in the form of any of a random bond and block connection.

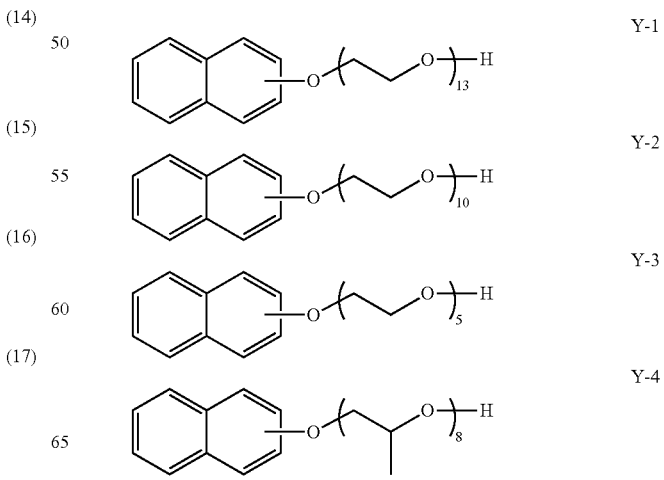

Y-5 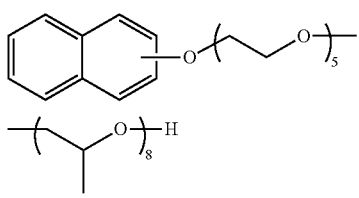

Y-6 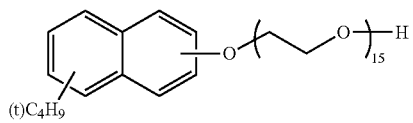

Y-7 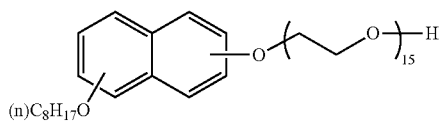

Y-8 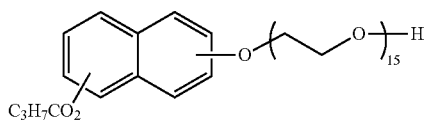

Y-9 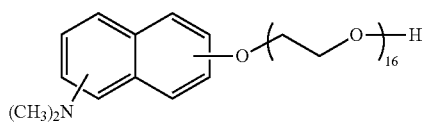

Y-10 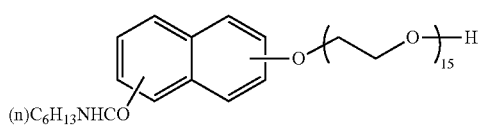

Y-11 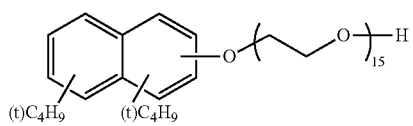

Y-12 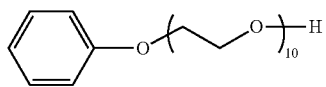

Y-13 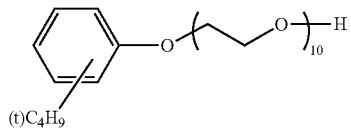

Y-14 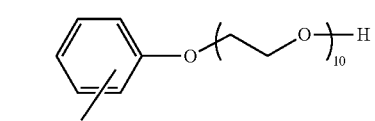

Y-15 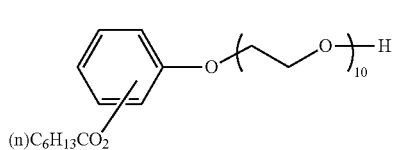

Y-16 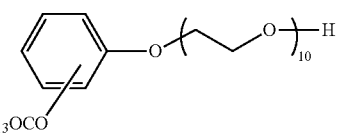

The surfactant may be used in combination of two or more kinds thereof. Examples thereof include a combination of two or more kinds of anionic surfactants different from each other, a combination of two or more kinds of non-ionic surfactants different from each other, and a combination of an anionic surfactant and a non-ionic surfactant.

The content of the surfactant in the fine particle-containing coating solution is preferably in a range of 0.01% to 20% by mass and more preferably in a range of 0.1% to 15% by mass with respect to the total mass of the coating solution.

(Organic Solvent)

An organic solvent may be contained for the purpose of adjusting the solubility of the water-soluble resin and promoting swelling of the image recording layer. Examples of the organic solvent include an alcohol-based solvent, a ketone-based solvent, an ester-based solvent, an amide-based solvent, and a hydrocarbon-based solvent. Among the organic solvents, an alcohol-based solvent and a hydrocarbon-based solvent are preferably used.

The alcohol-based solvent may be monohydric alcohol or polyhydric alcohol. Examples of the monohydric alcohol include methyl alcohol, n-propyl alcohol, iso-propyl alcohol, n-butyl alcohol, tert-butyl alcohol, n-amyl alcohol, diacetone alcohol, 1-methoxy-2-propanol, furfuryl alcohol, 2-octanol, 2-ethylhexanol, nonanol, n-decanol, undecanol, n-dodecanol, trimethyl nonyl alcohol, benzyl alcohol, phenethyl alcohol, ethylene glycol monoisoamyl ether, ethylene glycol monophenyl ether, ethylene glycol monobenzyl ether, and ethylene glycol monohexyl ether.

Examples of the polyhydric alcohol include ethylene glycol, propylene glycol, triethylene glycol, butylene glycol, hexyl glycol, diethylene glycol, dipropylene glycol, and glycerin.

Among these, benzyl alcohol, phenethyl alcohol, furfuryl alcohol, and glycerin are preferable.

Examples of the hydrocarbon-based solvent include an aromatic or aliphatic compound (mineral spirit) of petroleum fractions, and squalane.

The organic solvent may be used in combination of two or more kinds thereof. The content of the organic solvent is preferably in a range of 0.5% to 10% by mass and more preferably in a range of 1% to 5% by mass with respect to the total mass of the fine particle-containing coating solution. When the content thereof is in the above-described range, the effects of the organic solvent are achieved satisfactorily.

(Plasticizer)

Examples of the plasticizer include plasticizers having a freezing point of 15° C. or lower, for example, phthalic acid diesters such as dibutyl phthalate, diheptyl phthalate, di-n-octyl phthalate, di(2-ethylhexyl) phthalate, dinonyl phthalate, didecyl phthalate, dilauryl phthalate, and butyl benzyl phthalate; aliphatic dibasic acid esters such as dioctyl adipate, butyl glycol adipate, dioctyl azelate, dibutyl sebacate, di(2-ethylhexyl) sebacate, and dioctyl sebacate; epoxidized triglycerides such as epoxidized soybean oil; phosphoric acid esters such as tricresyl phosphate, trioctyl phosphate, and trichloroethyl phosphate; and benzoic acid esters such as benzyl benzoate.

The plasticizer may be used in combination of two or more kinds thereof. The content of plasticizer is preferably in a range of 0.5% to 10% by mass and more preferably in a range of 1% to 5% by mass with respect to the total mass of the fine particle-containing coating solution.

(Other Additives)

The fine particle-containing coating solution may contain inorganic salts such as nitrate and sulfate, a preservative, and an anti-foaming agent in addition to the above-described components.

Examples of the inorganic salts include magnesium nitrate, sodium nitrate, potassium nitrate, ammonium nitrate, sodium sulfate, potassium sulfate, ammonium sulfate, sodium hydrogen sulfate, and nickel sulfate.

Examples of the preservative include phenol or a derivative thereof, formalin, an imidazole derivative, sodium dehydroacetate, a 4-isothiazolin-3-one derivative, benzisothiazolin-3-one, a benzotriazole derivative, an amidine guanidine derivative, derivatives of quaternary ammonium salts, pyridine, quinoline, and guanidine, diazine, a triazole derivative, oxazole, an oxazine derivative, and nitro bromo alcohol-based 2-bromo-2-nitropropane-1,3-diol, 1,1-dibromo-1-nitro-2-ethanol, and 1,1-dibromo-1-nitro-2-propanol.

Examples of the anti-foaming agent include a typical silicon-based self-emulsification type non-ionic surfactant, an emulsification type non-ionic surfactant, and a non-ionic surfactant having an HLB of 5 or less.

<Preparation of Fine Particle-Containing Coating Solution>

The fine particle-containing coating solution may be prepared by mixing components such as fine particles and additives used as necessary and dispersing the mixture in the solvent, for example, water (distilled water, ion exchange water, or demineralized water) or may be prepared by preparing a fine particle dispersion liquid obtained by dispersing fine particles in a solvent in advance and then adding other additives to the dispersion liquid to be mixed with each other.

The content of fine particles in the fine particle-containing coating solution is preferably in a range of 0.05% to 50%/o by mass, more preferably in a range of 0.1% to 30% by mass, and particularly preferably in a range of 0.2% to 20% by mass.

The viscosity of the fine particle-containing coating solution at 25° C. is preferably in a range of 0.5 to 1,000 mPa·s and more preferably in a range of 1 to 100 mPa·s. From the viewpoints that bead breakage is unlikely to occur and the coating at the time of starting application is smoothly carried out, it is preferable that the viscosity thereof is in the above-described range.

The surface tension of the fine particle-containing coating solution at 25° C. is preferably in a range of 25 to 70 mN/m and more preferably in a range of 40 to 65 mN/m. From the viewpoints that the coating width is easily controlled and bead breakage is unlikely to occur, it is preferable that the surface tension thereof is in the above-described range.

[Application of Fine Particle-Containing Coating Solution]

As described above, the fine particle-containing coating solution is applied to positions corresponding to the end portion regions in the step of production of the planographic printing plate precursor. The coating width is preferably a region from an end portion or a position corresponding to the end portion to a portion inside the end portion by 5 mm and more preferably a region from an end portion or a position corresponding to the end portion to a portion inside the end portion by 3 mm.

The fine particle-containing coating solution can be applied using known methods such as a die coating method, a dip coating method, an air knife coating method, a curtain coating method, a roller coating method, a wire bar coating method, a gravure coating method, a slide coating method, an ink-jet method, a dispenser method, and a spray method. From the viewpoint of applying the coating solution to a specific position, an ink-jet method or a dispenser method is preferable.

According to the embodiment in which the fine particle-containing coating solution is applied after the planographic printing plate precursor is cut, a coating method of using cloth or a Molton roll impregnated with the fine particle-containing coating solution can be used in addition to the above-described coating methods.

The coating amount of the fine particle-containing coating solution is preferably in a range of 0.01 to 6.0 $g/m^2$, more preferably in a range of 0.03 to 3.0 $g/m^2$, and particularly preferably in a range of 0.05 to 2.0 $g/m^2$ as a solid content after drying.

The fine particle-containing coating solution is applied and then dried. The drying may be performed after the fine particle-containing coating solution is applied or after the planographic printing plate precursor is coated with a coating solution for forming a configuration layer.

The drying may be performed by blowing dry air using an oven. The drying temperature is preferably in a range of 60° C. to 220° C. and more preferably in a range of 80° C. to 180° C.

[Cutting of Planographic Printing Plate Precursor]

The planographic printing plate precursor is cut during the step of production of the planographic printing plate precursor as described above. The cutting may be performed using known cutting methods. Preferred examples thereof include methods described in JP1996-58257A (JP-H08-58257A), JP1997-211843A (JP-H09-211843A), JP1998-100556A (JP-H10-100556A), and JP1999-52579A (JP-H11-52579A).

It is preferable that the end portions of the planographic printing plate precursor have a sagging shape. The planographic printing plate precursor having end portions in a sagging shape has excellent effects of preventing edge stain together with the fine particle-containing end portion regions of the present invention.

FIG. 1 is a view schematically illustrating the cross-sectional shape of a planographic printing plate precursor.

In FIG. 1, a planographic printing plate precursor 1 includes a sagging 2 in the end portion thereof. A distance X between the upper end (boundary point between the sagging 2 and the end surface 1c) of an end surface 1c of the planographic printing plate precursor 1 and the extension line of an image recording layer surface (protective layer surface in a case where a protective layer is formed) 1a is referred to as a "sagging amount" and a distance Y between the starting point of sagging of the image recording layer surface 1a of the planographic printing plate precursor 1 and the extension line of the end surface 1c is referred to as a "sagging width". The sagging amount of the end portion of the planographic printing plate precursor is preferably 35 µm or greater and more preferably 40 µm or greater. From the viewpoint of preventing degradation of on-press developability caused by deterioration in the surface state of the end portion, the upper limit of the sagging amount is preferably 150 µm. When the on-press developability is degraded, ink is adhered to the remaining photosensitive layer and, as the result, edge stain is generated. When the sagging amount is less than 35 µm, the ink adhering to the end portion is easily transferred to a blanket and this may cause edge stain. In a case where the sagging amount is in a range of 35 to 150 µm, when the sagging width is small, cracks are generated in the end portion so that printing ink is accumulated in the cracks, and this leads to generation of edge stain. In order to decrease the generation of cracks, the sagging width is practically in a range of 70 to 300 µm and preferably in a range of 80 to 250 µm. Further, the preferable ranges of the sagging amount and the sagging width are not relevant to the edge shape of a support surface 1b of the planographic printing plate precursor 1.

Similar to the image recording layer surface 1a, the sagging is generated typically in a boundary B between the image recording layer and the support, and the support surface 1b in end portions of the planographic printing plate precursor 1.

An end portion having the sagging can be formed by adjusting the conditions of cutting the planographic printing plate precursor.

Specifically, the end portion can be formed by adjusting a gap between an upper cutting blade and a lower cutting blade in a slitter device used at the time of cutting the planographic printing plate precursor, the amount of biting, the blade tip angle, and the like.

Figure 2:
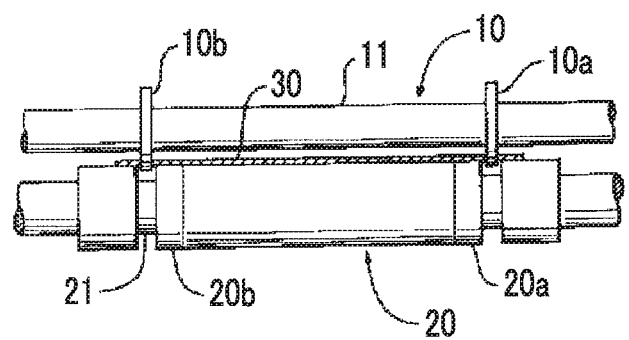
FIG. 2 is a conceptual view illustrating an example of a cutting portion of a slitter device.

For example, FIG. 2 is a cross-sectional view illustrating a cutting portion of a slitter device. A pair of upper and lower cutting blades 10 and 20 are horizontally disposed in the slitter device. The cutting blades 10 and 20 are respectively formed of a round blade on a circular plate and upper cutting blades 10a and 10b are supported by a rotary shaft 11 and lower cutting blades 20a and 20b are supported by a rotary shaft 21 respectively on the same axis. The upper cutting blades 10a and 10b and the lower cutting blades 20a and 20b rotate in opposite directions. A planographic printing plate precursor 30 passes through the space between the upper cutting blades 10a and 10b and the space between the lower cutting blades 20a and 20b and then cut to have a predetermined width. An end portion with the sagging can be formed by adjusting the gap between the upper cutting blade 10a and the lower cutting blade 20a and the gap between the upper cutting blade 10b and the lower cutting blade 20b of the cutting portion of the slitter device.

The plate-making of the planographic printing plate precursor of the present invention will be described below. According to a preferred embodiment, the plate-making of the planographic printing plate precursor of the present invention includes image exposure and on-press development.

[Image Exposure]

The image exposure of the planographic printing plate precursor can be performed in conformity with an image exposure operation for a typical planographic printing plate precursor.

The image exposure is performed by laser exposure through a transparent original picture having a line image, a halftone image, and the like or by laser beam scanning using digital data. The wavelength of a light source is preferably in a range of 700 to 1,400 nm. As the light source having a wavelength of 700 to 1,400 nm, a solid-state laser or a semiconductor laser that radiates infrared rays is preferable. The output of the infrared laser is preferably 100 mW or greater, the exposure time per one pixel is preferably less than 20 microseconds, and the irradiation energy quantity is preferably in a range of 10 to 300 mJ/cm$^2$. For the purpose of reducing the exposure time, it is preferable to use a multi-beam laser device. The exposure mechanism may be any of an internal drum system, an external drum system, and a flat bed system. The image exposure can be performed using a plate setter according to a usual method.

[On-Press Development and Printing]

The on-press development and printing of the planographic printing plate precursor can be performed according to a usual method. In other words, when dampening water and printing ink are supplied to the imagewise-exposed planographic printing plate precursor on a printing press, a printing ink receiving portion having a lipophilic surface is formed by the image recording layer cured by light exposure in the exposed portion of the image recording layer. Meanwhile, in an unexposed portion, a non-cured image recording layer is dissolved or dispersed by supplied dampening water and/or printing ink and then removed, a hydrophilic surface is exposed to the portion. As the result, dampening water is exposed and adheres to the hydrophilic surface, the printing ink is impressed on the image recording layer of the exposed region, and then the printing is started.

Here, either of dampening water or printing ink may be initially supplied to the surface of the planographic printing plate precursor, but it is preferable that dampening water is initially supplied thereto by infiltrating dampening water so that the on-press developability is promoted.

In the plate-making of the planographic printing plate precursor according to the present invention, a plate-making system used for a treatment using a typical developer can be employed. That is, a plate-making system including an exposed portion which performs image exposure on the planographic printing plate precursor using an exposure machine; a developing treatment unit which removes an unexposed portion of the planographic printing plate precursor imagewise-exposed by the exposed portion using an automatic developing machine; and a processing unit which performs processing using a punch vender for mounting the planographic printing plate precursor on the printing press, in this order, can be used.

In a case of on-press development, since the development processing unit is not necessary, the plate-making may be carried out using a system from which the development treatment unit is excluded or may be carried out while the development treatment unit remains. In a case where the plate-making is performed while the development treatment unit remains, the plate-making is carried out without preparing a developer, water, and a gum solution used in a developing unit, a water washing unit, and a finisher unit of the development treatment unit so that the development treatment unit can be used as a conveying unit from the exposed portion to the processing unit.

Further, the development treatment unit can be used as the conveying device from the exposed portion to the processing unit by connecting an insertion roller portion and a plate discharge roller portion of the development treatment unit using the conveying device such that the surface of the planographic printing plate to be conveyed such as a belt conveyor on the photosensitive layer side can be conveyed without coming into contact with any portion in a conveyance path and skipping the developing unit, the water washing unit, and the finisher unit.

In addition, a development treatment unit having a conveyance path separated from the path that conveys the planographic printing plate precursor to the developing unit, the water washing unit, and the finisher unit described in JP2006-65169A can be used.

Even in a case where planographic printing plate precursors are stored in a stacked state without edge stain, the planographic printing plate precursor according to the present invention has an excellent characteristic of preventing the transfer of the image recording layer. This characteristic is remarkable in an on-press development type planographic printing plate precursor. Particularly, in a case where printing paper having a larger width than the width of the planographic printing plate precursor is used, as newspaper printing, and printing is carried out, the planographic printing plate precursor of the present invention exhibits the excellent characteristic. In this case, the width of the planographic printing plate precursor corresponds to the length of the planographic printing plate precursor in the lateral direction at the time of being attached to the plate cylinder of the printing press.

Therefore, the planographic printing plate precursor of the present invention exhibits particularly excellent characteristics as an on-press development type planographic printing plate precursor used for printing newspaper.

EXAMPLES

Hereinafter, the present invention will be described in detail with reference to examples, but the present invention is not limited thereto. Further, in a polymer compound, the molecular weight indicates the mass average molar mass (Mw) and the proportion of repeating units indicates mole percentage unless otherwise specified.

Examples 1 to 74 and Comparative Examples 1 to 23

Preparation of Planographic Printing Plate Precursor 1

<Preparation of Support>

An aluminum alloy plate having a thickness of 0.3 mm and having a composition listed in Table 1 was subjected to the following treatments (a) to (m), whereby a support was produced. Moreover, during all treatment steps, a washing treatment was performed, and liquid cutting was performed using a nip roller after the washing treatment.

TABLE 1

| Composition (% by mass) | | | | | | | |
|---|---|---|---|---|---|---|---|
| Si | Fe | Cu | Mn | Mg | Zn | Ti | Al |
| 0.085 | 0.303 | 0.037 | 0 | 0 | 0 | 0.018 | Remainder |

(a) Mechanical Roughening Treatment (Brush Grain Method)

Figure 3:
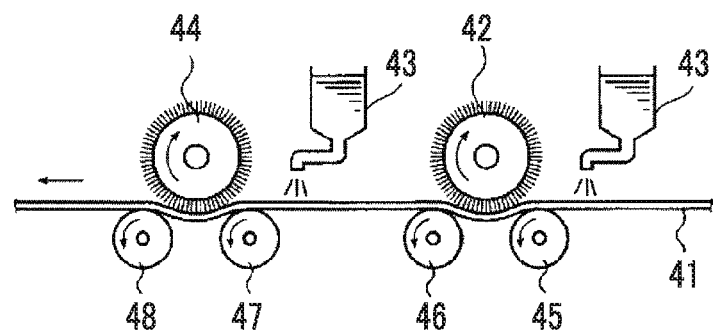
FIG. 3 is a side view illustrating the concept of a brush graining step used for a mechanical roughening treatment in production of a support for a planographic printing plate.

While supplying a suspension of pumice (specific gravity of 1.1 g/cm$^3$) to the surface of an aluminum plate as a polishing slurry liquid, with a device illustrated in FIG. 3, a mechanical roughening treatment was performed using rotating bundle bristle brushes. In FIG. 3, the reference numeral 41 is an aluminum plate, the reference numerals 42 and 44 are roller-shaped brushes (in the present example, bundle bristle bushes), the reference numeral 43 is a polishing slurry liquid, and the reference numerals 45, 46, 47, and 48 are support rollers.

The mechanical roughening treatment is performed under conditions in which the median diameter of a polishing material pumice was 30 μm, the number of the bundle bristle brushes was four, and the rotation speed of the bundle bristle brushes was set to 250 rpm. The material of the bundle bristle brushes was nylon 6.10, the diameter of the brush bristles was 0.3 mm, and the bristle length was 50 mm. The bundle bristle brushes were produced by implanting bristles densely into the holes in a stainless steel cylinder having a diameter of ϕ300 mm. The distance between two support rollers (ϕ200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the bundle bristle brushes was the same as the moving direction of the aluminum plate.

(b) Alkali Etching Treatment

The aluminum plate was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved was 10 g/m$^2$.

(c) Desmutting Treatment in Acidic Aqueous Solution

Next, a desmutting treatment was performed in a nitric acid aqueous solution. As the nitric acid aqueous solution used in the desmutting treatment, a nitric acid electrolyte used in electrochemical roughening of the subsequent step was used. The temperature was 35° C. The desmutting treatment was performed for 3 seconds by spraying the desmutting liquid using a spray.

(d) Electrochemical Roughening Treatment

Figure 4:
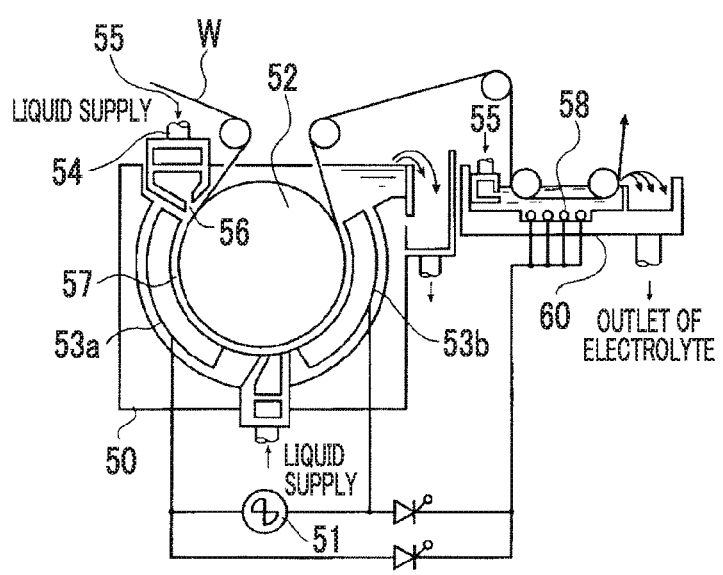
FIG. 4 is a side view illustrating an example of a radial type cell used for an electrochemical roughening treatment for which an alternating current is used in production of a support for a planographic printing plate.

An electrochemical roughening treatment was continuously performed using an AC voltage of 60 Hz. As the electrolyte, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp, until the current value reached a peak from zero, of 0.8 msec and the duty ratio of 1:1 as the AC power supply waveform, the electrochemical roughening treatment was performed using a carbon electrode as a counter electrode. As an auxiliary anode, ferrite was used. As an electrolytic cell, the electrolytic cell illustrated in FIG. 4 was used. In FIG. 4, an aluminum plate W was wound around a radial drum roller 52 disposed in a state of being immersed in a main electrolytic cell 50 and subjected to an electrolytic treatment by main poles 53a and 53b connected to an AC power supply 51 in the step of conveyance. The electrolyte 55 was supplied to an electrolyte passage 57 between the radial drum roller 52 and the main poles 53a and 53b through a slit 56 from an electrolyte supply port 54. The aluminum plate W treated by the main electrolytic cell 50 was subjected to an electrolytic treatment by an auxiliary anode vessel 60. An auxiliary anode 58 were disposed to face the aluminum plate W in the auxiliary anode vessel 60 and the electrolyte 55 was supplied so as to flow the space between the auxiliary anode 58 and the aluminum plate W. The current density was 30 A/dm$^2$ as the peak current value, and 5% of the current from the power source was separately flowed to the auxiliary anode. The electric quantity was 185 C/dm$^2$ as the sum total of electric quantity at the time of anodization of the aluminum plate. Thereafter, washing with water by spraying was performed.

(e) Alkali Etching Treatment

The aluminum plate was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.5 g/m$^2$.

(f) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The temperature was 60° C. The desmutting treatment was performed for 3 seconds by spraying the desmutting liquid using a spray.

(g) Electrochemical Roughening Treatment

An electrochemical roughening treatment was continuously performed using an AC voltage of hydrochloric acid electrolysis 60 Hz. As the electrolyte, an electrolyte which had been adjusted to have a concentration of aluminum ions of 4.5 g/L by adding aluminum chloride to an aqueous solution having a concentration hydrochloric acid of 6.2 g/L at a liquid temperature of 35° C. was used. Using a trapezoidal rectangular waveform AC having a time tp, until the current value reached a peak from zero, of 0.8 msec and the duty ratio of 1:1, the electrochemical roughening treatment was performed using a carbon electrode as a counter electrode. As an auxiliary anode, ferrite was used. As an electrolytic cell, the electrolytic cell illustrated in FIG. 4 was used. The current density was 25 A/dm$^2$ as the peak current value, and the electric quantity in the hydrochloric acid electrolysis was 63 C/dm$^2$ as the sum total of electric quantity at the time of anodization of the aluminum plate. Thereafter, washing with water by spraying was performed.

(h) Alkali Etching Treatment

The aluminum plate was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.1 g/m$^2$.

(i) Desmutting Treatment in Acidic Aqueous Solution

Next, a desmutting treatment was performed in a sulfuric acid aqueous solution. The desmutting treatment was performed at a solution temperature of 35° C. for 4 seconds using the sulfuric acid aqueous solution (aluminum ions having a concentration of 5 g/L were contained in a sulfuric acid aqueous solution having a concentration of 170 g/L) used for the anodizing treatment step. The desmutting treatment was performed for 3 seconds by spraying the desmutting liquid using a spray.

(j) First Anodizing Treatment

Figure 5:
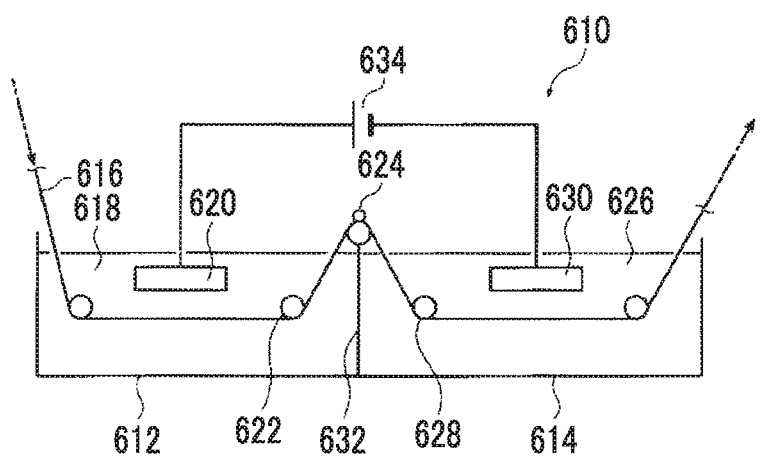
FIG. 5 is a schematic view illustrating an anodizing treatment device used for an anodizing treatment in production of a support for a planographic printing plate.

A first step of an anodizing treatment was performed with an anodizing device using DC electrolysis having a structure illustrated in FIG. 5. An anodized film having a predetermined film thickness was formed by performing an anodizing treatment under conditions listed in Table 2. An aqueous solution containing components listed in Table 2 was used as the electrolyte. In Tables 2 to 4, the "component concentration" indicates the concentration (g/l) of each component described in the section of "liquid component".

TABLE 2

| First anodizing treatment | | | | | | |
|---|---|---|---|---|---|---|
| Liquid type | Liquid component | Component concentration (g/L) | Temperature (° C.) | Current density (A/dm$^2$) | Time (s) | Film thickness (nm) |
| Sulfuric acid | H$_2$SO$_4$/Al | 170/5 | 55 | 90 | 0.40 | 110 |

In an anodizing treatment device 610 illustrated in FIG. 5, an aluminum plate 616 was conveyed as indicated by arrows in FIG. 5. The aluminum plate 616 in a power supply vessel 612 in which an electrolyte 618 was stored was positively (+) charged by a power supply electrode 620. Further, the aluminum plate 616 was conveyed upward by a roller 622 in the power supply vessel 612, the conveyance direction of the aluminum plate 616 was converted downward by a nip roller 624, the aluminum plate 616 was conveyed toward an electrolytic treatment vessel 614 in which the electrolyte 626 was stored, and then the conveyance direction thereof was converted into the horizontal direction by a roller 628. Next, when the aluminum plate 616 was negatively (−) charged by an electrolytic electrode 630, an anodizing film was formed on the surface thereof and the aluminum plate 616 taken out of the electrolytic treatment vessel 614 was conveyed to the subsequent step. In the anodizing treatment device 610, direction conversion means was formed of the roller 622, the nip roller 624, and the roller 628, and the aluminum plate 616 was conveyed to a mountain type and an inverted U type by the above-described rollers 622, 624, and 628 in a portion between the power supply vessel 612 and the electrolytic treatment vessel 614. The power supply electrode 620 and the electrolytic electrode 630 were connected to a DC power supply 634.

(k) Second Anodizing Treatment

A second step of an anodizing treatment was performed with an anodizing device using DC electrolysis having a structure illustrated in FIG. 5. An anodized film having a predetermined film thickness was formed by performing an anodizing treatment under conditions listed in Table 3. An aqueous solution containing components listed in Table 3 was used as the electrolyte.

TABLE 3

| | | Second anodizing treatment | | | | |
|---|---|---|---|---|---|---|
| Liquid type | Liquid component | Component concentration (g/L) | Temperature (° C.) | Current density (A/dm$^2$) | Time (s) | Film thickness (nm) |
| Sulfuric acid | H$_2$SO$_4$/Al | 170/5 | 54 | 15 | 13 | 900 |

(l) Third Anodizing Treatment

A third step of an anodizing treatment was performed with an anodizing device using DC electrolysis having a structure illustrated in FIG. 5. An anodized film having a predetermined film thickness was formed by performing an anodizing treatment under conditions listed in Table 4. An aqueous solution containing components listed in Table 4 was used as the electrolyte.

TABLE 4

| | | Third anodizing treatment | | | | |
|---|---|---|---|---|---|---|
| Liquid type | Liquid component | Component concentration (g/L) | Temperature (° C.) | Current density (A/dm$^2$) | Time (s) | Film thickness (nm) |
| Sulfuric acid | H$_2$SO$_4$/Al | 170/5 | 54 | 50 | 0.4 | 100 |

(m) Hydrophilization Treatment

In order to ensure hydrophilicity of a non-image portion, the non-image portion was subjected to a silicate treatment by being dipped using 2.5% by mass of a No. 3 sodium silicate aqueous solution at 50° C. for 7 seconds. The adhesion amount of Si was 8.5 mg/m$^2$. Thereafter, the resultant was washed with water using a spray.

The average diameter (average diameter of surface layer) of a large-diameter hole portion on the surface of the anodized film having micropores obtained in the above-described manner, the average diameter (average diameter of bottom portion) of the large-diameter hole portion in a communication position, the average diameter (diameter of small-diameter hole portion) of a small-diameter hole portion in the communication position, the average depth of the large-diameter hole portion and the small-diameter hole portion, the thickness (thickness of barrier layer) of the anodized film from the bottom portion of the small-diameter hole portion to the surface of the aluminum plate, and the density of the small-diameter hole portion are listed in Tables 5 and 6. The small-diameter hole portion includes a first small-diameter hold portion and a second small-diameter hole portion with depths different from each other and a small-diameter hole portion which is deeper than the other is referred to as the first small-diameter hole portion.

TABLE 5

| Micropore Large-diameter hole portion | | | | | |
|---|---|---|---|---|---|
| Average diameter of surface layer (nm) | Average diameter of bottom portion (nm) | Average depth (nm) | Average depth/ average diameter of surface layer | Average depth/ average diameter of bottom portion | Shape |
| 12 | 25 | 98 | 8.2 | 3.9 | Inverted taper |

TABLE 6

| Micropore | | | | | | | |
|---|---|---|---|---|---|---|---|
| Small-diameter hole portion | | | | | | | Ratio (average diameter of surface layer/ diameter of small-diameter hole portion) |
| Average diameter (nm) | Average depth (nm) | Density of communication portion (portions/μm$^2$) | Average thickness of barrier layer (nm) | Minimum thickness of barrier layer (nm) | Density of micropores (pores/μm$^2$) | Increase magnification of surface area | |
| 9.8 | 888, 968 | 800 (650) | 17 | 16 | 500 | 4.0 | 1.22 |

In Tables 5 and 6, the average value and the minimum value are shown as the barrier layer thickness. The average value is obtained by measuring 50 thicknesses of the anodized film from the bottom portion of the first small-diameter hole portion to the surface of the aluminum plate and arithmetically averaging the values.

The average diameter of micropores (average diameter of the large-diameter hole portion and the small-diameter hole portion) is a value obtained by observing 4 sheets (N=4) of the surfaces of the large-diameter hole portion and the surfaces of the small-diameter hole portion using FE-SEM at a magnification of 150,000, measuring the diameters of micropores (the large-diameter hole portion and the small-diameter hole portion) present in a range of 400×600 nm$^2$ in the obtained four sheets of images, and averaging the values. Further, in a case where the depth of the large-diameter hole portion is deep and the diameter of the small-diameter hole portion is unlikely to be measured, the upper portion of the anodized film is cut and then various kinds of diameters are acquired.

The average depth of the large-diameter hole portion is a value obtained by measuring the cross section of the support (anodized film) using FE-TEM at a magnification of 500,000, measuring 60 cases (N=60) of distances from the surface of an arbitrary micropore to the communication position in the obtained image, and averaging the values. Further, the average depth of the small-diameter hole portion is a value obtained by observing the cross section of the support (anodized film) using FE-SEM (at a magnification of 50,000), measuring 25 cases of depths of arbitrary micropores in the obtained image, and averaging the values.

The "density of the communication portion" indicates the density of the small-diameter hole portion of the cross section of the anodized film in the communication position. The "increase magnification of the surface area" indicates the value calculated based on the following Equation (A).

Increase magnification of surface area=1+pore density×(η×(average diameter of surface layer/2+average diameter of bottom portion/2)×((average diameter of bottom portion/2−average diameter of surface layer/2)$^2$+depth $A^2$)$^{1/2}$+π×(average diameter of bottom portion/2)$^2$−π×(average diameter of surface layer/2)$^2$)       Equation (A)

In the column of the "average depth (nm)" of the small-diameter hole portion, the average depth of the second small-diameter hole portion is shown on the left side and the average depth of the first small-diameter hole portion is shown on the right side. In the column of the "density of communication portion" of the small-diameter hole portion in Table E, the density of the first small-diameter hole portion is shown in the parentheses together with the density of the communication portion of the small-diameter hole portion.

In addition, the average diameter of the first small-diameter hole portion positioning from the bottom portion of the second small-diameter hole portion to the bottom portion of the first small-diameter hole portion was approximately 12 nm.

<Formation of Undercoat Layer>

The support was coated with an undercoat layer coating solution (1) with the following composition such that the drying coating amount was set to 20 mg/m$^2$, thereby forming an undercoat layer.

(Undercoat Layer Coating Solution (1))

| Compound (1) for undercoat layer (the following structure) | 0.18 g |
| Hydroxyethyl imino diacetic acid | 0.05 g |
| Surfactant (EMALEX 710, manufactured by Nihon Emulsion Co., Ltd.) | 0.03 g |
| Water | 28.0 g |

Compound (1) for undercoat layer

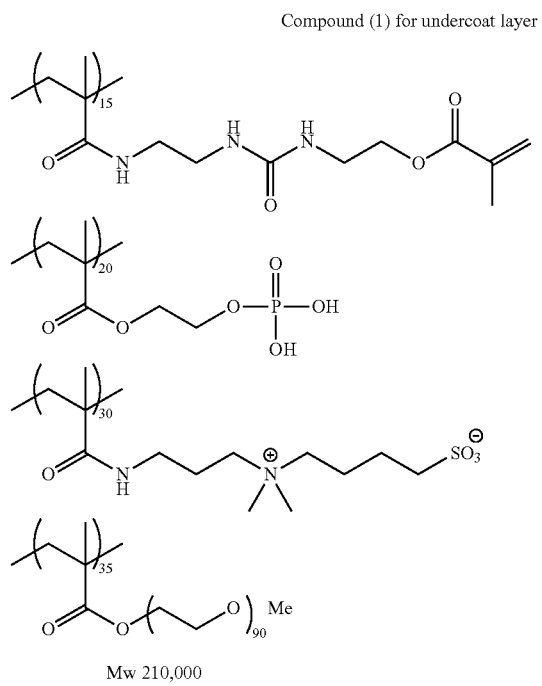

Mw 210,000

<Formation of Image Recording Layer>

The undercoat layer was bar-coated with an image recording layer coating solution (1) with the following composition and dried in an oven at 100° for 60 seconds, thereby forming an image recording layer having a drying coating amount of 1.0 g/m$^2$.

The image recording layer coating solution (1) was obtained by mixing a photosensitive solution (1) and a microgel solution (1) described below immediately before the coating and then stirring the solution.

(Image Recording Layer Coating Solution (1))
    (Photosensitive Solution (1))

| Binder polymer (1) (the following structure) (Mw: 55,000 and n: 2 (number of EO units)) | 0.240 g |
| Infrared absorbent (1) (the following structure) | 0.020 g |
| Borate compound (1) Sodium tetraphenyl borate | 0.010 g |
| Polymerization initiator (1) (the following structure) | 0.162 g |
| Polymerizable compound | 0.192 g |

Tris (acryloyloxyethyl) isocyanurate (NK ESTER A-9300, manufactured by Shin-Nakamura Chemical Co., Ltd.)

| Anionic surfactant 1 (the following structure) | 0.050 g |
| Oil sensitizing agent | 0.055 g |
| Phosphonium compound (1) (the following structure) | |
| Oil sensitizing agent | 0.018 g |
| Benzyl dimethyl octyl ammonium•PF$_6$ salt | |

-continued

| | |
|---|---|
| Oil sensitizing agent | 0.040 g |
| Ammonium group-containing polymer (the following structure) (Mw: 50,000, reduction specific viscosity: 45 ml/g) | |
| Fluorine-based surfactant (1) (the following structure) | 0.008 g |
| 2-butanone | 1.091 g |
| 1-methoxy-2-propanol | 8.609 g |

(Microgel Solution (1))

| | |
|---|---|
| Microgel (1) | 2.640 g |
| Distilled water | 2.425 g |

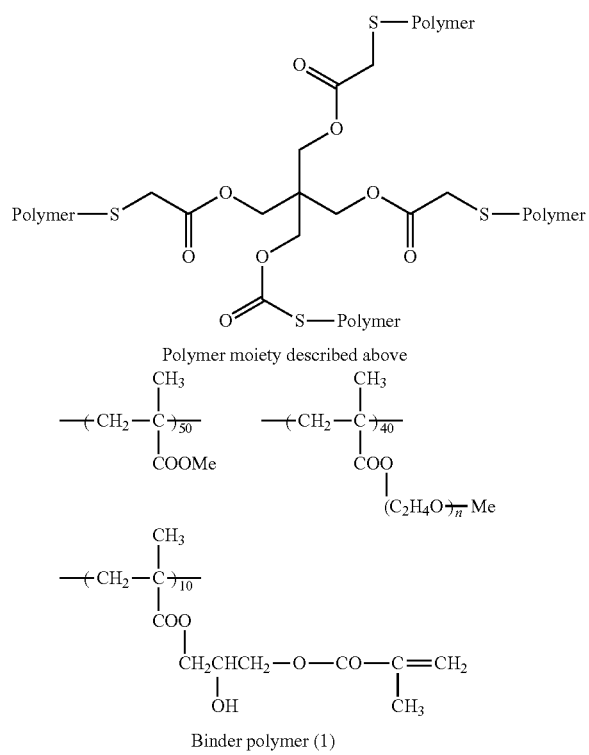

Binder polymer (1)

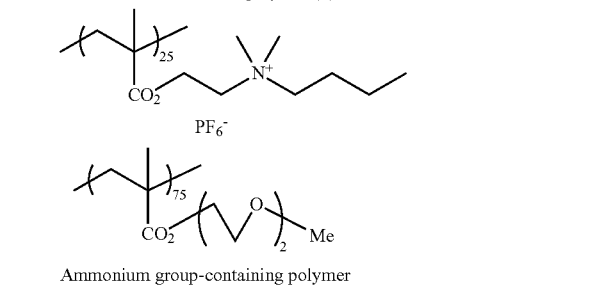

Ammonium group-containing polymer

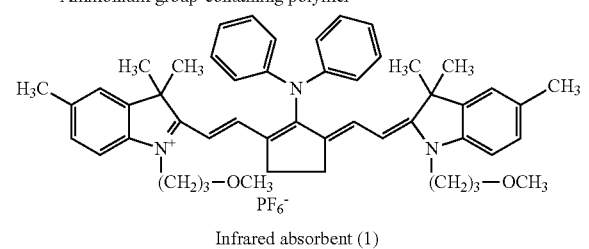

Infrared absorbent (1)

-continued

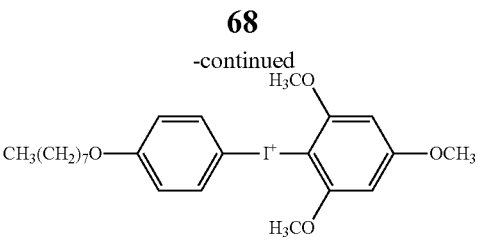

Polymerization initiator (1)

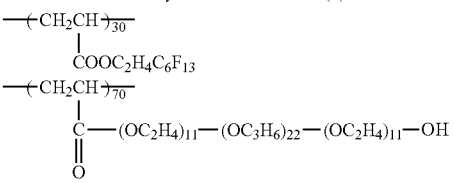

(Mw 13,000)
Fluorine-based surfactant (1)

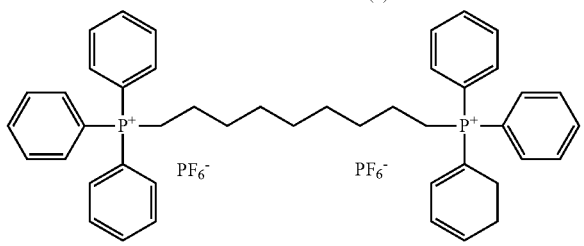

Phosphonium compound (1)

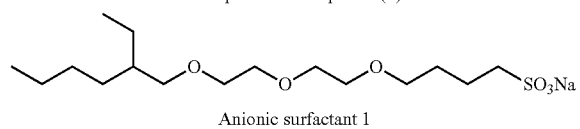

Anionic surfactant 1

(Preparation of Microgel (1))

As oil phase components, 10 g of an adduct (50% by mass of ethyl acetate solution, manufactured by Mitsui Chemical, Inc.) formed by adding 4.46 g of polyfunctional isocyante (75 mass % ethyl acetate solution, manufactured by Mitsui Chemical, Inc.) having the following structure, trimethylolpropane (6 mol), and xylene diisocyanate (18 mol), and adding methyl one-terminal polyoxyethylene (1 mol, repetition number of oxyethylene units: 90), 3.15 g of pentaerythritol triacylate (SR444, manufactured by Nippon Kayaku Co., Ltd.), and 0.1 g of PIONINE A-41C (manufactured by TAKEMOTO OIL & FAT Co., Ltd.) were dissolved in 17 g of ethyl acetate. As water phase components, 40 g of a 4 mass % aqueous solution of polyvinyl alcohol (PVA-205, manufactured by KURARAY CO., LTD.) was prepared. The oil phase components and the water phase components were mixed with each other and emulsified at 12,000 rpm for 10 minutes using a homogenizer. 25 g of distilled water was added to the obtained emulsion, and the resultant was stirred at room temperature for 30 minutes and stirred at 50° C. for 3 hours. The microgel solution obtained in this manner was diluted with distilled water such that the concentration of solid contents was set to 15% by mass, thereby preparing a microgel (1). The average particle diameter of the microgel measured by a light scattering method was 0.2 μm.

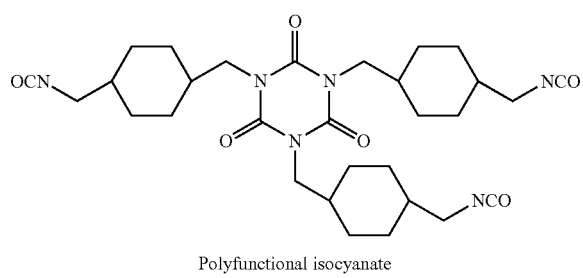

Polyfunctional isocyanate

<Formation of Protective Layer>

The image recording layer was bar-coated with a protective layer coating solution (1) with the following composition and dried in an oven at 120° for 60 seconds to form a protective layer having a drying coating amount of 0.15 g/m², thereby preparing a planographic printing plate precursor 1.

(Protective Layer Coating Solution (1))

| | |
|---|---|
| Inorganic layered compound dispersion liquid (1) (described below) | 1.5 g |
| Hydrophilic polymer (1) (the following structure, Mw: 30,000) (solid content) | 0.03 g |
| Polyvinyl alcohol (CKS50, manufactured by Nippon Synthetic Chemical Industry Co., Ltd.. sulfonic acid-modified, saponification degree: 99% by mole or greater, degree of polymerization: 300) 6 mass % aqueous solution | 0.10 g |
| Polyvinyl alcohol (PVA-405, manufactured by KURARAY CO., LTD., saponification degree: 81.5% by mole, degree of polymerization: 500), 6 mass % aqueous solution | 0.03 g |
| Surfactant (EMALEX 710, manufactured by Nihon Emulsion Co., Ltd.) (the following structure) 1 mass % aqueous solution | 0.86 g |
| Ion exchange water | 6.0 g |

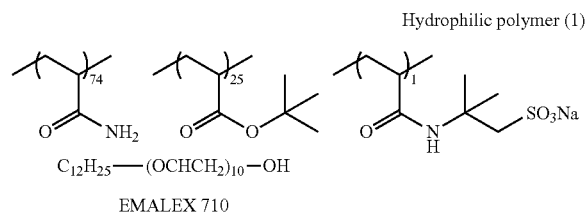

Hydrophilic polymer (1)

EMALEX 710

(Preparation of Inorganic Layered Compound Dispersion Liquid (1))

6.4 g of synthetic mica Somasif ME-100 (manufactured by CO-OP CHEMICAL CO., LTD.) was added to 193.6 g of ion exchange water and dispersed such that the volume average particle diameter (laser scattering method) was set to 3 μm using a homogenizer. The aspect ratio of the obtained dispersed particles was 100 or greater.

[Preparation of Planographic Printing Plate Precursor 2]

<Formation of Image Recording Layer>

The undercoat layer of the support having the undercoat layer used for preparation of the planographic printing plate precursor 1 was bar-coated with an image recording layer coating solution (2) with the following composition and dried in an oven at 70° for 60 seconds, thereby forming an image recording layer having a drying coating amount of 0.6 g/m².

(Image Recording Layer Coating Solution (2))

| | |
|---|---|
| Thermoplastic fine particle polymer aqueous dispersion liquid (described below) | 20.0 g |
| Infrared absorbent (2) (the following structure) | 0.2 g |
| Polymerization initiator | 0.4 g |
| IRGACURE 250 (manufactured by Ciba Specialty Chemicals, Inc.) | |
| Polymerization initiator (2) (the following structure) | 0.15 g |
| Polymerizable compound SR-399 (manufactured by Sartomer Japan Inc.) | 1.50 g |
| Mercapto-3-triazole | 0.2 g |
| Byk336 (manufactured by BYK Chemie GmbH) | 0.4 g |
| Klucel M (manufactured by Hercules, Inc.) | 4.8 g |
| ELVACITE 4026 (manufactured by Ineos Acrylics Ltd.) | 2.5 g |
| Anionic surfactant 1 (the above-described structure) | 0.15 g |
| n-propanol | 55.0 g |
| 2-butanone | 17.0 g |

The compounds described with the trade names in the composition above as follows.

IRGACURE 250: (4-methylphenyl)[4-(2-methylpropyl)phenyl]iodonium=hexafluorophosphate (75 mass % propylene carbonate solution)

SR-399: dipentaerythritolpentaacrylate

Byk336: modified dimethyl polysiloxane copolymer (25 mass % xylene/methoxy propyl acetate solution)

Klucel M: hydroxypropyl cellulose (2 mass % aqueous solution)

ELVACITE 4026: highly branched polymethyl methacrylate (10 mass % 2-butanone solution)

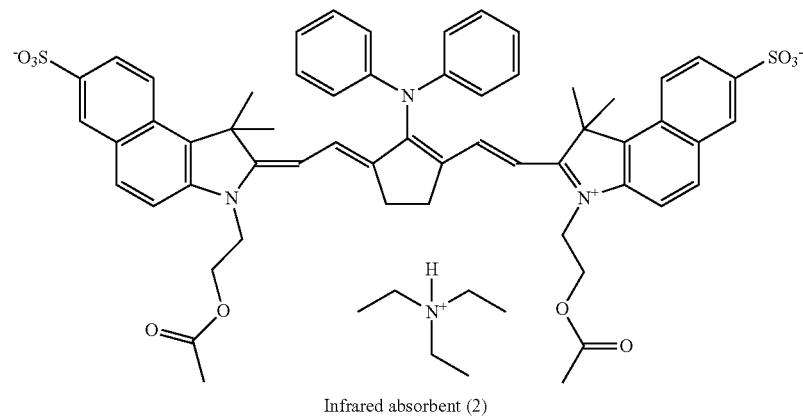

Infrared absorbent (2)

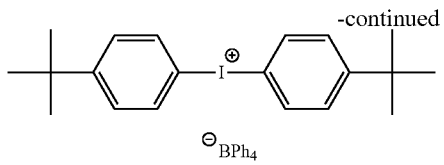

Polymerization initiator (2)

(Preparation of Thermoplastic Fine Particle Polymer Aqueous Dispersion Liquid)

Nitrogen gas was introduced into a 1,000 ml four-necked flask equipped with a stirrer, a thermometer, a dropping funnel, a nitrogen introduction pipe, and a reflex condenser, deoxygenation was performed, 10 g of polyethylene glycol methyl ether methacrylate (PEGMA, average number of repeating units of ethylene glycol: 20), 200 g of distilled water, and 200 g of n-propanol were added thereto, and then the mixture was heated until the internal temperature thereof was set to 70° C. Next, a mixture of 10 g of styrene (St), 80 g of acrylonitrile (AN), and 0.8 g of 2,2'-azobisisobutyronitrile prepared in advance was added dropwise for 1 hour. After dropwise addition was finished, the reaction was allowed to be continued for 5 hours, 0.4 g of 2,2'-azobisisobutyronitrile was added thereto, and the mixture was heated until the internal temperature was set to 80° C. Subsequently, 0.5 g of 2,2'-azobisisobutyronitrile was added for 6 hours. The total degree of polymerization at the stage of the continued reaction for 20 hours was 98% or greater, and a thermoplastic fine particle polymer aqueous dispersion liquid having PEGMA, St, and AN at a mass ratio of 10/10/80 was obtained. The particle size distribution of the thermoplastic fine particle polymer has a maximum value at 150 nm of the volume average particle diameter.

Here, the particle size distribution was acquired by imaging an electron microscope photograph of a fine particle polymer, measuring the total number of 5,000 particle diameters of fine particles on the photograph, dividing the interval from the maximum value of the obtained measured value of the particle diameter to 0 into the logarithmic scale of 50, and plotting the appearance frequency of each particle diameter. Further, the particle diameter of a spherical particle having the same particle area as the particle area on the photograph was set to the particle diameter, as non-spherical particles.

[Preparation of Planographic Printing Plate Precursor 3]

<Preparation of Support>

An aluminum plate having a thickness of 0.19 mm was immersed in a 40 g/l sodium hydroxide aqueous solution at 60° C. for 8 seconds so as to be degreased and then washed with demineralized water for 2 seconds. Next, the aluminum plate was subjected to an electrochemical roughening treatment in an aqueous solution containing 12 g/L of hydrochloric acid and 38 g/l of aluminum sulfate (18 hydrate) at a temperature of 33° C. and at a current density of 130 A/dm$^2$ using an AC for 15 seconds. Next, the aluminum plate was washed with demineralized water for 2 seconds, subjected to a desmutting treatment by being etched using 155 g/l of a sulfuric acid aqueous solution at 70° C. for 4 seconds, and washed with demineralized water at 25° C. for 2 seconds. The aluminum plate was subjected to an anodizing treatment in 155 g of a sulfuric acid aqueous solution for 13 seconds at a temperature of 45° C. and at a current density of 22 A/dm$^2$ and washed with demineralized water for 2 seconds. Further, the aluminum plate was treated at 40° C. for 10 seconds using 4 g/l of a polyvinyl phosphonic acid aqueous solution, washed with demineralized water at 20° C. for 2 seconds, and then dried, thereby preparing a support. The surface roughness Ra of the support was 0.21 μm and the amount of the anodized film was 4 g/m$^2$.

<Formation of Image Recording Layer>

An image recording layer aqueous coating solution containing a hydrophobic thermoplastic fine particle polymer, an infrared absorbent, and polyacrylic acid described below was prepared, the pH thereof was adjusted to 3.6, and a support was coated with the coating solution and dried at 50° C. for 1 minute to form an image recording layer, thereby preparing a planographic printing plate precursor 3. The coating amount after the drying of each component is shown below.

Hydrophobic thermoplastic fine particle polymer: 0.7 g/m$^2$
Infrared absorbent IR-01: 1.20×10$^{-4}$ g/m$^2$
Polyacrylic acid: 0.09 g/m$^2$ The hydrophobic thermoplastic fine particle polymer, the infrared absorbent IR-01, the polyacrylic acid used for the image recording layer coating solution are as follows.

Hydrophobic thermoplastic fine particle polymer:styrene-acrylonitrile copolymer (molar ratio of 50:50), Tg: 99° C., volume average particle diameter: 60 nm Infrared absorbent IR-01: infrared absorbent having the following structure

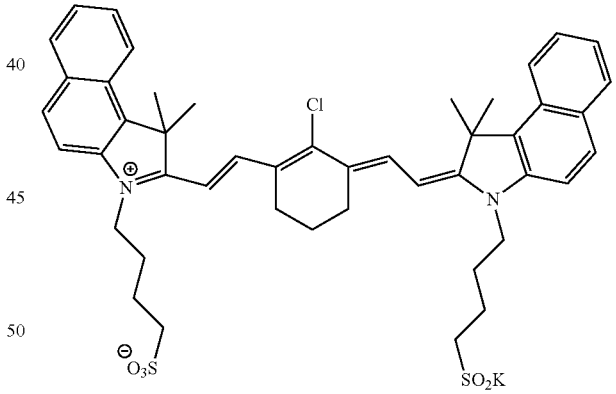

Polyacrylic acid, Mw: 250,000

[Application of Fine Particle-Containing Coating Solution]

<Preparation of Fine Particle-Containing Coating Solution>

The components described in the following F were added to pure water and stirred, thereby preparing fine particle-containing coating solutions A to Z and a and b. The numerical values in the parentheses described on the right side of compound names represent concentration of the components on a % by mass basis. Further, the "fine particle-containing coating solution a" and the "fine particle-containing coating solution b" are coating solutions for comparison and do not contain fine particles.

The polymer compounds listed in Table 7 are as follows.

Polyvinyl phosphonic acid (Mw: 30,000)

Vinyl phosphonic acid-acrylamide copolymer (molar ratio of 10/90) (Mw: 35.000)

Polymer compound 1 (compound represented by the following Formula P-1) (trade name: POLYPHOSMER PE-201, manufactured by DAP Co., Ltd., viscosity: 10 to 300 mPa·s, theoretical acid value: 311)

Polymer compound 2 (compound represented by the following Formula P-2) (Mw: 100,000)

Polymer compound 3 (compound represented by the following Formula P-3) (Mw: 50,000)

Sodium polyacrylate (Mw: 37,000)

TABLE 7

| Fine particle-containing coating solution | Fine particles (% by mass) | Additive (% by mass) |
|---|---|---|
| A | I (0.5) | — |
| B | I (0.5) | Polyvinyl phosphonic acid (2.8) |
| C | I (0.5) | Vinyl phosphonic acid-acrylamide copolymer (2.8) |
| D | I (0.5) | Polymer compound 1 (2.8) |
| E | II (0.5) | Polymer compound 2 (2.8) |
| F | II (0.5) | Polymer compound 3 (2.8) |
| G | II (1.5) | Sodium dihydrogen phosphate (0.1) |
| H | II (0.5) | Sodium polyacrylate (2.8) + sodium dihydrogen phosphate (0.1) |
| I | II (0.5) | Polymer compound 2 (2.8) + sodium dihydrogen phosphate (0.1) |
| J | II (0.5) | Polymer compound 3 (2.8) + sodium dihydrogen phosphate (0.1) |
| K | II (2.0) | Polymer compound 2 (0.5) + sodium dihydrogen phosphate (0.1) |
| L | III (0.5) | Polymer compound 2 (2.8) |
| M | III (0.5) | Polymer compound 3 (2.8) |
| N | III (1.5) | Sodium dihydrogen phosphate (0.1) |
| O | III (0.5) | Sodium polyacrylate (2.8) + sodium dihydrogen phosphate (0.1) |
| P | III (0.5) | Polymer compound 2 (2.8) + sodium dihydrogen phosphate (0.1) |
| Q | III (0.5) | Polymer compound 3 (2.8) + sodium dihydrogen phosphate (0.1) |
| R | IV (0.5) | Polymer compound 2 (2.8) |
| S | IV (0.5) | Polymer compound 3 (2.8) |
| T | IV (1.5) | Sodium dihydrogen phosphate (0.5) |
| U | IV (0.5) | Sodium polyacrylate (2.8) + sodium dihydrogen phosphate (0.1) |
| V | IV (0.5) | Polymer compound 2 (2.8) + sodium dihydrogen phosphate (0.1) |
| W | IV (0.5) | Polymer compound 3 (2.8) + sodium dihydrogen phosphate (0.1) |
| X | II (1.5) | Polymer compound 2 (7.5) + sodium dihydrogen phosphate (0.3) |
| Y | I (1.5) | Polymer compound 2 (7.5) + sodium dihydrogen phosphate (0.3) |
| Z | III (1.5) | Polymer compound 2 (7.5) + sodium dihydrogen phosphate (0.3) |
| a | — | Polymer compound 2 (2.8) + sodium dihydrogen phosphate (0.1) |
| b | — | Polymer compound 2 (7.5) + sodium dihydrogen phosphate (0.3) |

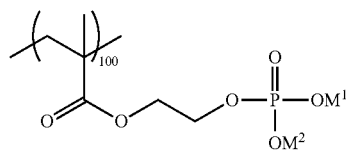

Formula P-1

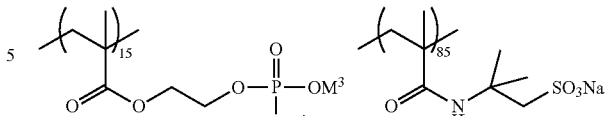

Formula P-2

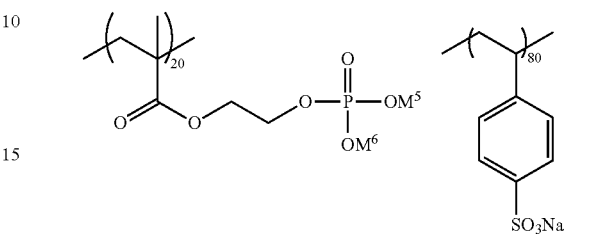

Formula P-3

In Formulae P-1, P-2, and P-3, $M^1$, $M^2$, $M^3$, $M^4$, $M^5$, and $M^6$ each independently represent a hydrogen atom or a sodium atom. Further, the numerical values on the right side of the parentheses represent the content (% by mole) of the monomer unit with respect to the total monomer units of a polymer.

Fine particles I, II, III, and IV are as follows.

Fine particles I: organic resin fine particles

Organic resin fine particles prepared using the following method were used.

<Organic Resin Fine Particles>

8 g of styrene, 1 g of divinyl benzene, and 0.45 g of sodium dodecyl sulfate were weighed using a 1.000 ml three-necked flask, the mixture was dissolved in 28 g of distilled water, and then stirred at 65° C. for 30 minutes in a nitrogen stream. A solution formed by dissolving 18.6 mg of 2,2'-azobis(2-amidinopropane)dihydrochloride in 2 g of distilled water was added to the above-described solution and the resulting solution was stirred at the same temperature for 6 hours. After the reaction was finished, the reaction mixture was filtered using a glass filter, thereby obtaining an organic resin fine particle aqueous dispersion liquid. The concentration of solid contents of the organic resin fine particle aqueous dispersion liquid was 20% by mass and the average particle diameter of the organic resin fine particles measured by a light scattering method was 87 nm.

Fine Particles II: Microgel

A microgel prepared using the following method was used.

<Preparation of Microgel>

As oil phase components, 10 g of an adduct (TAKENATE D-110N, manufactured by Mitsui Chemical, Inc.) of trimethylolpropane and xylene diisocyanate, 3.15 g of pentaerythritol triacrylate (SR444, manufactured by Nippon Kayaku Co., Ltd.), and 0.1 g of alkyl benzene sulfonate (PIONINE A-41C, manufactured by TAKEMOTO OIL & FAT Co., Ltd.) were dissolved in 17 g of ethyl acetate. As water phase components, 40 g of a 4 mass % aqueous solution of polyvinyl alcohol (PVA-205, manufactured by KURARAY CO., LTD.) was prepared. The oil phase components and the water phase components were mixed with each other and emulsified at 12,000 rpm for 10 minutes using a homogenizer. The obtained emulsion was added to 25 g of distilled water, and the resultant was stirred at room temperature for 30 minutes and stirred at 50° C. for 3 hours. The microgel solution obtained in this manner was diluted with distilled water such that the concentration of solid contents was set to 15% by mass, thereby preparing a microgel. The average particle diameter of the microgel measured by a light scattering method was 0.2 μm.

Fine Particles III: Thermoplastic Fine Particles

Thermoplastic fine particles prepared using the following method were used.

<Preparation of Thermoplastic Fine Particle Aqueous Dispersion Liquid>

Nitrogen gas was introduced into a 1,000 ml four-necked flask equipped with a stirrer, a thermometer, a dropping funnel, a nitrogen introduction pipe, and a reflex condenser, deoxygenation was performed, 10 g of polyethylene glycol methyl ether methacrylate (PEGMA, average number of repeating units of ethylene glycol: 20), 200 g of distilled water, and 200 g of n-propanol were added thereto, and then the mixture was heated until the internal temperature thereof was set to 70° C. Next, a mixture of 10 g of styrene (St), 80 g of acrylonitrile (AN), and 0.8 g of 2,2'-azobisisobutyronitrile prepared in advance was added dropwise for 1 hour. After dropwise addition was finished, the reaction was allowed to be continued for 5 hours, 0.4 g of 2,2'-azobisisobutyronitrile was added thereto, and the mixture was heated until the internal temperature was set to 80° C. Subsequently, 0.5 g of 2,2'-azobisisobutyronitrile was added for 6 hours. The total degree of polymerization at the stage of the continued reaction for 20 hours was 98% or greater, and a thermoplastic fine particle polymer aqueous dispersion liquid having PEGMA, St, and AN at a mass ratio of 10/10/80 was obtained. The particle size distribution of the thermoplastic fine particle polymer has a maximum value at 150 nm of the volume average particle diameter.

Here, the particle size distribution was acquired by imaging an electron microscope photograph of thermoplastic fine particles, measuring the total number of 5,000 particle diameters of fine particles on the photograph, dividing the interval from the maximum value of the obtained measured value of the particle diameter to 0 into the logarithmic scale of 50, and plotting the appearance frequency of each particle diameter. Further, the particle diameter of a spherical particle having the same particle area as the particle area on the photograph was set to the particle diameter, as non-spherical particles.

Fine Particles IV: Inorganic Fine Particles

Commercially available colloidal silica MP1040 (manufactured by Nissan Chemical Industries, Ltd., average particle diameter: 0.1 μm, 40 mass % aqueous dispersion liquid) was used.

<Applying and then Cutting of Fine Particle-Containing Coating Solution>

After the fine particle-containing coating solution was applied, cutting was performed according to the following method.

The fine particle-containing coating solution was applied such that the solid content coating amount was set to a predetermined value by adjusting the conveying speed using 2NL04 (manufactured by HEISHIN Ltd.) as a coating device according to a dispenser method at a clearance of 0.3 mm and at a feed amount of 5 ml/min.

The fine particle-containing coating solution was applied to a region at a width of 10 mm from two sides of both end portions facing the planographic printing plate precursor to positions respectively separated by a distance of 3 cm.

<Time of Coating Support with Fine Particle-Containing Coating Solution>

The time of applying the fine particle-containing coating solution is as described in the following (1) to (6).

(1) A support was coated with the fine particle-containing coating solution and then dried at 85° C. for 30 seconds.

(2) The support was coated with an undercoat layer, coated with the fine particle-containing coating solution without drying, and then dried at 80° C. for 30 seconds.

(3) The support was coated with an undercoat layer, coated with the fine particle-containing coating solution without drying, and then dried at 150° C. for 20 seconds.

(4) The support was coated with an undercoat layer and coated with the fine particle-containing coating solution after the support was dried at 80° C. for 30 seconds. Thereafter, the support was dried at 80° C. for 30 seconds.

(5) The support was coated with a protective layer (after the support was coated with an image recording layer in a case where the formation of a protective layer was not carried out), coated with the fine particle-containing coating solution without drying, and then dried at 150° C. for 1 minute.

(6) The support was coated with a protective layer (after the support was coated with an image recording layer in a case where the formation of a protective layer was not carried out) and coated with the fine particle-containing coating solution after the support was dried at 120° C. for 1 minute. Thereafter, the support was dried at 120° C. for 1 minute.

The planographic printing plate precursor was coated with the fine particle-containing coating solution by combining the fine particle-containing coating solution, the planographic printing plate precursor, and the time of coating the planographic printing plate precursor with the coating solution as listed in Table G.

<Cutting>

The planographic printing plate precursor was cut to have a shape of an end portion with a desired sagging amount and a desired sagging width by adjusting a gap between an upper cutting blade and a lower cutting blade, the amount of biting, and the blade tip angle using a rotary blade as illustrated in FIG. 2. The central position of a region coated with the fine particle-containing coating solution was set to a cutting position under the above-described cutting conditions and two places of the planographic printing plate precursor was cut. When the sagging shape was measured by the following method, the sagging amount was 60 μm and the sagging width was 150 μm.

<Cutting and then Applying Fine Particle-Containing Coating Solution>

After the planographic printing plate precursor was cut, the fine particle-containing coating solution was applied according to the following method.

<Cutting>

The planographic printing plate precursor was continuously slit to have a shape of an end portion with a desired sagging amount and a desired sagging width by adjusting a gap between an upper cutting blade and a lower cutting blade, the amount of biting, and the blade tip angle using a rotary blade as illustrated in FIG. 2. When the sagging shape was measured by the following method, the sagging amount was 60 μm and the sagging width was 150 μm. The sagging shape was measured using a surface roughness meter (SURFCOM, manufactured by TOKYO SEMITSU CO., LTD.). The model number 480A was used as the surface roughness meter and a stylus having a diameter of 2 μm was used. The sagging shape was measured by moving the stylus toward an end portion of the planographic printing plate precursor from the inside by a distance of approximately 1 mm at a speed of 3 mm/sec.

<Method of Applying Fine Particle-Containing Coating Solution>

The method of applying the fine particle-containing coating solution is as described in the following (1) to (4).

(1) AeroJet (manufactured by Musashi Engineering Inc.) having a non-contact dispenser system was used as a coating device. The conveying speed was adjusted such that the coating amount (solid content) was set to 0.8 g/m² under the conditions of a clearance of 6 mm and a discharge pressure of 0.05 MPa, the fine particle-containing coating solution was applied to a region from the end portion of the planographic printing plate precursor to a portion inside the end portion by 5 mm, and then the planographic printing plate precursor was dried at 120° C. for 1 minute using a constant-temperature tank PH-201 (manufactured by ESPEC CORP.).

(2) Cloth containing the fine particle-containing coating solution was brought into contact with the end portions of the planographic printing plate precursor, the fine particle-containing coating solution was applied to a region from the end portion of the planographic printing plate precursor to a portion inside the end portion by 5 mm while the cloth was allowed to slide along the end portions, and then the planographic printing plate precursor was dried at 120° C. for 1 minute using a constant-temperature tank PH-201 (manufactured by ESPEC CORP.).

(3) Cloth containing the fine particle-containing coating solution was brought into contact with the end portions of the planographic printing plate precursor, the fine particle-containing coating solution was applied to a region from the end portion of the planographic printing plate precursor to a portion inside the end portion by 5 mm by pressing the cloth from the top, and then the planographic printing plate precursor was dried at 120° C. for 1 minute using a constant-temperature tank PH-201 (manufactured by ESPEC CORP.).

(4) A brush containing the fine particle-containing coating solution was brought into contact with the end portions of the planographic printing plate precursor, the fine particle-containing coating solution was applied to a region from the end portion of the planographic printing plate precursor to a portion inside the end portion by 5 mm, and then the planographic printing plate precursor was dried at 120° C. for 1 minute using a constant-temperature tank PH-201 (manufactured by ESPEC CORP.).

The planographic printing plate precursor was coated with the fine particle-containing coating solution by combining the fine particle-containing coating solution, the planographic printing plate precursor, and the method of applying the fine particle-containing coating solution as listed in Table G.

[Measurement of Content of Fine Particles]

50 sheets having a rectangular shape with a size of 5 mm×1.100 mm in which an edge-treated end portion was set to one side were cut from 25 sheets of planographic printing plate precursors (400 mm×1.100 mm) whose two facing long sides were edge-treated, thereby obtaining a sample A. Further, one sheet of remaining planographic printing plate precursor (390 mm×1,100 mm) formed by cutting the edge treated end portions was set to a sample B.

The sample A and the sample B were further cut into 5 mm×1 cm² and were immersed in 360 ml of a mixed solvent of methyl ethyl ketone (MEK), propylene glycol monomethyl ether, methanol, and water at a mass ratio of 3/6/1/1 (solvent A) for 1 hour, coated film components were removed, and the support was removed, thereby obtaining a film-removing solution A and a film-removing solution B.

The film-removing solution A and the film-removing solution B were centrifuged at 11,000 rpm for 1 hour using a centrifuge (SRX-201, manufactured by TOMY SEIKO CO., LTD.), and then the supernatant was removed by decantation. Next, 300 ml of a solvent A was added thereto and centrifuged, and the supernatant was subjected to decantation. Thereafter, 300 ml of methanol was added thereto and centrifuged, and the supernatant was subjected to decantation. The precipitate was dried under reduced pressure (1 kPa, 60° C., 2 hours) and the weight thereof was measured. The content (mg/m²) of fine particles per unit area included in the sample A and the sample B was acquired by calculation from the weight of a precipitate A obtained from the film-removing solution A and the weight of a precipitate B obtained from the film-removing solution B.

<Plate-Making of Planographic Printing Plate Precursor>

The planographic printing plate precursor prepared in the above-described manner was exposed in Luxel PLATESETTER T-6000III (manufactured by Fujifilm Corporation) equipped with an infrared semiconductor laser under conditions of external surface drum rotation speed of 1.000 rpm, a laser output of 70%, and a resolution of 2,400 dpi. The exposed image had a solid image and a 50% halftone dot chart.

The exposed planographic printing plate precursor was mounted on an offset rotary printing press and then printing was performed at a speed of 100,000 sheets/hour using SOIBI KKST-S (red) (manufactured by Dai Nippon Printing Co., Ltd.) as printing ink for newspaper and TOYO ALKY (manufactured by TOYO INK CO., LTD.) as dampening water.

<Evaluation of Planographic Printing Plate Precursor>

<Evaluation of Performance of Preventing Edge Stain>

In the above-described printing step, 1,000-th printed matter was sampled, the degree of linear stain on an edge portion was visually observed, and then the evaluation was performed based on the following standard. The value of 5 to 3 is an acceptable level.

5: Stain was not observed at all.
4: An intermediate level between 5 and 3.
3: A slight amount of stain was observed.
2: An intermediate level between 3 and 1.
1: Stain was clearly observed.

<Evaluation of Transferred Material at the Time when Planographic Printing Plate Precursors were Stacked>

After two sheets of prepared planographic printing plate precursors were stacked on each other and stored at 25° C. for 1 day in a state in which a pressure of 20 (kg/cm²) was applied to the plate surface using a vise, the rear surface of the other planographic printing plate precursor in contact with the end portion treated region of the planographic printing plate precursor was visually observed, the transferred material to the rear surface thereof was evaluated based on the following standard. The values of 5 and 4 were acceptable levels.

5: A transferred material was not observed at all.
4: A slight amount of a transferred material was seen.
3: A slight amount of a transferred material in the form of a continuous line was seen.
2: A transferred material in the form of a continuous line was seen.
1: A transferred material in the form of a continuous line was clearly seen.

In the following Tables 8 to 10, the "difference between contents of fine particles" indicates a difference between the contents of fine particles per unit area in a region from the end portion of the planographic printing plate precursor to a portion by 5 mm and the content of fine particles per unit area in a region other than the above-described region. In Comparative Examples 1 to 21, since the fine particles of the present invention were not applied to the end portion regions of the planographic printing plate precursors, the "difference between contents of fine particles" were not measured. The "time of coating" indicates the time of coating the positions corresponding to the end portion regions of the planographic printing plate precursor with the fine particle-containing coating solution during the step of forming configuration layers of the planographic printing plate precursor. The "coating method" indicates the method of coating the end portion regions of the planographic printing plate precursor with the fine particle-containing coating solution after the planographic printing plate precursor produced by performing the step of forming configuration layers of the planographic printing plate precursor was cut.

TABLE 8

|  | Planographic printing plate precursor | Fine particle-containing coating solution | Difference between contents of fine particles (mg/m$^2$) | Time of coating | Coating method | Edge stain | Transferred material |
| --- | --- | --- | --- | --- | --- | --- | --- |
| Example 1 | 1 | A | 512 | 1 | — | 3 | 4 |
| Example 2 | 1 | B | 70 | 1 | — | 4 | 5 |
| Example 3 | 1 | C | 65 | 1 | — | 4 | 5 |
| Example 4 | 1 | D | 72 | 1 | — | 4 | 5 |
| Example 5 | 1 | E | 75 | 1 | — | 4 | 5 |
| Example 6 | 1 | E | 3,013 | 1 | — | 4 | 4 |
| Example 7 | 1 | F | 65 | 1 | — | 4 | 5 |
| Example 8 | 1 | G | 461 | 1 | — | 4 | 5 |
| Example 9 | 1 | H | 67 | 1 | — | 5 | 5 |
| Example 10 | 1 | I | 67 | 1 | — | 5 | 5 |
| Example 11 | 1 | J | 73 | 1 | — | 5 | 5 |
| Example 12 | 1 | K | 355 | 1 | — | 5 | 5 |
| Example 13 | 1 | L | 72 | 1 | — | 4 | 5 |
| Example 14 | 1 | M | 70 | 1 | — | 4 | 5 |
| Example 15 | 1 | N | 433 | 1 | — | 4 | 5 |
| Example 16 | 1 | O | 70 | 1 | — | 5 | 5 |
| Example 17 | 1 | P | 73 | 1 | — | 5 | 5 |
| Example 18 | 1 | Q | 74 | 1 | — | 5 | 5 |
| Example 19 | 1 | R | 75 | 1 | — | 4 | 5 |
| Example 20 | 1 | S | 68 | 1 | — | 4 | 5 |
| Example 21 | 1 | T | 355 | 1 | — | 4 | 5 |
| Example 22 | 1 | U | 68 | 1 | — | 5 | 5 |
| Example 23 | 1 | V | 73 | 1 | — | 5 | 5 |
| Example 24 | 1 | W | 74 | 1 | — | 5 | 5 |
| Example 25 | 1 | X | 73 | 1 | — | 5 | 5 |
| Example 26 | 2 | B | 68 | 1 | — | 4 | 5 |
| Example 27 | 2 | C | 67 | 1 | — | 4 | 5 |
| Example 28 | 2 | E | 70 | 1 | — | 4 | 5 |
| Example 29 | 2 | I | 66 | 1 | — | 5 | 5 |
| Example 30 | 2 | K | 360 | 1 | — | 5 | 5 |
| Example 31 | 3 | B | 71 | 1 | — | 4 | 5 |
| Example 32 | 3 | C | 71 | 1 | — | 4 | 5 |

TABLE 9

| | Planographic printing plate precursor | Fine particle-containing coating solution | Difference between contents of fine particles (mg/m$^2$) | Time of coating | Coating method | Edge stain | Transferred material |
|---|---|---|---|---|---|---|---|
| Example 33 | 3 | E | 73 | 1 | — | 4 | 5 |
| Example 34 | 3 | I | 70 | 1 | — | 5 | 5 |
| Example 35 | 3 | K | 363 | 1 | — | 5 | 5 |
| Example 36 | 1 | I | 111 | 2 | — | 5 | 5 |
| Example 37 | 1 | I | 104 | 3 | — | 5 | 5 |
| Example 38 | 1 | I | 102 | 4 | — | 5 | 5 |
| Example 39 | 1 | X | 265 | 5 | — | 5 | 4 |
| Example 40 | 1 | X | 265 | 6 | — | 5 | 4 |
| Example 41 | 2 | I | 102 | 2 | — | 5 | 5 |
| Example 42 | 2 | B | 102 | 2 | — | 4 | 5 |
| Example 43 | 2 | C | 104 | 4 | — | 4 | 5 |
| Example 44 | 2 | D | 103 | 4 | — | 4 | 5 |
| Example 45 | 2 | X | 263 | 5 | — | 5 | 4 |
| Example 46 | 3 | N | 448 | 1 | — | 4 | 5 |
| Example 47 | 3 | O | 107 | 2 | — | 5 | 5 |
| Example 48 | 3 | P | 105 | 4 | — | 5 | 5 |
| Example 49 | 3 | Q | 105 | 2 | — | 5 | 5 |
| Example 50 | 3 | X | 265 | 5 | — | 5 | 4 |
| Example 51 | 3 | X | 362 | 6 | — | 5 | 4 |
| Example 52 | 1 | T | 360 | 1 | — | 4 | 5 |
| Example 53 | 1 | U | 105 | 2 | — | 5 | 5 |
| Example 54 | 1 | V | 105 | 2 | — | 5 | 5 |
| Example 55 | 1 | W | 105 | 4 | — | 5 | 5 |
| Example 56 | 1 | X | 259 | 6 | — | 5 | 4 |
| Example 57 | 1 | X | 125 | — | 1 | 5 | 4 |
| Example 58 | 1 | X | 699 | — | 2 | 5 | 4 |
| Example 59 | 1 | X | 848 | — | 3 | 5 | 4 |
| Example 60 | 1 | X | 904 | — | 4 | 5 | 4 |
| Example 61 | 1 | Y | 125 | — | 1 | 5 | 4 |
| Example 62 | 1 | Z | 120 | — | 1 | 5 | 4 |
| Example 63 | 1 | V | 105 | — | 1 | 5 | 4 |
| Example 64 | 2 | X | 124 | — | 1 | 5 | 4 |

TABLE 10

| | Planographic printing plate precursor | Fine particle-containing coating solution | Difference between contents of fine particles (mg/m$^2$) | Time of coating | Coating method | Edge stain | Transferred material |
|---|---|---|---|---|---|---|---|
| Example 65 | 2 | Y | 125 | — | 1 | 5 | 4 |
| Example 66 | 2 | Z | 121 | — | 1 | 5 | 4 |
| Example 67 | 2 | V | 804 | — | 2 | 5 | 4 |
| Example 68 | 3 | X | 120 | — | 1 | 5 | 4 |
| Example 69 | 3 | Y | 125 | — | 1 | 5 | 4 |
| Example 70 | 3 | Z | 123 | — | 1 | 5 | 4 |
| Example 71 | 3 | V | 820 | — | 2 | 5 | 4 |
| Example 72 | 1 | I | 108 | 2 | — | 5 | 5 |
| Example 73 | 1 | I | 108 | 2 | — | 4 | 5 |
| Example 74 | 1 | I | 108 | 2 | — | 5 | 5 |
| Comparative Example 1 | 1 | — | — | — | — | 1 | 5 |
| Comparative Example 2 | 2 | — | — | — | — | 1 | 5 |
| Comparative Example 3 | 3 | — | — | — | — | 1 | 5 |
| Comparative Example 4 | 1 | a | — | 1 | — | 3 | 2 |
| Comparative Example 5 | 1 | a | — | 2 | — | 3 | 2 |
| Comparative Example 6 | 1 | a | — | 3 | — | 3 | 2 |
| Comparative Example 7 | 1 | a | — | 4 | — | 3 | 2 |
| Comparative Example 8 | 1 | b | — | 5 | — | 2 | 2 |
| Comparative Example 9 | 1 | b | — | 6 | — | 2 | 2 |
| Comparative Example 10 | 2 | a | — | 1 | — | 3 | 2 |
| Comparative Example 11 | 2 | a | — | 2 | — | 3 | 2 |

TABLE 10-continued

| | Planographic printing plate precursor | Fine particle-containing coating solution | Difference between contents of fine particles (mg/m²) | Time of coating | Coating method | Edge stain | Transferred material |
|---|---|---|---|---|---|---|---|
| Comparative Example 12 | 2 | b | — | 5 | — | 2 | 2 |
| Comparative Example 13 | 3 | a | — | 1 | — | 3 | 2 |
| Comparative Example 14 | 3 | a | — | 2 | — | 3 | 2 |
| Comparative Example 15 | 3 | b | — | 5 | — | 2 | 2 |
| Comparative Example 16 | 1 | b | — | — | 1 | 3 | 1 |
| Comparative Example 17 | 1 | b | — | — | 2 | 3 | 2 |
| Comparative Example 18 | 2 | b | — | — | 1 | 3 | 1 |
| Comparative Example 19 | 2 | b | — | — | 2 | 3 | 1 |
| Comparative Example 20 | 3 | b | — | — | 1 | 3 | 2 |
| Comparative Example 21 | 3 | b | — | — | 2 | 3 | 1 |
| Comparative Example 22 | 1 | E | 8 | 1 | — | 1 | 5 |
| Comparative Example 23 | 1 | I | 8 | 2 | — | 2 | 5 |

In Tables 8 to 10, in Examples 72 to 74, the sagging amounts and the sagging widths were adjusted in the following manner at the time of cutting the planographic printing plate precursors. In other words, in Example 72, the sagging amount was 40 μm and the sagging width was 110 μm. In Example 73, the sagging amount was 35 μm and the sagging width was 80 μm. In Example 74, the sagging amount was 100 μm and the sagging width was 200 μm.

From the results listed in the above-described Tables 8 to 10, in the planographic printing plate precursor according to the present invention, specifically containing a large amount of fine particles, in the end portion regions, it was understood that edge stain does not occur and the transferring of the image recording layer is prevented satisfactorily even in a case where planographic printing plate precursors are stored in a stacked state. Meanwhile, the planographic printing plate precursors of the comparative examples are insufficient in at least one of preventing occurrence of edge stain or preventing transferring of the image recording layer.

INDUSTRIAL APPLICABILITY

According to the present invention, it is possible to provide a planographic printing plate precursor in which edge stain does not occur and transferring of an image recording layer is prevented even in a case where planographic printing plate precursors are stored in a stacked state; a method of producing the same; and a printing method using the same.

The present invention has been described with reference to detailed and specific embodiments, but various changes or modifications can be made without departing from the spirit and the scope of the present invention and this is apparent to those skilled in the art.

What is claimed is:

1. A planographic printing plate precursor comprising:
a support;
an image recording layer formed on the support; and
fine particles positioned in a region of the planographic printing plate precursor on the image recording layer side,
wherein a content of the fine particles per unit area in a first region on the image recording layer side from an end portion of the planographic printing plate precursor to a portion inside the end portion by 5 mm is greater than a content of the fine particles per unit area in a second region other than the first region by an amount of 10 mg/m² or greater.

2. The planographic printing plate precursor according to claim 1,
wherein the fine particles are organic resin fine particles.

3. The planographic printing plate precursor according to claim 2,
wherein the organic resin fine particles are microgel particles.

4. The planographic printing plate precursor according to claim 2,
wherein the organic resin fine particles are thermoplastic fine particles.

5. The planographic printing plate precursor according to claim 1,
wherein the fine particles are inorganic fine particles.

6. The planographic printing plate precursor according to claim 5,
wherein the inorganic fine particles are silica, alumina, magnesium oxide, titanium oxide, magnesium carbonate, or a mixture of these.

7. The planographic printing plate precursor according to claim 1,
wherein the end portion of the planographic printing plate precursor has a sagging shape in which a sagging amount X is in a range of 35 to 150 μm and a sagging width Y is in a range of 70 to 300 μm.

8. The planographic printing plate precursor according to claim 1,
wherein the first region further contains a hydrophilic compound.

9. The planographic printing plate precursor according to claim 8,
wherein the hydrophilic compound is a compound which includes a support-adsorptive group.

10. The planographic printing plate precursor according to claim 9,
wherein the compound which includes a support-adsorptive group is a phosphoric acid compound or a phosphonic acid compound.

11. The planographic printing plate precursor according to claim 10,
wherein the phosphoric acid compound or the phosphonic acid compound is a polymer compound.

12. The planographic printing plate precursor according to claim 1,
wherein the image recording layer contains an infrared absorbent, a polymerization initiator, a polymerizable compound, and a binder polymer.

13. The planographic printing plate precursor according to claim 1,
wherein the image recording layer contains an infrared absorbent, a polymerization initiator, a polymerizable compound, and a particulate polymer compound.

14. The planographic printing plate precursor according to claim 1,
wherein the image recording layer contains an infrared absorbent and a thermoplastic fine particle polymer.

15. A method of producing a planographic printing plate precursor which includes a support; an image recording layer formed on the support; and fine particles positioned in a region of the planographic printing plate precursor on the image recording layer side, in which a content of the fine particles per unit area in a first region on the image recording layer side from an end portion of the planographic printing plate precursor to a portion inside the end portion by 5 mm is greater than a content of the fine particles per unit area in a second region other than the first region by an amount of 10 mg/m$^2$ or greater, the method comprising:
   (a) an image recording layer forming step of forming the image recording layer:
   (b) a coating step of coating a part of a region where the image recording layer is formed by the step (a) with a coating solution containing the fine particles such that the coating solution and the region overlap each other; and
   (c) a cutting step of cutting the region coated with the coating solution such that the region is in a range from the end portion of the cut planographic printing plate precursor to a portion inside the end portion by 5 mm,
wherein the steps are performed in order of the step (a), the step (b), and the step (c) or in order of the step (b), the step (a), and the step (c), on the support.

16. The method of producing a planographic printing plate precursor according to claim 15,
wherein (d) an undercoat layer forming step of forming an undercoat layer is performed on the support before the step (a).

17. The method of producing a planographic printing plate precursor according to claim 15,
wherein (e) a protective layer forming step of forming a protective layer is performed on the image recording layer after the step (a) and before the step (c).

18. A method of producing a planographic printing plate precursor which includes a support; an image recording layer formed on the support; and fine particles positioned in a region of the planographic printing plate precursor on the image recording layer side, in which a content of fine particles per unit area in a first region on the image recording layer side from an end portion of the planographic printing plate precursor to a portion inside the end portion by 5 mm is greater than a content of the fine particles per unit area in a second region other than the first region by an amount of 10 mg/m$^2$ or greater, the method comprising:
   (a) an image recording layer forming step of forming the image recording layer; and
   (f) a coating step of coating a region, from the end portion of the planographic printing plate precursor to a portion inside the end portion by 5 mm, with a coating solution containing the fine particles,
wherein the steps are performed in order of the step (a) and the step (f) on the support.

19. The method of producing a planographic printing plate precursor according to claim 18,
wherein (d) an undercoat layer forming step of forming an undercoat layer is performed on the support before the step (a).

20. The method of producing a planographic printing plate precursor according to claim 18,
wherein (e) a protective layer forming step of forming a protective layer is performed on the image recording layer after the step (a) and before the step (f).

21. The method of producing a planographic printing plate precursor according to claim 15,
wherein the coating solution containing the fine particles further contains a hydrophilic compound.

22. The method of producing a planographic printing plate precursor according to claim 21,
wherein the hydrophilic compound is a compound having a support-adsorptive group.

23. The method of producing a planographic printing plate precursor according to claim 22,
wherein the hydrophilic compound is a phosphoric acid compound or a phosphonic acid compound.

24. The method of producing a planographic printing plate precursor according to claim 23,
wherein the phosphoric acid compound or the phosphonic acid compound is a polymer compound.

25. A planographic printing plate precursor which is obtained by the production method according to claim 15.

26. A printing method comprising:
performing printing by imagewise-exposing the planographic printing plate precursor according to claim 1, supplying printing ink and dampening water, and removing an unexposed portion of the image recording layer on a printing press.

27. The printing method according to claim 26,
wherein the printing is performed using printing paper having a width wider than the width of the planographic printing plate precursor.

* * * * *